(12) United States Patent
Takahashi et al.

(10) Patent No.: US 8,921,018 B2
(45) Date of Patent: *Dec. 30, 2014

(54) POLYMER COMPOUND AND PRODUCTION METHOD THEREOF, PIGMENT DISPERSING AGENT, PIGMENT DISPERSION COMPOSITION, PHOTOCURABLE COMPOSITION, AND COLOR FILTER AND PRODUCTION METHOD THEREOF

(71) Applicant: FUJIFILM Corporation, Tokyo (JP)

(72) Inventors: Hidenori Takahashi, Fujinomiya (JP); Shuichiro Osada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/193,881

(22) Filed: Feb. 28, 2014

(65) Prior Publication Data

US 2014/0175348 A1    Jun. 26, 2014

Related U.S. Application Data

(62) Division of application No. 12/293,226, filed as application No. PCT/JP2007/054948 on Mar. 13, 2007, now Pat. No. 8,808,947.

(30) Foreign Application Priority Data

| Mar. 17, 2006 | (JP) | 2006-075434 |
| Mar. 17, 2006 | (JP) | 2006-075558 |
| Sep. 29, 2006 | (JP) | 2006-269707 |

(51) Int. Cl.
*G02B 5/20* (2006.01)
*C09B 67/00* (2006.01)

(52) U.S. Cl.
USPC ............... 430/7; 430/270.1; 524/609

(58) Field of Classification Search
None
See application file for complete search history.

(56) References Cited

U.S. PATENT DOCUMENTS

| 5,294,728 A | 3/1994 | Emmons et al. |
| 5,399,642 A | 3/1995 | Emmons et al. |
| 5,492,965 A | 2/1996 | Emmons et al. |
| 5,498,675 A | 3/1996 | Emmons et al. |
| 5,942,555 A | 8/1999 | Swanson et al. |
| 6,866,902 B2 | 3/2005 | Kaeding et al. |
| 8,076,392 B2 | 12/2011 | Shimohara et al. |
| 2003/0198761 A1 | 10/2003 | Kaeding et al. |

FOREIGN PATENT DOCUMENTS

| JP | 04-139262 A | 5/1992 |
| JP | 05-214008 A | 8/1993 |
| JP | 09-077987 A | 3/1997 |
| JP | 09-077994 A | 3/1997 |
| JP | 11-189732 A | 7/1999 |
| JP | 2002-273191 A | 9/2002 |
| JP | 2004-001471 A | 1/2004 |
| JP | 2005-232468 A | 9/2005 |
| JP | 2006-052168 A | 2/2006 |
| JP | 2006-241233 A | 9/2006 |

OTHER PUBLICATIONS

Office Action dated Mar. 13, 2014 in Korean Application No. 2013-7033876.
Office Action dated Oct. 19, 2013 in Korean Application No. 2008-7025198.
Translation of JP-05-214008 (Aug. 1993).
Notice of Reasons for Reasons for Rejection in corresponding Japanese Patent Application No. 2012-245693 dated Dec. 3, 2013.
Communication dated Sep. 16, 2014, from the Korean Patent Office in counterpart Korean Application No. 10-2013-7033876.

*Primary Examiner* — John A. McPherson
(74) *Attorney, Agent, or Firm* — Sughrue Mion, PLLC

(57) ABSTRACT

The present invention provides a polymer compound represented by the following Formula (1) and a method for production thereof, a pigment dispersant, a pigment dispersion composition, and a photocurable composition respectively using the polymer compound, and a color filter and a method for production thereof [$R^1$: an organic linking group having a valency of (m+n); $R^2$: a single bond or a divalent organic linking group; $A^1$: a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; m=1 to 8, n=2 to 9 (m+n=3 to 10); and $P^1$: polymer skeleton].

$$(A^1\text{-}R^2)_n R^1 (P^1)_m \quad \text{Formula (1)}$$

13 Claims, No Drawings

POLYMER COMPOUND AND PRODUCTION METHOD THEREOF, PIGMENT DISPERSING AGENT, PIGMENT DISPERSION COMPOSITION, PHOTOCURABLE COMPOSITION, AND COLOR FILTER AND PRODUCTION METHOD THEREOF

This is a Divisional application of U.S. application Ser. No. 12/293,226 filed Sep. 16, 2008, which is a National Stage Entry of PCT/JP2007/054948 filed Mar. 13, 2007, which claims priority from JP 2006-075558 filed Mar. 17, 2006, JP 2006-075434 filed Mar. 17, 2006, and JP 2006-269707 filed Sep. 29, 2006, the contents of all of which are incorporated herein by reference.

TECHNICAL FIELD

The present invention relates to a novel polymer compound and a production method thereof, a pigment dispersing agent and pigment dispersion composition that disperses or contains a pigment together with the novel polymer compound, a pigment dispersion composition, a photocurable composition, and a color filter and a production method thereof.

BACKGROUND ART

A color filter is produced by incorporating a polyfunctional monomer and a photopolymerization initiator, an alkali-soluble resin and other components to a pigment dispersion composition in which an organic pigment or inorganic pigment is dispersed to obtain a colored photosensitive composition, and carrying out a photolithographic method or the like using this composition.

In recent years, there has been a tendency for the usage of color filters in liquid crystal display (LCD) applications to expand to television (TV) sets in addition to monitors. With this tendency towards expanded use, there has been a demand for a high level of color characteristics in chromaticity, contrast and the like. Furthermore, there is also a similar demand for a high level of color characteristics in image sensor (solid state image pick-up element) applications.

In response to such demands as described above, it is required to disperse the pigment in a finer state (good dispersibility), and to disperse the pigment in a stable state (good dispersion stability). When the dispersibility is insufficient, there is a problem in that fringes (serration at the edge part) or surface unevenness occurs in the resulting colored resist film, thus causing a decrease in the chromaticity or dimensional accuracy of the color filters thus produced, or causing significant deterioration in the contrast. Furthermore, when dispersion stability is insufficient, it is likely that problems occur in the production process for color filters, particularly in that the uniformity of the film thickness is lowered in the process of applying a colored photosensitive composition, the sensitivity to light in the exposure process is decreased, or the alkali solubility in the development process is decreased. Furthermore, when the dispersion stability of the pigment is poor, there is a problem in that, along with the lapse of time, the constituent components of the colored photosensitive composition undergo aggregation and cause an increase in viscosity, so that the pot life becomes very short.

However, when the particle diameter of the pigment is made very small, the surface area of the pigment particles is increased. Accordingly, the cohesive force among the pigment particles is increased, so that it is often difficult to achieve a balance between dispersibility and dispersion stability at high level.

In order to solve such problems, various pigment dispersants have been developed.

For example, a polymeric pigment dispersant in which an organic dye is bound to a polymer has been disclosed (see, for example, Patent Document 1). In this regard, it is thought that since the interaction between the organic dye and the pigment particles introduced into the dispersant is enhanced, adsorption of the polymeric pigment dispersant onto the pigment particles is promoted, and thus the dispersibility is enhanced.

A polymeric pigment dispersant is also disclosed in which an organic dye or a heterocyclic ring is introduced only to one end or both ends of the polymer moiety (see, for example, Patent Documents 2 and 3). Patent Document 2 aims at securing an adsorption layer that is sufficient for dispersion stabilization, by efficiently achieving efficient adsorption of an organic dye or a heterocyclic ring onto the surface of a pigment, and also making the polymer moiety and the dispersion medium have sufficient affinity with each other, while Patent Document 3 achieves an improvement in synthesis technique over Patent Document 2 by using a chain transfer agent having an organic dye or a heterocyclic ring.

In addition, it is disclosed to improve the dispersibility by using an acrylic resin having a carboxylic acid group and adding a basic pigment derivative in which a dialkylamino group is introduced (see, for example, Patent Document 4). Moreover, a polymeric pigment dispersant is disclosed in which a sulfonic acid group or a monosulfuric acid ester group is introduced only to one end of the polymer moiety (see, for example, Patent Document 5). These aim at securing an adsorption layer that is sufficient for dispersion stabilization by allowing the surface of a pigment (particularly, a basic pigment) to efficiently adsorb sulfonic acid and also making the polymer moiety and the dispersion medium have sufficient affinity with each other.

Patent Document 1: Japanese Patent Application Laid-Open (JP-A) No. 4-139262
Patent Document 2: JP-A No. 9-77987
Patent Document 3: JP-A No. 9-77994
Patent Document 4: JP-A No. 11-189732
Patent Document 5: JP-A No. 2002-273191

DISCLOSURE OF THE INVENTION

Problems to be Solved by the Invention

However, in the polymeric pigment dispersant described in Patent Document 1, since the organic dye is randomly introduced into the polymer, the affinity between the polymer moiety and the dispersion medium is lowered, and it becomes difficult to secure an adsorption layer that is sufficient for dispersion stabilization. Further, when the amount of the organic dye or heterocyclic ring introduced into the polymer is increased, there is a problem in that the solubility in the dispersion medium is decreased, and an adsorption layer that is sufficient for dispersion stabilization cannot be secured.

Furthermore, the polymeric pigment dispersant described in Patent Document 2 does not have plural organic dyes or heterocyclic rings introduced at a terminal of the polymer, the introduction is difficult, and the adsorption to the pigment surface is not sufficiently strong. For that reason, there are cases in which an adsorption layer that is sufficient for dispersion stabilization cannot be secured. Moreover, this polymeric pigment dispersant is not an easy means also from the viewpoint of synthesis technique in which an organic dye or a heterocyclic ring is bonded to a terminal of a polymer through a polymer reaction.

Likewise, the polymeric pigment dispersant described in Patent Document 3 does not have plural organic dyes or heterocyclic rings introduced at a polymer terminal, either, and the introduction is difficult, so that the adsorption to the pigment surface is not sufficiently strong. For that reason, there are cases in which an adsorption layer that is sufficient for dispersion stabilization cannot be secured.

Moreover, in the Patent Document 4, since the basic pigment derivative is colored per se, there are problems in that pigments usable for adjusting the pigment dispersion composition to have a desired color are limited, and/or plural pigments are cross-linked by the acrylic resin having a carboxylic acid group which is present randomly in the polymer main chain, thereby deteriorating the dispersibility.

In addition, the polymeric pigment dispersant of Patent Document 5 is not an industrially advantageous synthesis technique that can produce a pigment dispersant since it involves introduction of a terminal group by a polymer reaction, and the dispersion stabilizing effects on acidic pigments may be insufficient.

The present invention has been made in consideration of such circumstances, and provides a polymer compound that provides excellent pigment dispersibility and dispersion stability.

The invention also provides a production method by which the polymer compound can be produced industrially advantageously.

The invention also provides a pigment dispersant that provides high pigment dispersibility and dispersion stability.

The invention provides a pigment dispersion composition and a photocurable composition, wherein the compositions has good color characteristics, and excellent alkali developability and high contrast can be obtained when the compositions are used for making a color filter.

The invention also provides a color filter having good color characteristics and high contrast, and a method for production thereof.

Means for Solving the Problems

The present invention was achieved on the basis of the following findings: introduction of plural structures or functional groups that can be adsorbed to pigment to a terminal of a polymer is effective in improving dispersing property and dispersion stability after dispersing upon use thereof as a pigment dispersant, and use of a polyfunctional mercaptan compound is useful for the introduction of the plural structures or functional groups to the terminal of the polymer in that the synthesis is easier and the degree of freedom in terms of structure is greater in consideration of steric repulsion. Specific means for solving the above-mentioned problems are as follows.

<1> A polymer compound represented by the following formula (1):

   Formula (1)

In the formula, $R^1$ represents an organic linking group having a valency of (m+n); represents a single bond or a divalent organic linking group; $A^1$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^1$s, n in number, are independent from each other, and may be the same or different from each other; $R^2$s, n in number, are independent from each other, and may be the same or different from each other; m is from 1 to 8; n is from 2 to 9; m+n is from 3 to 10; $P^1$ represents a polymer skeleton; and $P^1$s, m in number, may be the same or different from each other.

<2> The polymer compound according to <1>, wherein the polymer compound is represented by the following formula (2):

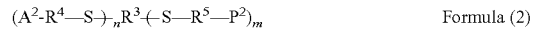   Formula (2)

In the formula, $R^3$ represents an organic linking group having a valency of (m+n); $R^4$ and $R^5$ each independently represent a single bond or a divalent organic linking group; $A^2$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^2$s, n in number, are independent from each other and may be the same or different from each other; $R^4$s, n in number, are independent from each other and may be the same or different from each other; m is from 1 to 8; n is from 2 to 9; m+n is from 3 to 10; $P^2$ represents a polymer skeleton; $P^2$s, m in number, are independent from each other and may be the same or different from each other; and $R^5$s, m in number, are independent from each other and may be the same or different from each other.

<3> The polymer compound according to <1>, wherein $A^1$ is a monovalent organic group containing at least one moiety selected from an organic dye structure, a heterocyclic structure, an acidic group, a group having a basic nitrogen atom, a urea group and a hydrocarbon group having 4 or more carbon atoms.

<4> The polymer compound according to <2>, wherein $A^2$ is a monovalent organic group containing at least one moiety selected from an organic dye structure, a heterocyclic structure, an acidic group, a group having a basic nitrogen atom, a urea group and a hydrocarbon group having 4 or more carbon atoms.

<5> The polymer compound according to <1> or <3>, wherein the polymer skeleton represented by $P^1$ is derived from at least one selected from: a polymer or copolymer of a vinyl monomer; an ester polymer; an ether polymer; a urethane polymer; an amide polymer; an epoxy polymer; a silicone polymer; and a modified product or copolymer thereof.

<6> The polymer compound according to <2> or <4>, wherein the polymer skeleton represented by $P^2$ is derived from at least one selected from: a polymer or copolymer of a vinyl monomer an ester polymer; an ether polymer; a urethane polymer; an amide polymer; an epoxy polymer; a silicone polymer; and a modified product or copolymer thereof.

<7> The polymer compound according to any one of <1> to <6>, wherein the polymer compound has a weight average molecular weight of 3,000 to 100,000.

<8> The polymer compound according to any one of <1> to <7>, wherein the polymer compound is obtained by performing a radical polymerization reaction in the presence of a compound represented by the following formula (3):

   Formula (3)

In the formula, $R^6$ represents an organic linking group having a valency of (m+n); $R^7$ represents a single bond or a divalent organic linking group; $A^3$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^3$s, n in number, are independent from each other and may be the same or different from each other; $R^7$s, n in number, are independent from each other and may be the same or different from each other; m is from 1 to 8; n is from 2 to 9; and m+n is from 3 to 10.

<9> A method for producing the polymer compound according to any one of <1> to <8>, the method including performing a radical polymerization reaction using the compound represented by the following formula (3) as a chain transfer agent:

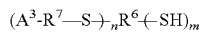  Formula (3)

In the formula, $R^6$ represents an organic linking group having a valency of (m+n); $R^7$ represents a single bond or a divalent organic linking group; $A^3$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^3$s, n in number, are independent from each other and may be the same or different from each other; $R^7$s, n in number, are independent from each other and may be the same or different from each other; m is from 1 to 8; n is from 2 to 9; and m+n is from 3 to 10.

<10> The method according to <9>, wherein the compound represented by Formula (3) is an addition reaction product of (a) a compound having 3 to 10 mercapto groups in one molecule, and (b) a compound having at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group, and also having a functional group capable of reacting with a mercapto group.

<11> A pigment dispersant containing the polymer compound according to any one of <1> to <8>.

<12> A pigment dispersion composition containing a pigment and the pigment dispersant according to <11> in an organic solvent.

<13> A photocurable composition containing the pigment dispersion composition according to <12>, an alkali-soluble resin, a photopolymerizable compound, and a photopolymerization initiator.

<14> A color filter that is produced by using the photocurable composition according to <13>.

<15> A method for producing a color filter, the method including providing the photocurable composition according to <13> directly on a substrate or with another layer interposed therebetween so as to form a photosensitive film, and patternwise exposing and developing the obtained photosensitive film so as to form a colored pattern.

<16> The polymer compound according to <2>, wherein $R^3$ in Formula (2) is an organic linking group selected from the following specific examples (1) to (17):

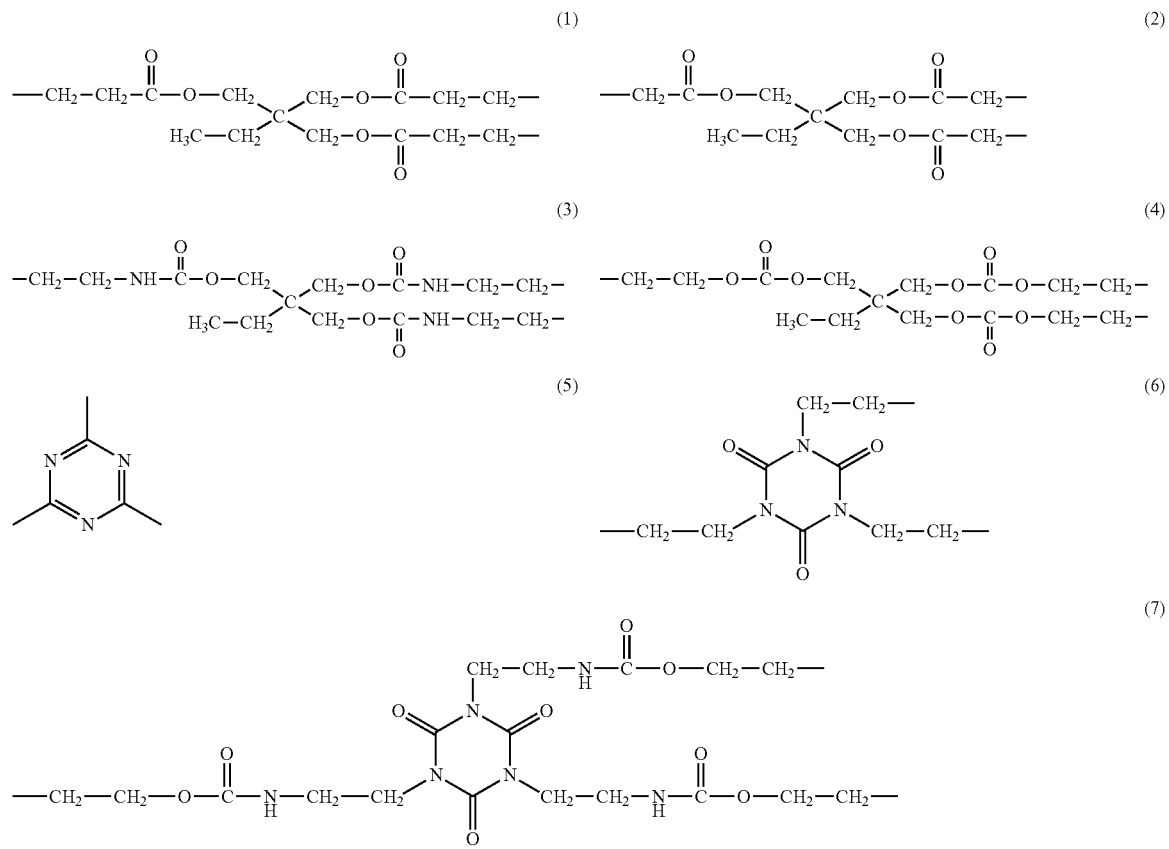

-continued
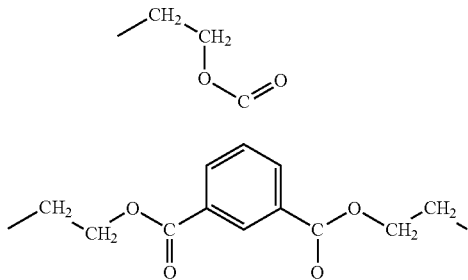
(8)
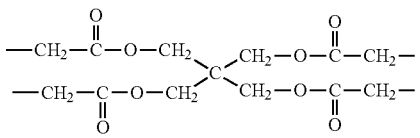
(9)
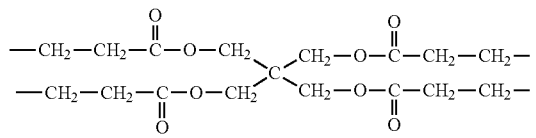
(10)
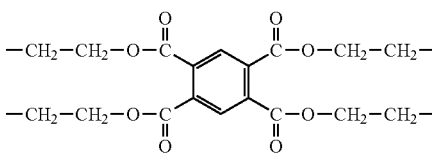
(11)
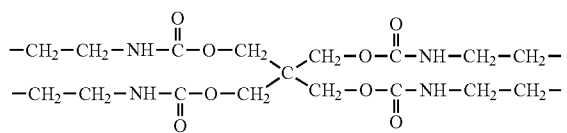
(12)
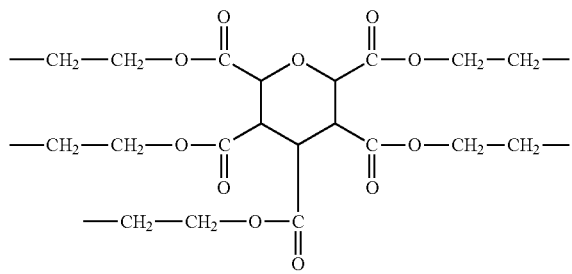
(13)
(14)
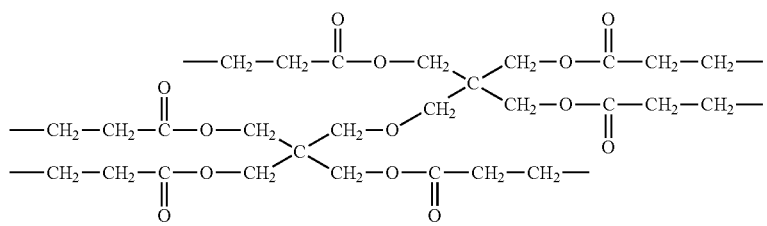
(16)
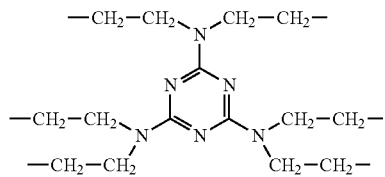
(15)
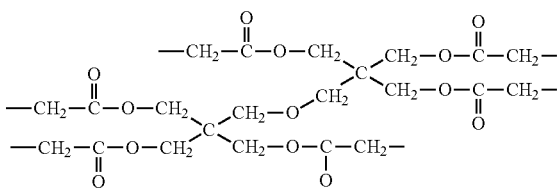
(17)
<17> The polymer compound according to <2>, wherein $R^5$ in Formula (2) represents a single bond, an ethylene group, a propylene group, or a divalent organic linking group selected from the following group (a) and the following group (b), wherein in the following groups, $R^{25}$ represents a hydrogen atom or a methyl group, and l represents 1 or 2:
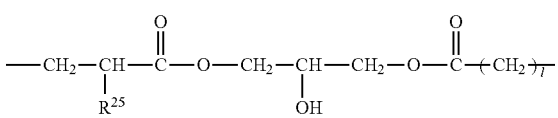
(a)

-continued

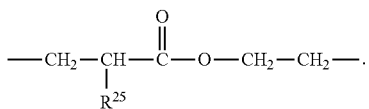

(b)

Effects of the Invention

According to the present invention, a polymer compound providing excellent pigment dispersibility and dispersion stability, and a production method by which the polymer compound can be produced industrially advantageously, may be provided.

According to the invention, a pigment dispersant having high pigment dispersing property and dispersion stability may be provided.

According to the invention, a pigment dispersion composition and a colored photosensitive composition which have good color characteristics and with which excellent alkali developability and high contrast can be obtained when used for making a color filter, may be provided.

Furthermore, according to the invention, a color filter having good color characteristics and high contrast, and a method for production thereof may be provided.

BEST MODE FOR CARRYING OUT THE INVENTION

Hereinafter, the present invention will be described in detail.

<Polymer Compound>

The polymer compound of the invention is a polymer compound represented by the following formula (1). Since the polymer compound represented by the following formula (1) has, at a terminal of the polymer, plural monovalent organic groups each containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group, the polymer compound has various characteristics, such as excellent adsorbability to solid surfaces, excellent micelle forming ability, and surface-active properties. For example, the polymer compound may be suitably used as a pigment dispersant.

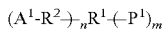          Formula (1)

In the above formula (1), $A^1$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group. $A^1$s, n in number, may be the same or different from each other.

In other words, the above-mentioned $A^1$ represents a monovalent organic group containing at least one structure having an ability to be adsorbed to pigments, such as an organic dye structure or a heterocyclic structure, and/or at least one functional group having an ability to adsorbed to pigments, such as an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group or a hydroxyl group.

Hereinafter, this moiety having an ability to be adsorbed to pigments (the above-mentioned structures and functional groups) will be occasionally generically referred to as "adsorptive moiety" in the following explanation.

Each $A^1$ should include at least one kind of adsorptive moiety, and may include two or more kinds of adsorptive moieties.

Furthermore, according to the invention, the "monovalent organic group containing at least one kind of adsorptive moiety" is a monovalent organic group formed by bonding of the above-mentioned adsorptive moiety to an organic linking group that is composed of 1 to 200 carbon atoms, 0 to 20 nitrogen atoms, 0 to 100 oxygen atoms, 1 to 400 hydrogen atoms, and 0.0 to 40 sulfur atoms. Furthermore, when the adsorptive moiety itself can constitute a monovalent organic group, the adsorptive moiety itself may be the monovalent organic group represented by $A^1$.

First, the adsorptive moiety as a constituent component of $A^1$ will be described in the following.

As to the "organic dye structure", preferable examples include phthalocyanine dye structures, insoluble azo dye structures, azo lake dye structures, anthraquinone dye structures, quinacridone dye structures, dioxazine dye structures, diketopyrrolopyrrole dye structures, anthrapyridine dye structures, anthanthrone dye structures, indanthrone dye structures, flavanthrone dye structures, perinone dye structures, perylene dye structures, and thioindigo dye structures. Phthalocyanine dye structures, azo lake dye structures, anthraquinone dye structures, dioxazine dye structures, and diketopyrrolopyrrole dye structures are more preferable. Phthalocyanine dye structures, anthraquinone dye structures, and diketopyrrolopyrrole dye structures are particularly preferable.

As to the "heterocyclic structure", preferable example include thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinimide, phthalimide, naphthalimide, hydantoin, indole, quinoline, carbazole, acridine, acridone, and anthraquinone. Pyrroline, pyrrolidine, pyrazole, pyrazoline, pyrazolidine, imidazole, triazole, pyridine, piperidine, morpholine, pyridazine, pyrimidine, piperazine, triazine, isoindoline, isoindolinone, benzimidazolone, benzothiazole, succinimide, phthalimide, naphthalimide, hydantoin, carbazole, acridine, acridone, and anthraquinone are more preferable.

The "organic dye structure" or "heterocyclic structure" may further have a substituent, and examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 1 to 6 carbon atoms, such as an acetoxy group; an alkoxy group having 1 to 20 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as a t-butyl carbonate. Here, these substituents may be bound to the organic dye structure or heterocyclic ring through a linking group constituted by one of the following structural units or a combination of the following structural units.

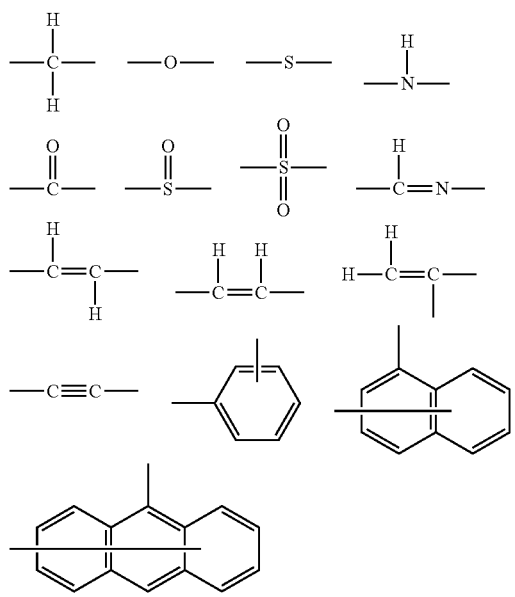

As to the "acidic group", preferable examples include a carboxylic acid group, a sulfonic acid group, a monosulfuric acid ester group, a phosphoric acid group, a monophosphoric acid ester group, and a boric acid group. A carboxylic acid group, a sulfonic acid group, a monosulfuric acid ester group, a phosphoric acid group, and a monophosphoric acid ester group are more preferable. A carboxylic acid group, a sulfonic acid group and a phosphoric acid group are particularly preferable.

As to the "group having a basic nitrogen atom", preferable examples include an amino group (—$NH_2$), a substituted imino group (—$NHR^8$, —$NR^9R^{10}$, wherein $R^8$, $R^9$ and $R^{10}$ each independently represent an alkyl group having 1 to 20 carbon atoms, an aryl group having 6 or more carbon atoms, or an aralkyl group having 7 or more carbon atoms), a guanidyl group represented by the following formula (a1), and an amidinyl group represented by the following formula (a2).

In Formula (a1), $R^{11}$ and $R^{12}$ each independently represent an alkyl group having 1 to 20 carbon atoms, an aryl group having 6 or more carbon atoms, or an aralkyl group having 7 or more carbon atoms.

In Formula (a2), $R^{13}$ and $R^{14}$ each independently represent an alkyl group having 1 to 20 carbon atoms, an aryl group having 6 or more carbon atoms, or an aralkyl group having 7 or more carbon atoms.

Among these, an amino group (—$NH_2$), a substituted imino group (—$NHR^8$, —$NR^9R^{10}$, wherein $R^8$, $R^9$ and $R^{10}$ each independently represent an alkyl group having 1 to 10 carbon atoms, a phenyl group or a benzyl group), a guanidyl group represented by Formula (a1) [in Formula (a1), and $R^{12}$ each independently represent an alkyl group having 1 to 10 carbon atoms, a phenyl group, or a benzyl group], an amidinyl group represented by Formula (a2) [in Formula (a2), $R^{13}$ and $R^{14}$ each independently represent an alkyl group having 1 to 10 carbon atoms, a phenyl group, or a benzyl group], and the like are more preferred.

In particular, it is preferable to use an amino group (—$NH_2$), a substituted imino group (—$NHR^8$, —$NR^9R^{10}$, wherein $R^8$, $R^9$ and $R^{10}$ each independently represent an alkyl group having 1 to 5 carbon atoms, a phenyl group or a benzyl group), a guanidyl group represented by Formula (a1) [in Formula (a1), $R^{11}$ and $R^{12}$ each independently represent an alkyl group having 1 to 5 carbon atoms, a phenyl group or a benzyl group], an amidinyl group represented by Formula (a2) [in Formula (a2), $R^{13}$ and $R^{14}$ each independently represent an alkyl group having 1 to 5 carbon atoms, a phenyl group or a benzyl group], and the like.

As to the "urea group," preferable examples include —$NR^{15}CONR^{16}R^{17}$ (wherein $R^{15}$, $R^{16}$ and $R^{17}$ each independently represent a hydrogen atom, an alkyl group having 1 to 20 carbon atoms, an aryl group having 6 or more carbon atoms, or an aralkyl group having 7 or more carbon atoms). —$NR^{15}CONHR^{17}$ (wherein $R^{15}$ and $R^{17}$ each independently represent a hydrogen atom, an alkyl group having 1 to 10 carbon atoms, an aryl group having 6 or more carbon atoms, or an aralkyl group having 7 or more carbon atoms) is more preferred. —$NHCONHR^{17}$ (wherein $R^{17}$ represents a hydrogen atom, an alkyl group having 1 to 10 carbon atoms, an aryl group having 6 or more carbon atoms, or an aralkyl group having 7 or more carbon atoms) is particularly preferred.

As to the "urethane group," preferable examples include —$NHCOOR^{18}$, —$NR^{19}COOR^{20}$, —$OCONHR^{21}$, —$OCONR^{22}R^{23}$, (wherein $R^{18}$, $R^{19}$, $R^{20}$, $R^{21}$, $R^{22}$ and $R^{23}$ each independently represent an alkyl group having 1 to 20 carbon atoms, an aryl group having 6 or more carbon atoms, or an aralkyl group having 7 or more carbon atoms). —$NHCOOR^{18}$, —$OCONHR^{21}$ (wherein $R^{18}$ and $R^{21}$ each independently represent an alkyl group having 1 to 10 carbon atoms, an aryl group having 6 or more carbon atoms, or an aralkyl group having 7 or more carbon atoms), and the like are more preferred. —$NHCOOR^{18}$, $OCONHR^{21}$ (wherein $R^{18}$ and $R^{21}$ each independently represent an alkyl group having 1 to 10 carbon atoms, an aryl group having 6 or more carbon atoms, or an aralkyl group having 7 or more carbon atoms), and the like are particularly preferred.

As to the "group having a coordinating oxygen atom", examples include an acetylacetonate group and a crown ether.

As to the "hydrocarbon group having 4 or more carbon atoms", preferable examples include an alkyl group having 4 or more carbon atoms, an aryl group having 6 or more carbon atoms, and an aralkyl group having 7 or more carbon atoms. An alkyl group having 4 to 20 carbon atoms, an aryl group having 6 to 20 carbon atoms, an aralkyl group having 7 to 20 carbon atoms, and the like are more preferred. An alkyl group having 4 to 15 carbon atoms (for example, an octyl group, a dodecyl group or the like), an aryl group having 6 to 15 carbon atoms (for example, a phenyl group, a naphthyl group or the like), an aralkyl group having 7 to 15 carbon atoms (for example, a benzyl group or the like), and the like are particularly preferred.

As to the "alkoxysilyl group", examples include a trimethoxysilyl group and a triethoxysilyl group.

As the organic linking group binding to the adsorptive moiety, a single bond, or an organic linking group composed of 1 to 100 carbon atoms, 0 to 10 nitrogen atoms, 0 to 50 oxygen atoms, 1 to 200 hydrogen atoms, and 0 to 20 sulfur atoms, is preferred. This organic linking group may be unsubstituted or may further have a substituent.

A specific example of this organic linking group is a group constituted by one of the following structural units or a combination of the structural units.

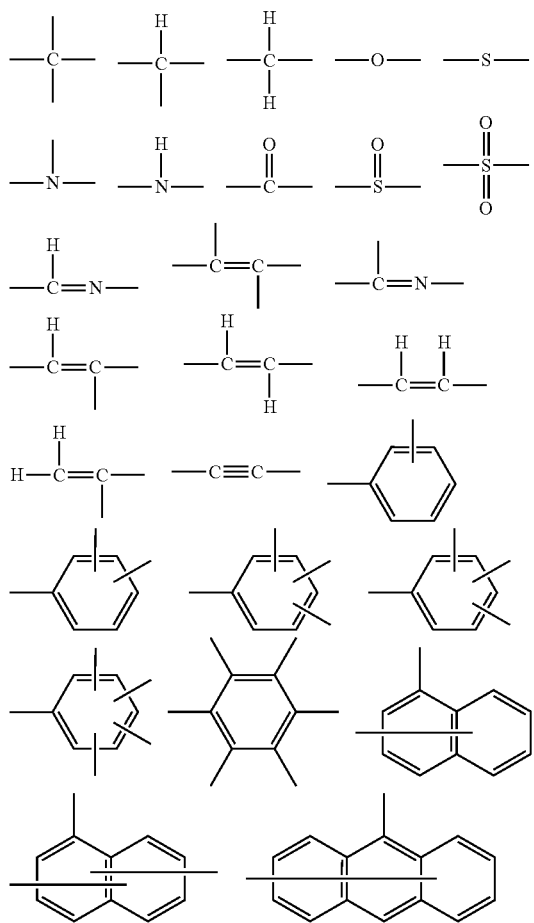

When the organic linking group has a substituent, examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 0.1 to 6 carbon atoms, such as an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as t-butyl carbonate.

Among them, the substituent $A^1$ is preferably a monovalent organic group containing at least one moiety selected from an organic dye structure, a heterocyclic structure, an acidic group, a group having a basic nitrogen atom, a urea group, and a hydrocarbon group having 4 or more carbon atoms.

The substituent $A^1$ is more preferably a monovalent organic group represented by the following formula (4):

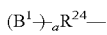    Formula (4)

In Formula (4), $B^1$ represents the adsorptive moiety (that is, a moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group); $R^{24}$ represents a single bond or an organic linking group having a valency of (a+1); a represents an integer of from 1 to 10; and B's, a in number, may be the same or different from each other.

Examples of the adsorptive moiety represented by $B^1$ are the same as those of the adsorptive moiety of $A^1$ in the above-described Formula (1), and preferred examples thereof are also the same as those of the adsorptive moiety of $A^1$.

Among them, a moiety selected from an organic dye structure, a heterocyclic structure, an acidic group, a group having a basic nitrogen atom, a urea group and a hydrocarbon group having 4 or more carbon atoms, is preferred.

$R^{24}$ represents a single bond or an organic linking group having a valency of (a+1), and a is from 1 to 10. Preferably, a is from 1 to 7; more preferably, a is from 1 to 5; and particularly preferably, a is from 1 to 3.

The (a+1)-valent organic linking group may be a group composed of 1 to 100 carbon atoms, 0 to 10 nitrogen atoms, 0 to 50 oxygen atoms, 1 to 200 hydrogen atoms, and 0 to 20 sulfur atoms, and the organic linking group may be unsubstituted or may further have a substituent.

A specific example of the (a+1)-valent organic linking group is a group constituted by one of the following structural units or a combination of the structural units (which may form a cyclic structure).

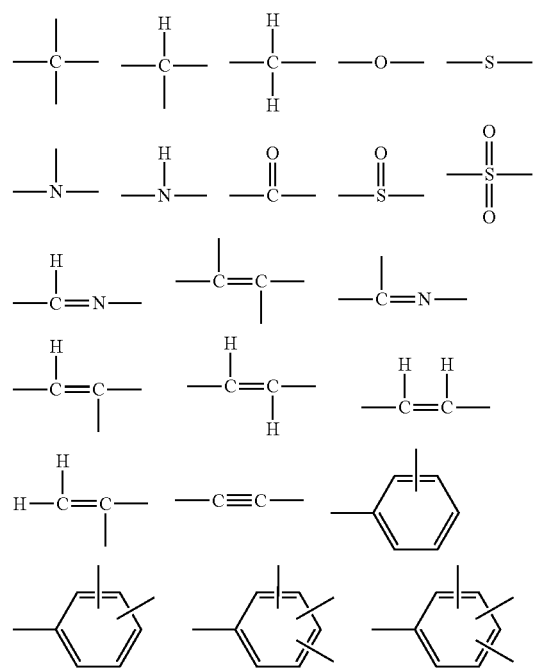

-continued

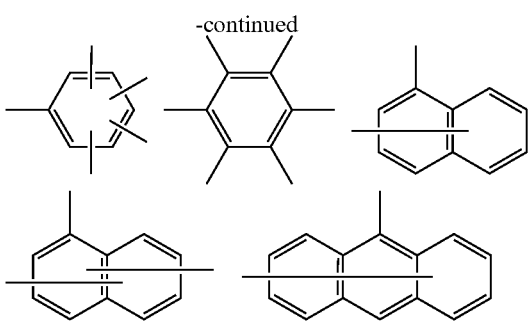

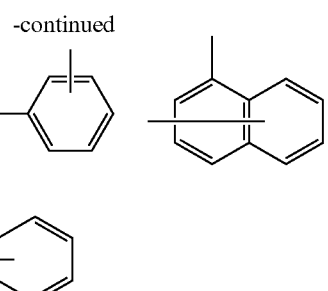

$R^{24}$ is preferably a single bond, or a (a+1)-valent organic linking group that is composed of 1 to 50 carbon atoms, 0 to 8 nitrogen atom, 0 to 25 oxygen atoms, 1 to 100 hydrogen atoms, and 0 to 10 sulfur atoms; more preferably a single bond, or a (a+1)-valent organic linking group that is composed of 1 to 30 carbon atoms, 0 to 6 nitrogen atoms, 0 to 15 oxygen atoms, 1 to 50 hydrogen atoms, and 0 to 7 sulfur atoms; and particularly preferably a single bond, or a (a+1)-valent organic linking group that is composed of 1 to 10 carbon atoms, 0 to 5 nitrogen atoms, 0 to 10 oxygen atoms, 1 to 30 hydrogen atoms, and 0 to 5 sulfur atoms.

Among the above, when the organic linking group having a valency of (a+1) has a substituent, examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 1 to 6 carbon atoms, such as an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as t-butyl carbonate.

In Formula (1), $R^2$ represents a single bond or a divalent organic linking group. $R^2$s, n in number, may be the same or different from each other.

The divalent organic linking group may be a group composed of 1 to 100 carbon atoms, 0 to 10 nitrogen atoms, 0 to 50 oxygen atoms, 1 to 200 hydrogen atoms, and 0 to 20 sulfur atoms, and the organic linking group may be unsubstituted or may further have a substituent.

A specific example of the divalent organic linking group is a group constituted by one of the following structural units or a combination of the structural units.

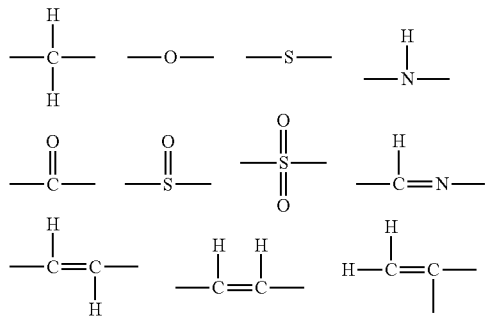

$R^2$ is preferably a single bond, or a divalent organic linking group composed of 1 to 50 carbon atoms, 0 to 8 nitrogen atoms, 0 to 25 oxygen atoms, 1 to 100 hydrogen atoms, and 0 to 10 sulfur atoms; more preferably a single bond, or a divalent organic linking group composed of 1 to 30 carbon atoms, 0 to 6 nitrogen atoms, 0 to 15 oxygen atoms, 1 to 50 hydrogen atoms, 0 to 7 sulfur atoms; and particularly preferably a single bond, or a divalent organic linking group composed of 1 to 10 carbon atoms, 0 to 5 nitrogen atoms, 0 to 10 oxygen atoms, 1 to 30 hydrogen atoms, and 0 to 5 sulfur atoms.

Among the above, when the divalent organic linking group has a substituent, examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 1 to 6 carbon atoms, such as an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as t-butyl carbonate.

In Formula (1), $R^1$ represents an organic linking group having a valency of (m+n), wherein m+n is from 3 to 10.

The (m+n)-valent organic linking group represented by $R^1$ may be a group composed of 1 to 100 carbon atoms, 0 to 10 nitrogen atoms, 0 to 50 oxygen atoms, 1 to 200 hydrogen atoms, and 0 to 20 sulfur atoms, and the organic linking group may be unsubstituted or may further have a substituent.

A specific example of the organic linking group having a valency of (m+n) is a group constituted of one of the following structural units or a combination of the structural units (which may form a cyclic structure).

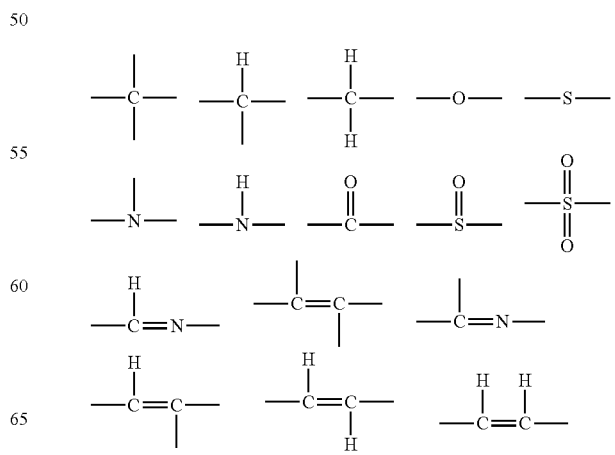

-continued

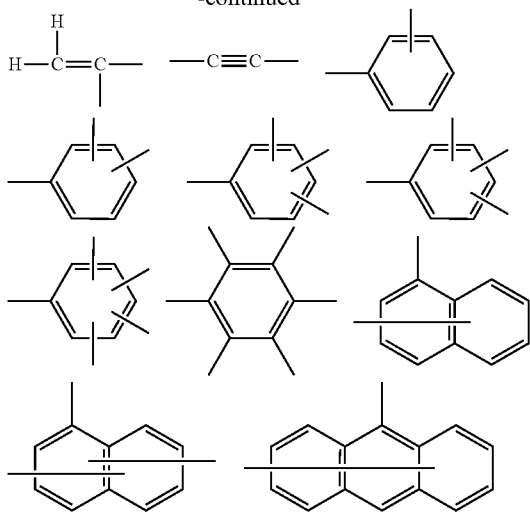

The organic linking group having a valency of (m+n) is preferably a group composed of 1 to 60 carbon atoms, 0 to 10 nitrogen atoms, 0 to 40 oxygen atoms, 1 to 120 hydrogen atoms, and 0 to 10 sulfur atoms; more preferably a group composed of 1 to 50 carbon atoms, 0 to 10 nitrogen atoms, 0 to 30 oxygen atoms, 1 to 100 hydrogen atoms, and 0 to 7 sulfur atoms; and particularly preferably a group composed of 1 to 40 carbon atoms, 0 to 8 nitrogen atoms, 0 to 20 oxygen atoms, 1 to 80 hydrogen atoms, and 0 to 5 sulfur atoms.

Among the above, when the (m+n)-valent organic linking group has a substituent, examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 1 to 6 carbon atoms, such as an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as t-butyl carbonate.

Specific examples of the (m+n)-valent organic linking group represented by $R^1$ include, but are not limited to, those shown below [specific examples (1) to (17)].

(1)

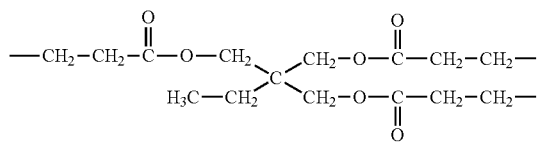

(2)

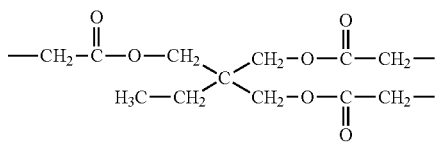

(3)

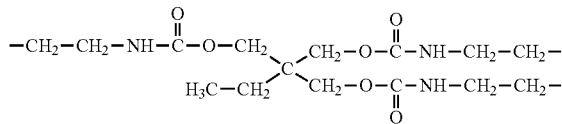

(4)

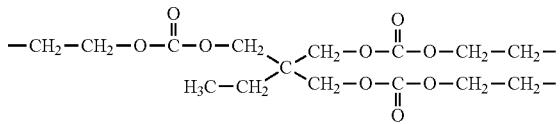

(5)

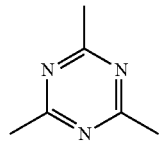

(6)

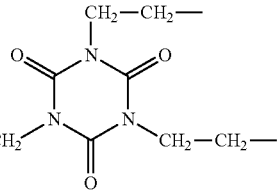

(7)

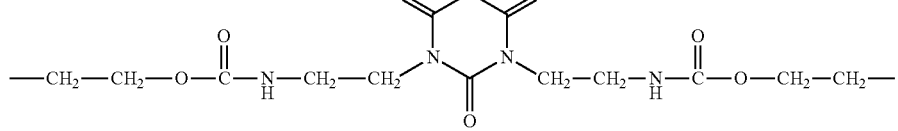

(8)

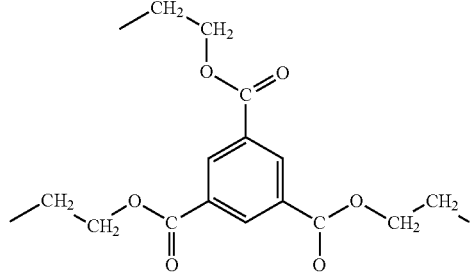

(9)

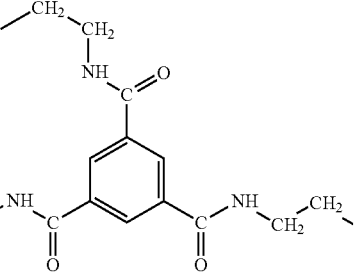

-continued
(10)
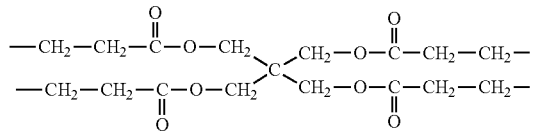
(11)
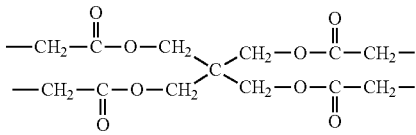
(12)
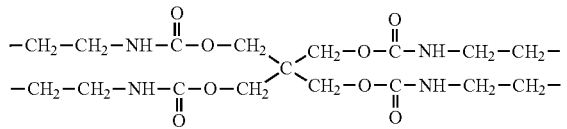
(13)
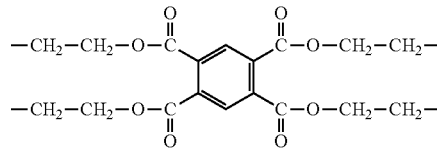
(14)
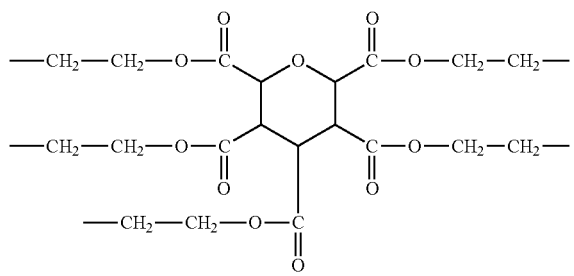
(15)
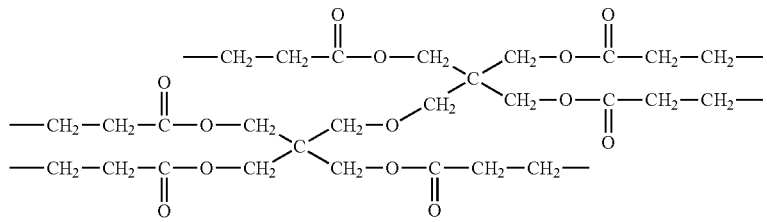
(16)
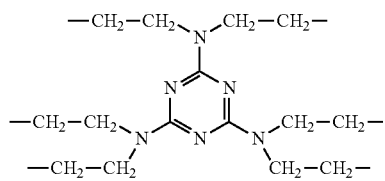
(17)
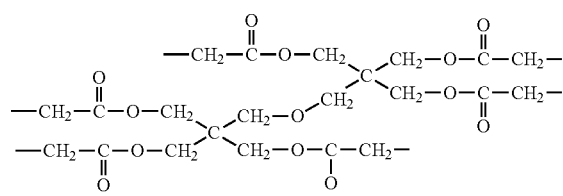
Among the above specific examples, the most preferred (m+n)-valent organic linking groups are the following groups from the viewpoints of availability of raw materials, ease of synthesis, and solubility in various solvents.
(1)
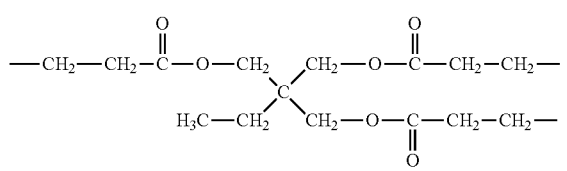
(2)
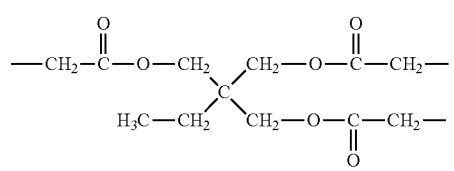
(10)
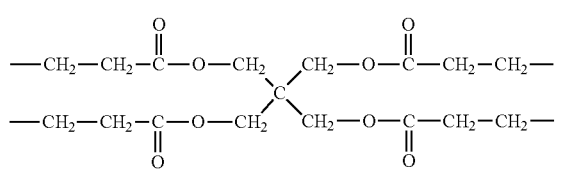
(11)
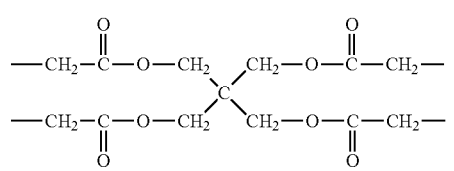

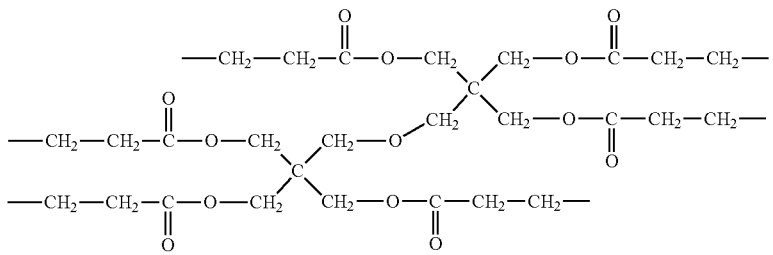

(16)

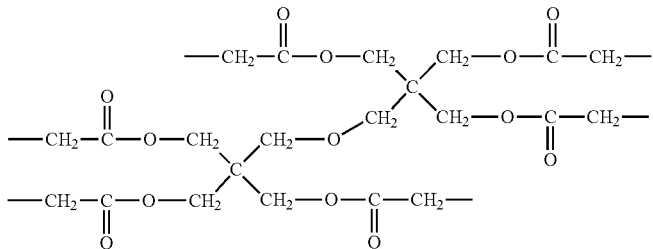

(17)

In Formula (1), m is from 1 to 8; m is preferably from 1 to 5, more preferably from 1 to 4, and particularly preferably from 1 to 3.

Furthermore, in Formula (1), n is from 2 to 9; n is preferably from 2 to 8, more preferably from 2 to 7, and particularly preferably from 3 to 6.

In Formula (1), $P^1$ represents a polymer skeleton, and may be selected from known polymers and the like, according to the purpose or the like. $P^1$s, m in number, may be the same or different from each other.

Among the polymers, the polymer for constituting the polymer skeleton is preferably at least one selected from the group consisting of: a polymer or copolymer of a vinyl monomer; an ester polymer; an ether polymer; a urethane polymer; an amide polymer; an epoxy polymer; a silicone polymer; and a modified product or copolymer thereof [example thereof including a polyether/polyurethane copolymer, a copolymer of polyether/polymer of a vinyl monomer, and the like, wherein the copolymer may be any of a random copolymer, a block copolymer and a graft copolymer]; more preferably at least one selected from the group consisting of a polymer or copolymer of a vinyl monomer, an ester polymer, an ether polymer, a urethane polymer and a modified product or copolymer thereof; and particularly preferably a polymer or copolymer of a vinyl monomer.

Moreover, the polymer is preferably soluble in an organic solvent. If the affinity with an organic solvent is low, for example, in the case of using the polymer as a pigment dispersant, the affinity with the dispersion medium is weakened, and thus an adsorption layer sufficient for dispersion stabilization may not be secured.

The vinyl monomer is not particularly limited, but for example, (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth)acrylonitrile, vinyl monomers having an acidic group, and the like are preferred.

Hereinafter, preferred examples of these vinyl monomers will be described.

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate; 2-ethoxyethyl (meth)acrylate, 2-(2-methoxyethoxy) ethyl (meth)acrylate, 3-phenoxy-2-hydroxypropyl (meth) acrylate, 2-chloroethyl (meth)acrylate, glycidyl (meth) acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-allyloxyethyl (meth) acrylate, propargyl (meth)acrylate, benzyl (meth)acrylate, (meth)acrylic acid diethylene glycol monomethyl ether, (meth)acrylic acid diethylene glycol monoethyl ether, (meth) acrylic acid triethylene glycol monomethyl ether, (meth) acrylic acid triethylene glycol monoethyl ether, (meth)acrylic acid polyethylene glycol monomethyl ether, (meth)acrylic acid polyethylene glycol monoethyl ether, β-phenoxyethoxyethyl (meth)acrylate, nonylphenoxypolyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth) acrylate, dicyclopentanyl (meth)acrylate, tribromophenyl (meth)acrylate, tribromophenyloxyethyl (meth)acrylate, and (meth)acrylic acid-γ-butyrolactone.

Examples of the crotonic acid esters include butyl crotonate and hexyl crotonate.

Examples of the vinyl esters include vinyl acetate, vinyl chloroacetate, vinyl propionate, vinyl butyrate, vinyl methoxyacetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include (meth)acrylamide, N-methyl(meth)acrylamide, N-ethyl(meth)acrylamide, N-propyl(meth)acrylamide, N-isopropyl(meth)acrylamide, N-n-butylacryl(meth)amide, N-t-butyl(meth) acrylamide, N-cyclohexyl(meth)acrylamide, N-(2- methoxyethyl)(meth)acrylamide, N,N-dimethyl(meth)acrylamide, N,N-diethyl(meth)acrylamide, N-phenyl(meth)acrylamide, N-nitrophenylacrylamide, N-ethyl-N-phenylacrylamide, N-benzyl(meth)acrylamide, (meth)acryloylmorpholine, diacetone acrylamide, N-methylolacrylamide, N-hydroxyethylacrylamide, vinyl(meth)acrylamide, N,N-diallyl(meth)acrylamide, and N-allyl(meth)acrylamide.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group (for example, t-Boc or the like) that allows deprotection by an acidic substance, methyl vinylbenzoate, and α-methylstyrene.

Examples of the vinyl ethers include methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxyethyl vinyl ether, and phenyl vinyl ether.

Examples of the vinyl ketones include methyl vinyl ketone, ethyl vinyl ketone, propyl vinyl ketone, and phenyl vinyl ketone.

Examples of the olefins include ethylene, propylene, isobutylene, butadiene, and isoprene.

Examples of the maleimides include maleimide, butylmaleimide, cyclohexylmaleimide, and phenylmaleimide.

(Meth)acrylonitrile, a heterocyclic group substituted by a vinyl group (for example, vinylpyridine, N-vinylpyrrolidone, vinylcarbazole and the like), N-vinylformamide, N-vinylacetamide, N-vinylimidazole, vinylcaprolactone, and the like are also usable.

Other than the above-mentioned compounds, for example, a vinyl monomer having a functional group such as a urethane group, a urea group, a sulfonamide group, a phenol group or an imide group, are also usable. The monomer having such urethane group or urea group may be appropriately synthesized, for example, by using an addition reaction of an isocyanate group and a hydroxyl group or amino group. Specifically, the monomer may be appropriately synthesized by an addition reaction of an isocyanate group-containing monomer and a compound containing one hydroxyl group or compound containing one primary or secondary amino group, or an addition reaction of a hydroxyl group-containing monomer or primary or secondary amino group-containing monomer and monoisocyanate, or the like.

Examples of the vinyl monomer having an acidic group include a vinyl monomer having a carboxyl group and a vinyl monomer having a sulfonic acid group.

Examples of the vinyl monomer having a carboxyl group include (meth)acrylic acid, vinylbenzoic acid, maleic acid, maleic acid monoalkyl ester, fumaric acid, itaconic acid, crotonic acid, cinnamic acid, and acrylic acid dimer. Furthermore, an addition product of a monomer having a hydroxyl group, such as 2-hydroxyethyl (meth)acrylate, and a cyclic anhydride such as maleic anhydride, phthalic anhydride or cyclohexanedicarboxylic anhydride; ω-carboxypolycaprolactone mono(meth)acrylate; and the like, are also usable. As a precursor of the carboxyl group, it is possible to use a monomer containing anhydride such as maleic anhydride, itaconic anhydride or citraconic anhydride. Among these, (meth)acrylic acid is particularly preferred from the viewpoints of copolymerizability, costs, solubility and the like.

The vinyl monomer having a sulfonic acid group may be 2-acrylamide-2-methylpropanesulfonic acid or the like. The vinyl monomer having a phosphoric acid group may be phosphoric acid mono(2-acryloyloxyethyl ester), phosphoric acid mono(1-methyl-2-acryloyloxyethyl ester), or the like.

Furthermore, as the vinyl monomer having an acidic group, it is also possible to use a vinyl monomer containing a phenolic hydroxyl group, a vinyl monomer containing a sulfonamide group, or the like.

Among the polymer compounds represented by Formula (1), a polymer compound represented by the following formula (2) is preferred.

$$(A^2\text{-}R^4\text{--}S)_n R^3 (\text{--}S\text{--}R^5\text{--}P^2)_m \qquad \text{Formula (2)}$$

In Formula (2), $A^2$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group. $A^2$s, n in number, may be the same or different from each other.

In addition, $A^2$ has the same meaning and preferred embodiments as that of $A^1$ in Formula (1).

In Formula (2), $R^4$ and $R^5$ each independently represent a single bond or a divalent organic linking group. n units of $R^4$ may be the same or may be different. Furthermore, m units of $R^5$ may be the same or may be different.

Examples of the divalent organic linking group represented by $R^4$ or $R^5$ are the same as those described above as examples of the divalent organic linking group represented by $R^2$ in Formula (1), and preferable embodiments thereof are also the same as those of the divalent organic linking group represented by $R^2$ in Formula (1).

In Formula (2), $R^3$ represents an organic linking group having a valency of (m+n), wherein m+n is from 3 to 10.

The (m+n)-valent organic linking group represented by $R^3$ may be a group composed of 1 to 60 carbon atoms, 0 to 10 nitrogen atom, 0 to 50 oxygen atoms, 1 to 100 hydrogen atoms, and 0 to 20 sulfur atoms, and the organic linking group may be unsubstituted or may further have a substituent.

Examples of the (m+n)-valent organic linking group represented by $R^3$ are, specifically, the same groups as those described above as examples of the (m+n)-valent organic linking group represented by $R^1$ in Formula (1), and preferable embodiments thereof are also the same as those of the (m+n)-valent organic linking group represented by $R^1$ in Formula (1).

In Formula (2), m is from 1 to 8; m is preferably from 1 to 5, more preferably from 1 to 4, and particularly preferably from 1 to 3.

Furthermore, in Formula (2), n is from 2 to 9; n is preferably from 2 to 8, more preferably from 2 to 7, and particularly preferably from 3 to 6.

In Formula (2), $P^2$ represents a polymer skeleton, and may be selected from known polymers and the like according to the purpose. $P^2$s, m in number, may be the same or different from each other. Preferred embodiments of the polymer are the same as those of $P^1$ in Formula (1).

Among the polymer compounds represented by Formula (2), what is most preferred is a polymer compound which satisfies all of the conditions for. $R^3$, $R^4$, $R^5$, $P^2$, m and n shown below.

$R^3$: Aforementioned specific examples (1), (2), (10), (11), (16) or (17)

$R^4$: A single bond, or a divalent organic linking group composed of "1 to 10 carbon atoms, 0 to 5 nitrogen atoms, 0 to 10 oxygen atoms, 1 to 30 hydrogen atoms, and 0 to 5 sulfur atoms" and constituted by one of the following structural units or a combination of the structural units, wherein the divalent organic linking group may have a substituent, and examples of the substituent include an alkyl group having 1 to 20 carbon atoms, such as a methyl group or an ethyl group; an aryl group having 6 to 16 carbon atoms, such as a phenyl group or a naphthyl group; a hydroxyl group; an amino group; a carboxyl group; a sulfonamide group; an N-sulfonylamide group; an acyloxy group having 1 to 6 carbon atoms, such as an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclohexyloxycarbonyl group; a cyano group; and a carbonic acid ester group such as t-butyl carbonate.

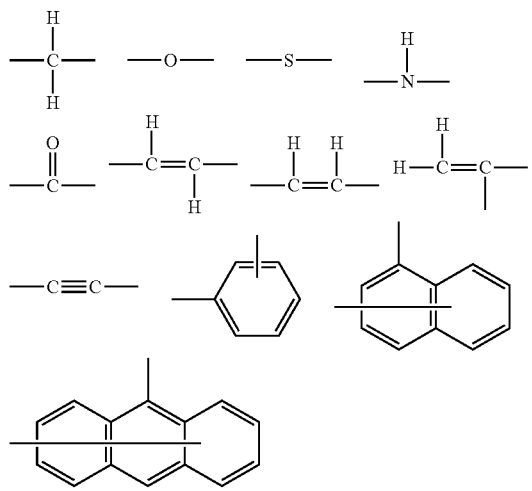

$R^5$: A single bond, an ethylene group, a propylene group, the following group (a), or the following group (b)

In the following groups, $R^{25}$ represents a hydrogen atom or a methyl group; and l represents 1 or 2.

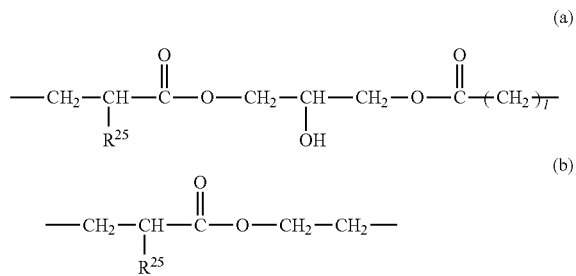

$P^2$: A polymer or copolymer of a vinyl monomer, an ester polymer, an ether polymer, a urethane polymer, or a modified product thereof m: 1 to 3
n: 3 to 6

The acid value of the polymer compound of the invention is not particularly limited. When the polymer compound of the invention is used as a pigment dispersant, the acid value is preferably 200 (mg KOH/g) or less, more preferably 160 (mg KOH/g) or less, and particularly preferably 120 (mg KOH/g) or less. If the acid value exceeds 200 (mg KOH/g), the pigment dispersibility and dispersion stability may be deteriorated.

Furthermore, when the polymer compound of the invention is used, together with a pigment, in a photocurable composition requiring an alkali development treatment, the acid value of the polymer compound is preferably from 30 to 200 (mg KOH/g), more preferably from 40 to 160 (mg KOH/g), and particularly preferably from 50 to 120 (mg KOH/g). If the acid value is less than 30 (mg KOH/g), the alkali developability of the photocurable composition may be insufficient, whereas if the acid value exceeds 200 (mg KOH/g), the pigment dispersibility and dispersion stability may be deteriorated.

The molecular weight of the polymer compound of the invention is, in terms of the weight average molecular weight, preferably from 3,000 to 100,000, more preferably from 5,000 to 80,000, and particularly preferably from 7,000 to 60,000. When the weight average molecular weight is within the above-mentioned range, the effects of the plural adsorptive moieties introduced at a terminal of the polymer are exhibited sufficiently, and the polymer compound shows excellent performance in adsorbability to solid surfaces, micelle forming capability and surface-active properties. In particular, when the polymer compound according to the invention is used as a pigment dispersant, good dispersibility and dispersion stability may be achieved.

(Synthesis Method)

The method for synthesizing the polymer compound represented by Formula (1) (encompassing the compound represented by Formula (2)) is not particularly limited, and the polymer compound represented by Formula (1) may be synthesized by the following methods and the like.

1. A method of performing a polymer reaction of a polymer in which a functional group selected from a carboxyl group, a hydroxyl group, an amino group and the like has been introduced to a terminal and an acid halide having a plurality of aforementioned adsorptive moieties, alkyl halide having a plurality of aforementioned adsorptive moieties, or isocyanate having a plurality of aforementioned adsorptive moieties.

2. A method of performing a Michael addition reaction of a polymer in which a carbon-carbon double bond has been introduced to a terminal and a mercaptan having a plurality of aforementioned adsorptive moieties.

3. A method of reacting a polymer in which a carbon-carbon double bond has been introduced to a terminal, with a mercaptan having an aforementioned adsorptive moiety, in the presence of a radical generator.

4. A method of reacting a polymer in which plural mercaptan groups have been introduced to at least one terminal, with a compound having a carbon-carbon double bond and an aforementioned adsorptive moiety, in the presence of a radical generator.

5. A method of radical polymerizing a vinyl monomer in the presence of a mercaptan compound having a plurality of aforementioned adsorptive moieties.

Among the methods, the polymer compound of the invention is preferably synthesized by the synthesis method of item 2, 3, 4 or 5, and more preferably by the synthesis method of item 3, 4 or 5, from the viewpoint of the ease of synthesis. In particular, when the polymer compound of the invention has a structure represented by Formula (2), it is most preferable to synthesize the polymer compound by the synthesis, method of item 5, from the viewpoint of the ease of synthesis.

As the synthesis method of item 5, more specifically, a method of radical polymerizing a vinyl monomer in the presence of a compound represented by the following formula (3) is preferred.

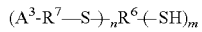  Formula (3)

In Formula (3), $R^6$, $R^7$, $A^3$, m and n have the same meanings as those of $R^3$, $R^4$, $A^2$, m and n in Formula (2), respectively, and preferable embodiments thereof are also the same as those of $R^3$, $R^4$, $A^2$, m and n in Formula (2), respectively.

The compound represented by Formula (3) can be synthesized by the following methods. From the viewpoint of ease in synthesis, the following method of item 7 is more preferred.

6. A method including converting a halide compound having a plurality of aforementioned adsorptive moieties into a mercaptan compound (such as a method including reacting with thiourea and hydrolyzing the product, a method including reacting directly with NaSH, or a method including reacting with $CH_3COSNa$ and hydrolyzing the product).

7. A method including subjecting a compound having 3 to 10 mercapto groups in one molecule and a compound having an aforementioned adsorptive moiety and a functional group capable of reacting with a mercapto group, to an addition reaction.

In the synthesis method of item 7, suitable examples of the "functional group capable of reacting with a mercapto group" include an acid halide, an alkyl halide, an isocyanate, and a carbon-carbon double bond.

It is particularly preferable that the "functional group capable of reacting with a mercapto group" be a carbon-carbon double bond and the addition reaction be a radical addition reaction. In addition, the carbon-carbon double bond is more preferably a monosubstituted or disubstituted vinyl group from the viewpoint of the reactivity with a mercapto group.

Specific examples of the compound having 3 to 10 mercapto groups in one molecule [specific examples (18) to (34)] include the following compounds.

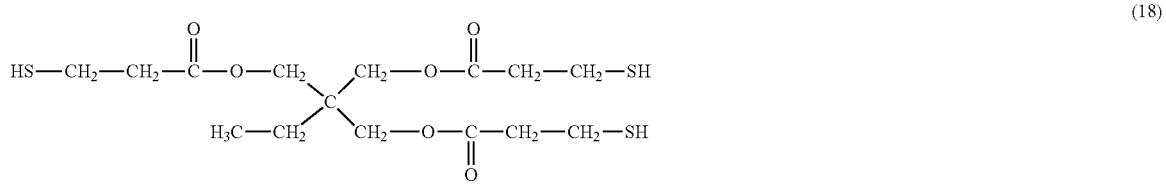
(18)

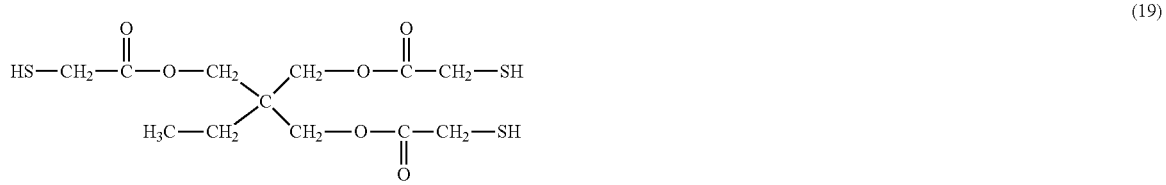
(19)

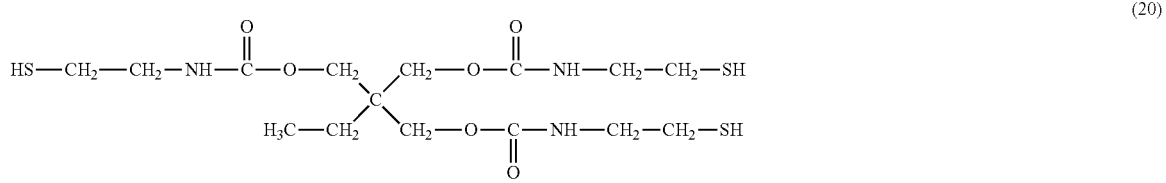
(20)

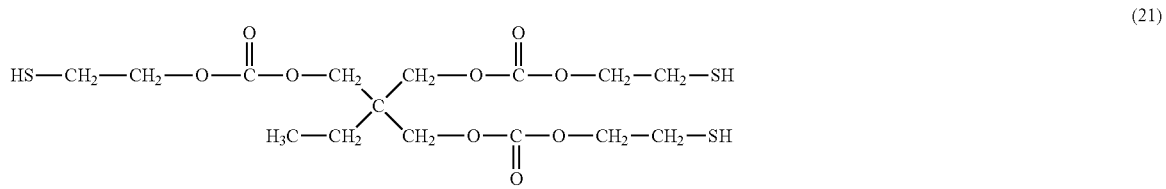
(21)

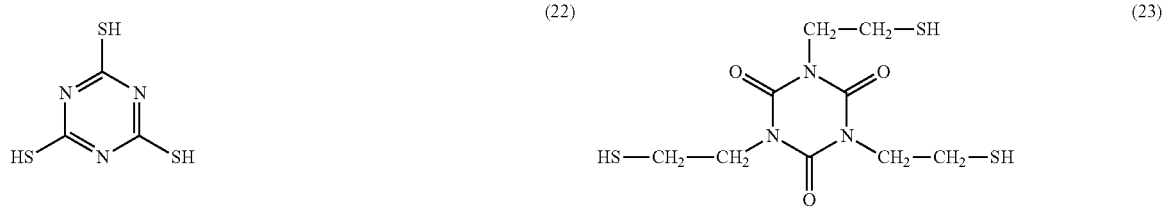
(22) (23)

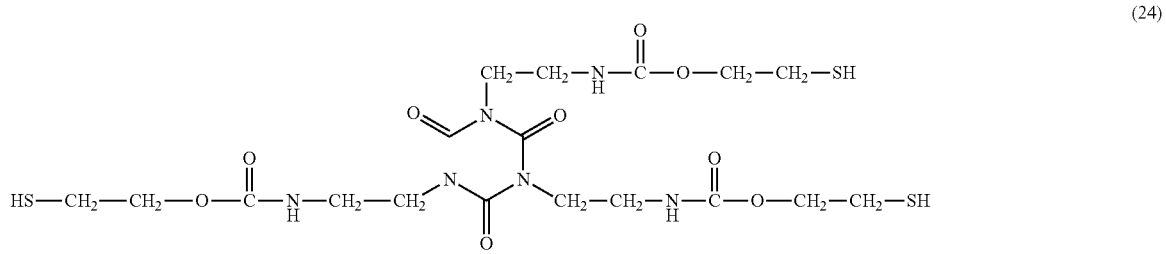
(24)

-continued
(25) 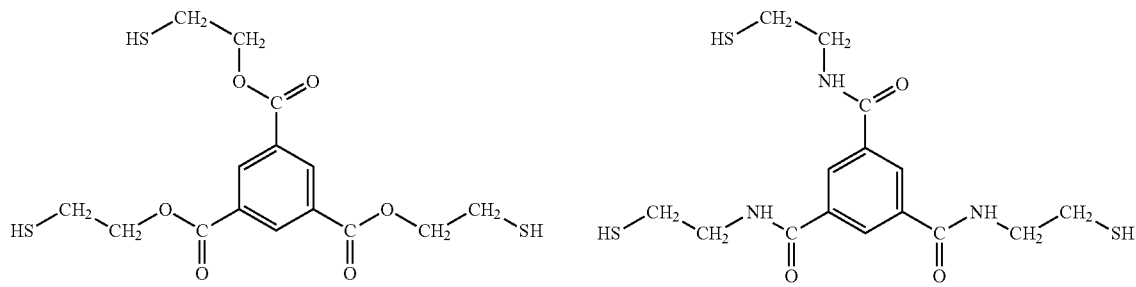 (26)
(27) 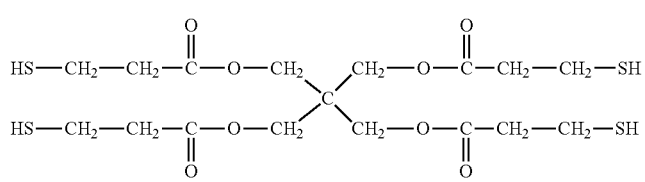
(28) 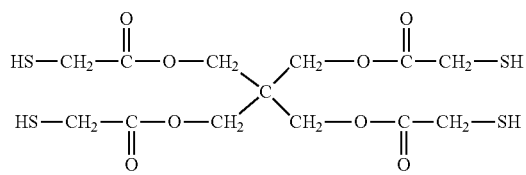
(29) 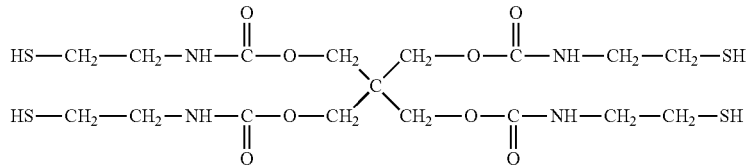
(30) 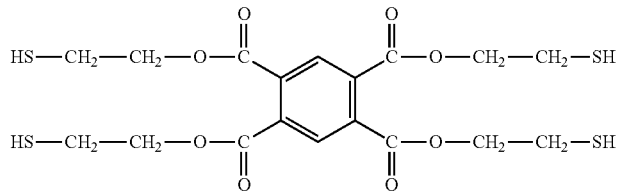
(31) 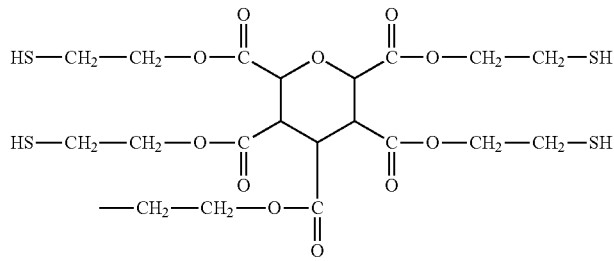
(32) 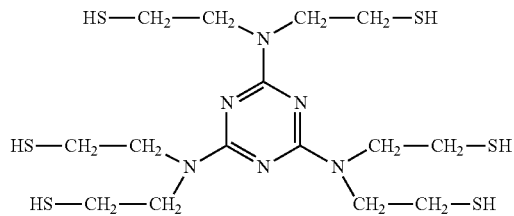

-continued
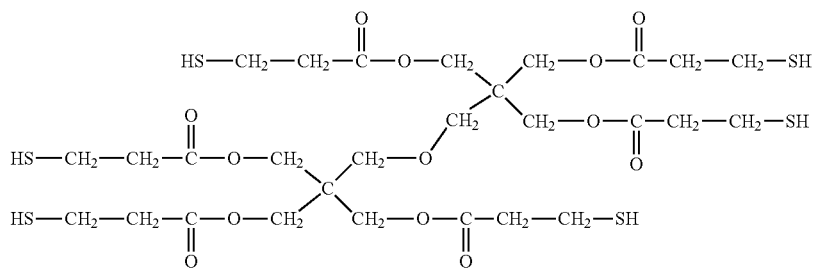
(33)
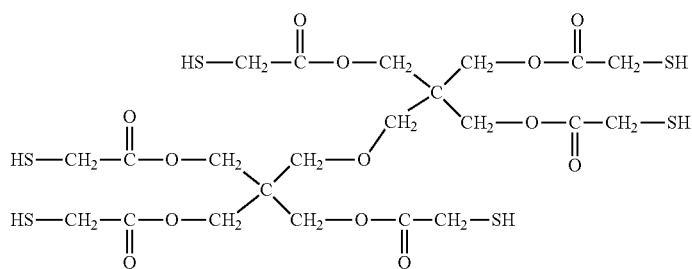
(34)
Among the above compounds, the following compounds are particularly preferred from the viewpoints of the availability of raw materials, ease in synthesis, and solubility in various solvents.
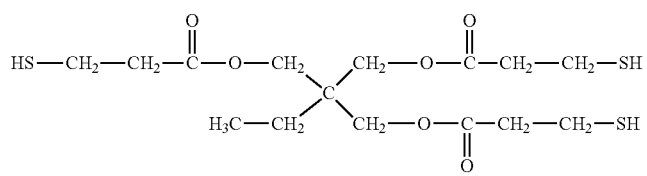
(18)
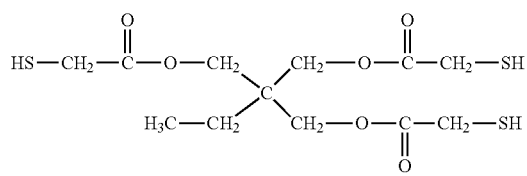
(19)
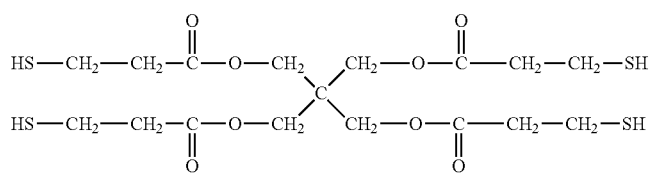
(27)
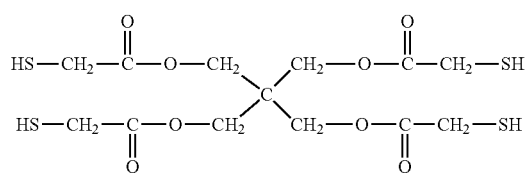
(28)
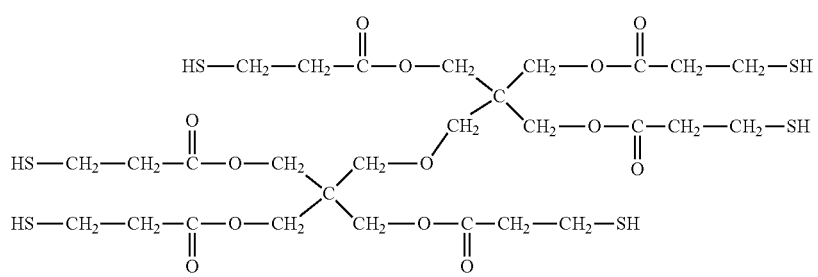
(33)

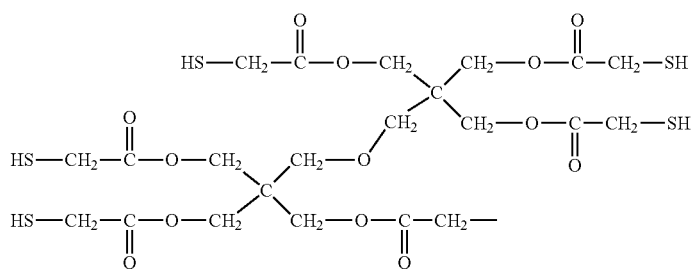

(34)

The compound having an aforementioned adsorptive moiety and a carbon-carbon double bond (specifically, a compound having a carbon-carbon double bond and at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group and a hydroxyl group) is not particularly limited, and examples thereof include the following.

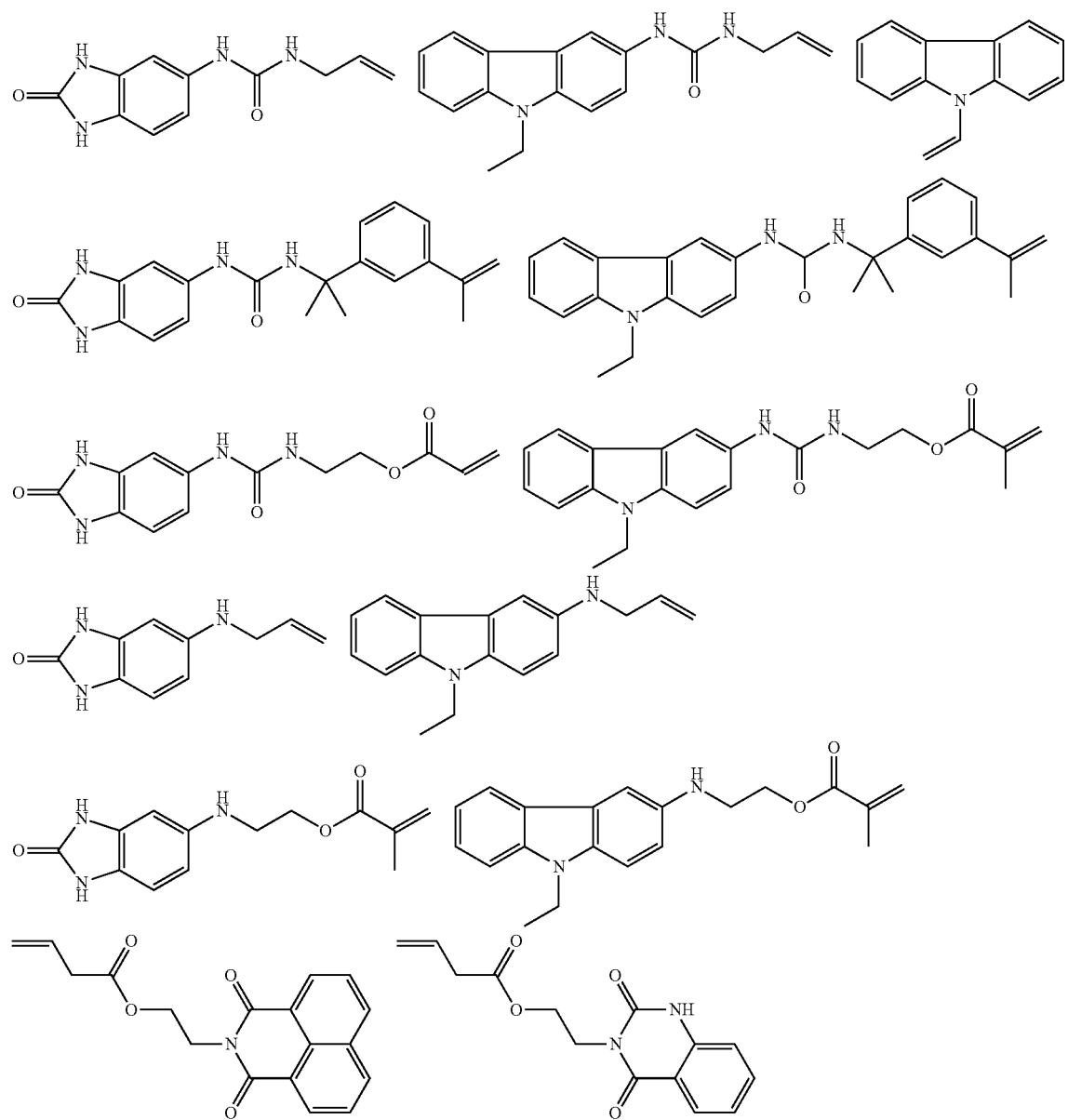

-continued
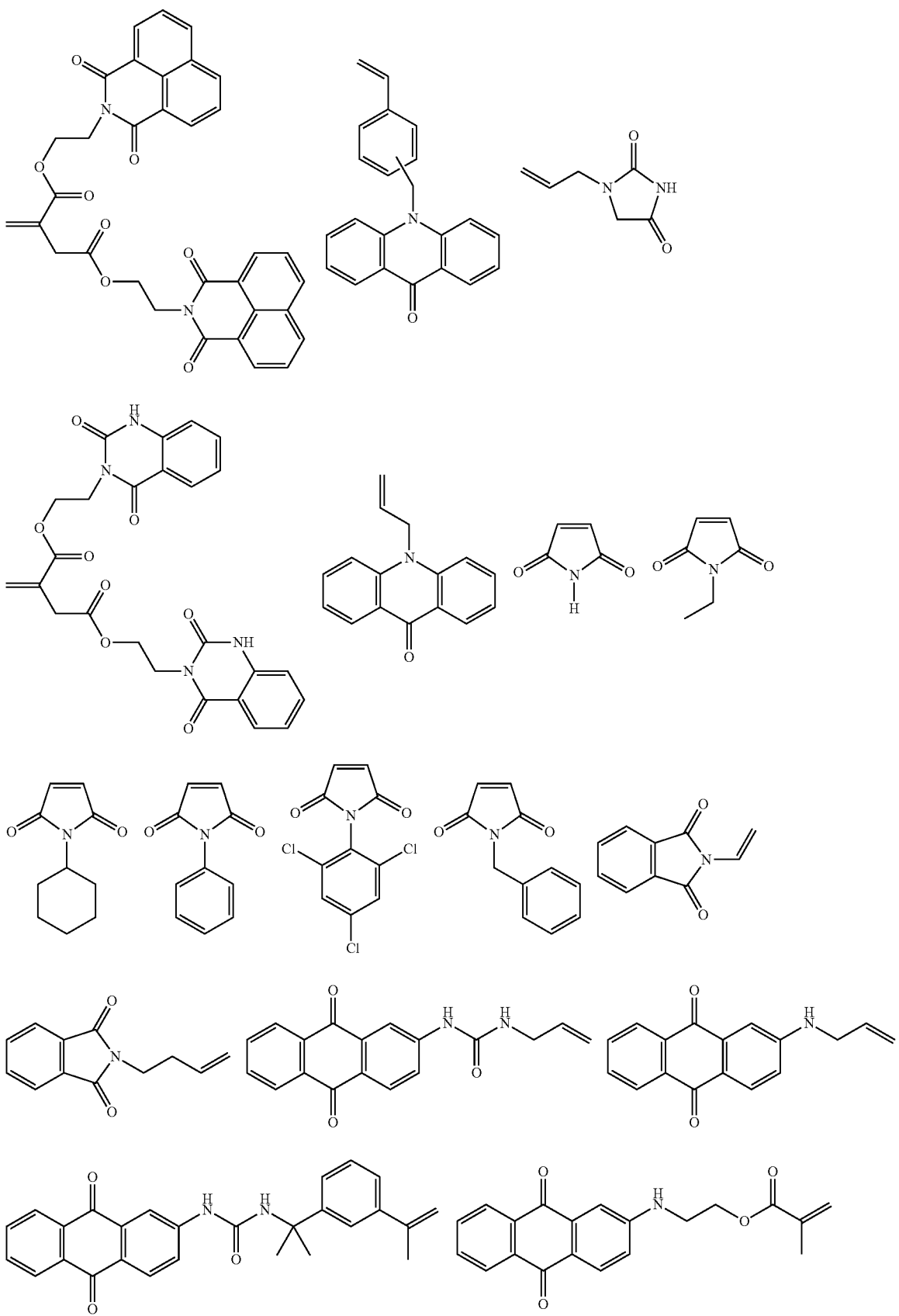

37 38
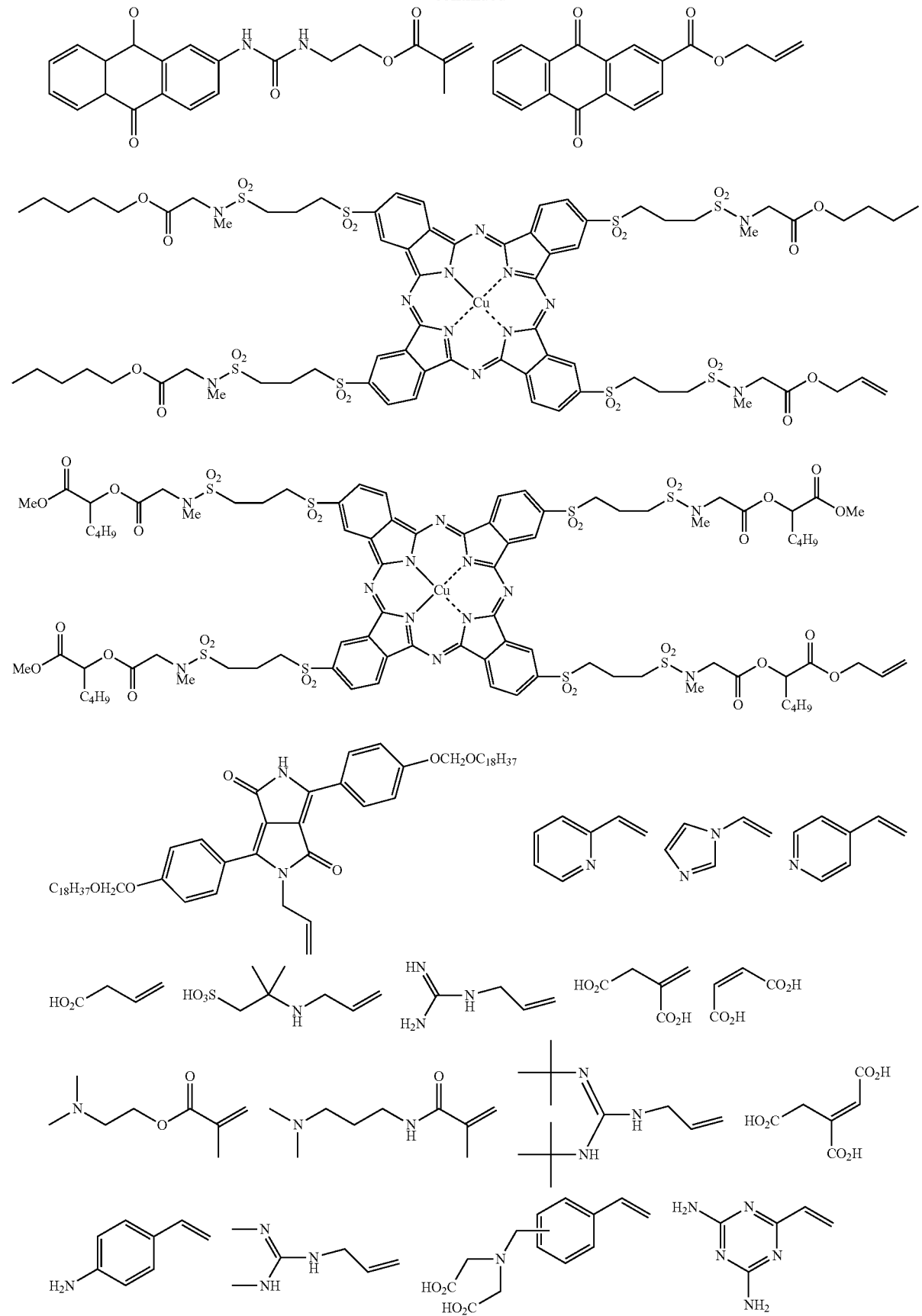
-continued

-continued

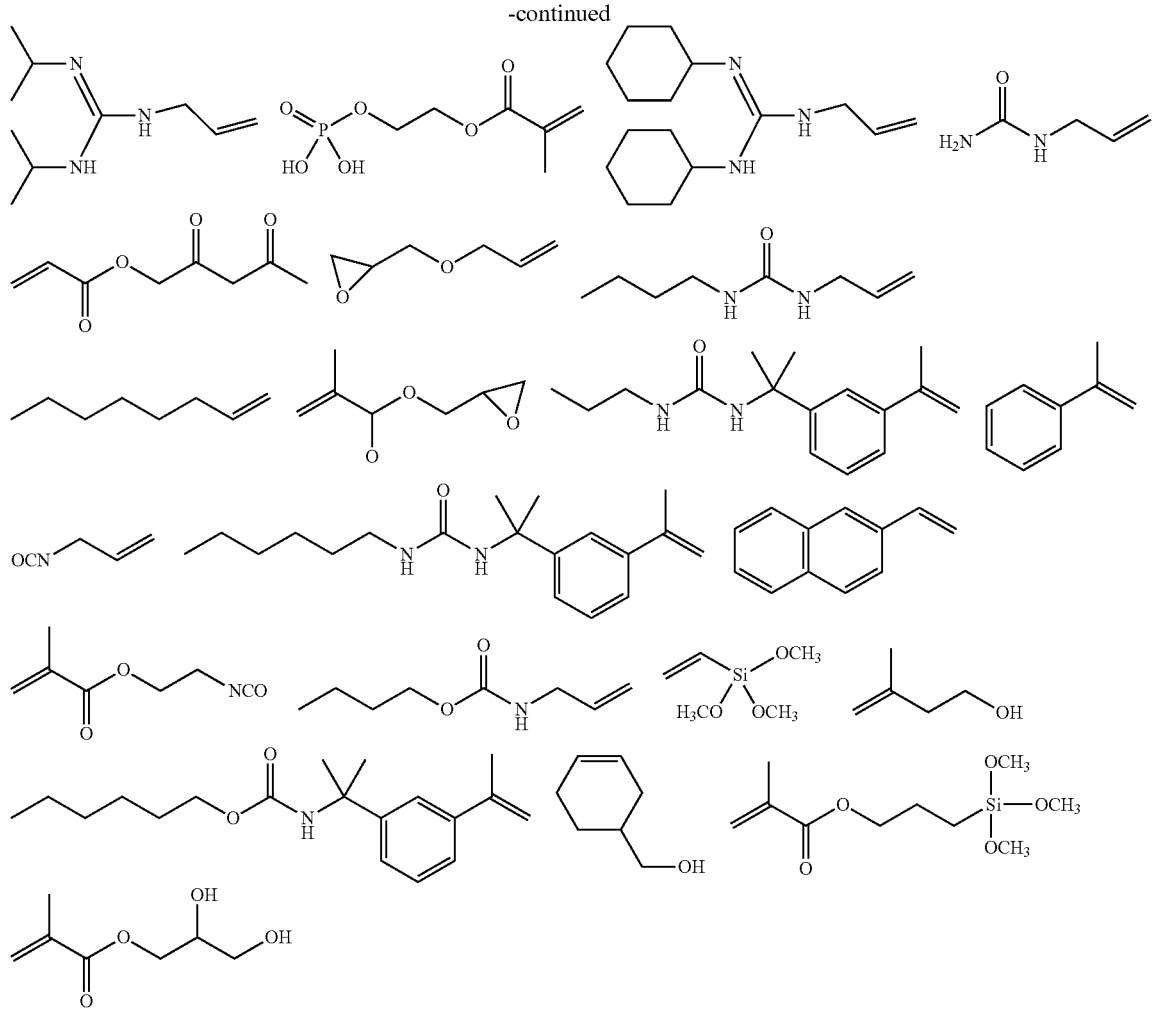

The radical addition reaction product of the "compound having 3 to 10 mercapto groups in one molecule" and the "compound having the adsorptive moiety and a carbon-carbon double bond," is obtained using, for example, a method including dissolving the "compound having 3 to 10 mercapto groups in one molecule" and the "compound having the adsorptive moiety and a carbon-carbon double bond" in a suitable solvent, adding a radical generator thereto, and allowing the addition to proceed at about 50° C. to 100° C. (thiol-ene reaction method).

Examples of the suitable solvent used in the thiol-ene reaction method may be arbitrarily selected in accordance with the solubility of the "compound having 3 to 10 mercapto groups in one molecule" and the "compound having the adsorptive moiety and a carbon-carbon double bond" to be used, and the solubility of the "generated radical addition reaction product."

For example, there may be mentioned methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. It is also possible to use a mixture of two or more selected from these solvents.

As the radical generator, it is possible to use an azo compound such as 2,2'-azobis(isobutyronitrile) (AIBN), 2,2'-azobis-(2,4'-dimethylvaleronitrile) or dimethyl 2,2'-azobisisobutyrate; a peroxide such as benzoyl peroxide; a persulfuric acid salt such as potassium persulfate or ammonium persulfate; and the like.

The vinyl monomer used in the synthesis method of item 5 is not particularly limited. For example, those similar to the vinyl monomers used for obtaining the polymer skeleton represented by $P^1$ in Formula (1) are used.

The polymerization may be conducted with only one kind of the vinyl monomer, or may be conducted with two or more kinds of the vinyl monomers to carry out copolymerization.

When the polymer compound is applied to a photocurable composition requiring alkali development treatment, it is more preferable to copolymerize one or more vinyl monomers having an acidic group and with one or more vinyl monomers having no acidic group.

The polymer compound of the invention is preferably a polymer compound obtained by performing polymerization using the vinyl monomer(s) and a compound represented by Formula (3) by a known method according to a conventional procedure. In addition, the compound represented by Formula (3) in the invention is a compound functioning as a chain transfer agent, and thus the compound is also simply referred to as "chain transfer agent" hereinafter in some cases.

The polymer compound is obtained, for example, using a method including dissolving such a vinyl monomer and the chain transfer agent in an appropriate solvent, adding a radical polymerization initiator thereto, and performing polymerization at about 50° C. to 220° C. in a solution (solution polymerization method).

Examples of the appropriate solvent used in the solution polymerization method may be arbitrarily selected in accordance with the solubility of the monomer used and the copolymer generated. Examples thereof include methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. It is also possible to use a mixture of two or more of these solvents.

As the radical polymerization initiator, an azo compound such as 2,2'-azobis(isobutyronitrile) (AIBN), 2,2'-azobis-(2,4'-dimethylvaleronitrile) or dimethyl 2,2'-azobisisobutyrate; a peroxide such as benzoyl peroxide; a persulfuric acid salt such as potassium persulfate or ammonium persulfate; and the like may be used.

<Pigment Dispersant>

The pigment dispersant of the invention is configured to include the aforementioned polymer compound of the invention as a pigment dispersant for dispersing a pigment, and in addition to the polymer compound of the invention, dispersants such as conventional known pigment dispersants or surfactants, and other components may also be added for the purpose of further enhancing the dispersibility of pigment.

As to known dispersants (pigment dispersants), examples thereof include polymeric dispersants [for example, polyamideamines and salts thereof, polycarboxylic acids and salts thereof, high-molecular-weight unsaturated acid esters, modified polyurethanes, modified polyesters, modified poly(meth)acrylates, (meth)acrylic copolymers, naphthalenesulfonic acid-formalin condensates], polyoxyethylene alkylphosphoric acid esters, polyoxyethylene alkylamines, alkanolamines, and pigment derivatives.

The polymeric dispersants may be further classified, on the basis of the structure, into straight-chained polymers, terminal-modified polymers, graft polymers, and block polymers.

The polymeric dispersant is adsorbed on the surface of a pigment, and acts to prevent re-aggregation. For that reason, a terminal-modified polymer having an anchor moiety for the pigment surface, a graft polymer, and a block polymer may be mentioned as preferable structures. On the other hand, a pigment derivative has an effect of promoting the adsorption of the polymeric dispersant by modifying the pigment surface.

Specific examples of the known dispersants (pigment dispersants) that may be used in the invention, include "DISPERBYK-101 (polyamidoamine phosphate), 107 (carboxylic acid ester), 110 (copolymer containing an acid group), 130 (polyamide), 161, 162, 163, 164, 165, 166, 170 (high-molecular-weight copolymers)," "BYK-P104, P105 (high-molecular-weight, unsaturated polycarboxylic acids)," all manufactured by BYK Chemie GmbH; "EFKA4047, 4050, 4010, 4165 (polyurethane-based), EFKA 4330, 4340 (block copolymers), 4400, 4402 (modified polyacrylates), 5010 (polyester amide), 5765 (high-molecular-weight polycarboxylic acid salt), 6220 (fatty acid polyester), 6745 (phthalocyanine derivative), 6750 (azo pigment derivative)" all manufactured by EFKA GmbH & Co. KG; "AJISPER PB821, PB822" manufactured by Ajinomoto Fine Techno Co., Inc.; "FLOWLEN TG-710 (urethane oligomer)", "POLYFLOW No. 50E, No. 300 (acrylic copolymers)" all manufactured by Kyoeisha Chemical Co., Ltd.; "DISPARLON KS-860, 873SN, 874, #2150 (aliphatic polyvalent carboxylic acids), #7004 (polyether ester), DA-703-50, DA-705, DA-725" all manufactured by Kusumoto Chemicals, Ltd.; "DEMOL RN, N (naphthalenesulfonic acid-formalin polycondensates), MS, C, SN-B (aromatic sulfonic acid-formalin polycondesates)", "HOMOGENOL L-18 (high-molecular-weight polycarboxylic acid)", "EMULGEN 920, 930, 935, 985 (polyoxyethylene nonyl phenyl ethers)", "ACETAMIN 86 (stearylamine acetate)" all manufactured by Kao Corporation; "SOLSPERSE 5000 (phthalocyanine derivative) 22000 (azo pigment derivative), 13240 (polyesteramine), 3000, 17000, 27000 (polymers having functional moieties at terminal portions), 24000, 28000, 32000, 38500 (graft type polymers)" all manufactured by The Lubrizol Corporation; and "NIKKOL T106 (polyoxyethylene sorbitan monooleate), MYS-IEX (polyoxyethylene monostearate)" manufactured by Nikko Chemicals Co., Ltd.

With regard to the pigment dispersant of the invention, the polymer compound of the invention may be used alone, or may be used in combination with one or more of the known dispersants.

<Pigment Dispersion Composition>

The pigment dispersion composition of the invention is configured to include at least one pigment and the aforementioned pigment dispersant of the invention in an organic solvent, and if necessary, other components such as resin components may be used in the pigment dispersion composition. Since this pigment dispersion composition includes at least one polymer compound of the invention described above as a pigment dispersant, the dispersed state of the pigment in the organic solvent becomes satisfactory; thus, good color characteristics are obtained, and at the same time, when used for constructing a color filter for example, high contrast may be obtained. In particular, an excellent dispersing effect is exerted on organic pigments.

<Pigment>

For the pigment dispersion composition of the invention, various conventional known inorganic pigments or organic pigments may be appropriately selected and used.

Upon considering that the pigment preferably has a high transmittance irrespective of whether it is and inorganic pigment or organic pigment, it is preferable to use a pigment having a particle size that is as small as possible. Also considering the handling properties, the average particle size of the pigment is preferably from 0.01 to 0.1 µm, and more preferably from 0.01 to 0.05 µm.

As the inorganic pigment, metal compounds, represented by metal oxides, metal complex salts and the like, may be mentioned, and specifically, metal oxides of iron, cobalt, aluminum, cadmium, lead, copper, titanium, magnesium, chromium, zinc, antimony and the like, complex oxides of the above metals, and the like may be mentioned.

Examples of the organic pigment include:

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 37, 39;

C.I. Pigment Blue 1, 2, 15, 15:1, 15:3, 15:6, 16, 22, 60, 66;

C.I. Pigment Green 7, 36, 37;

C.I. Pigment Brown 25, 28;

C.I. Pigment Black 1, 7; and carbon black.

According to the invention, in particular, those having a basic N atom in the structural formula of the pigment may be preferably used. These pigments having basic N atoms exhibit good dispersibility in the composition of the invention. The reason thereof has not been sufficiently clarified, but it is supposed that the good affinity between the components in the composition and the pigment has some influence.

In the invention, the pigment is not particularly limited. The following pigments are more preferred:

C.I. Pigment Yellow 11, 24, 108, 109, 110, 138, 139, 150, 151, 154, 167, 180, 185, C.I. Pigment Orange 36, 71, C.I. Pigment Red 122, 150, 171, 175, 177, 209, 224, 242, 254, 255, 264, C.I. Pigment Violet 19, 23, 37, C.I. Pigment Blue 15:1, 15:3, 15:6, 16, 22, 60, 66, C.I. Pigment Black 7.

With respect to these organic pigments, only one organic pigment may be used singly, or, alternatively, organic pigments may be used in various combinations in order to increase the color purity. Specific examples of the combinations are presented in the following.

For example, as the red pigment, it is possible to use an anthraquinone pigment, a perylene pigment, or a diketopyrrolopyrrole pigment alone, or a mixture of at least one of these pigments with a bisazo yellow pigment, an isoindoline yellow pigment, a quinophthalone yellow pigment or a perylene red pigment, or the like. For example, the anthraquinone pigment may be C.I. Pigment Red 177, the perylene pigment may be C.I. Pigment Red 155 or C.I. Pigment Red 224, and the diketopyrrolopyrrole pigment may be C.I. Pigment Red 254, while from the viewpoint of color reproducibility, a mixture with C.I. Pigment Yellow 139 is preferred. The mass ratio of the red pigment to the yellow pigment is preferably from 100:5 to 100:50. If the mass ratio is less than 100:5, it becomes difficult to lower the light transmittance at 400 nm to 500 nm, and there are cases in which the color purity cannot be increased. If the mass ratio is greater than 100:50, the main wavelength is shifted to short wavelengths, so that the color may greatly deviate from a NTSC target color. In particular, the mass ratio is optimally in the range of 100:10 to 100:30. Furthermore, in the case of a combination of red pigments, the mass ratio thereof may be adjusted in accordance with the chromaticity.

As the green pigment, it is possible to use a halogenated phthalocyanine pigment may be used alone, or a mixture of this pigment with a bisazo yellow pigment, a quinophthalone yellow pigment, an azomethine yellow pigment or an isoindoline yellow pigment. As examples of such a mixture, a mixture of C.I. Pigment Green 7, 36 or 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185 is preferred, for example. The mass ratio of the green pigment to the yellow pigment is preferably from 100:5 to 100:150. If the mass ratio is less than 100:5, it becomes difficult to lower the light transmittance at 400 nm to 450 nm, and there are cases where the color purity cannot be increased. Further, if the mass ratio is greater than 100:150, the main wavelength is shifted to longer wavelengths, so that the color may greatly deviate from a NTSC target color. The mass ratio is particularly preferably in the range of 100:30 to 100:120.

As the blue pigment, a phthalocyanine pigment may be used alone, or a mixture of this pigment with a dioxazine violet pigment may be used. For example, a mixture of C.I. Pigment Blue 15:6 with C.I. Pigment Violet 23 is preferred. The mass ratio of the blue pigment to the violet pigment is preferably from 100:0 to 100:50, and more preferably from 100:5 to 100:30.

Examples of the pigment for a black matrix include carbon, titanium black, iron oxide, and titanium oxide, and mixtures thereof, and a combination of carbon and titanium black is preferred. The mass ratio of carbon to titanium black is preferably in the range of 100:0 to 100:60. If the mass ratio is greater than 100:60, the dispersion stability is deteriorated in some cases.

The content of the pigment in the pigment dispersion composition is preferably from 40 to 90% by mass, and more preferably from 50 to 80% by mass, with respect to the total solid content (mass) of the composition. A content of the pigment within the above-mentioned range provides sufficient color density, and is effective in securing excellent color characteristics.

(Pigment Dispersant)

Details of the pigment dispersant are as described above, and preferred embodiments of the component(s) constituting the pigment dispersant are also as described above.

Furthermore, the content of the pigment dispersant in the pigment dispersion composition is preferably from 0.5 to 100% by mass, more preferably 3 to 100% by mass, and particularly preferably 5 to 80% by mass, with respect to the mass of the pigment. When the amount of the pigment dispersant is within the above-described range, sufficient pigment dispersing effects are obtained. In addition, even if the pigment dispersant is added in an amount of more than 100 parts by mass, a further enhancing effect of the pigment dispersing effects is not expected in some cases.

Specifically, in the case of using a polymer dispersant, the amount of use is preferably in the range of 5 to 100% by mass, and more preferably in the range of 10 to 80% by mass, with respect to the pigment. Furthermore, in the case of using a pigment derivative, the amount of use is preferably in the range of 0.5 to 30% by mass, more preferably in the range of 3 to 20% by mass, and particularly preferably in the range of 5 to 15% by mass, with respect to the pigment.

Moreover, in order to sufficiently obtain the effect in pigment dispersibility exerted by the polymer compound of the invention, the content of the polymer compound of the invention with respect to the total amount of the pigment dispersant in the pigment dispersion composition of the invention, is preferably 10% by mass or more, more preferably 30% by mass or more, and even more preferably 50% by mass or more.

Preparation of the pigment dispersion composition of the invention is not particularly limited. The composition may be obtained by, for example, subjecting the pigment, the pigment dispersant and a solvent to a microdispersion treatment using a vertical type or transverse type sand grinder, a pin mill, a slit mill, an ultrasonic disperser, or the like, and using beads with a particle size of 0.01 to 1 mm made of glass, zirconia, or the like.

Furthermore, before performing the beads dispersion, a kneading dispersion treatment may also be carried out with a strong shear force being applied by using a twin roll, a triple roll, a ball mill, a throne mill, a disper, a kneader, a co-kneader, a homogenizer, a blender, a uniaxial or biaxial extruder, or the like.

In addition, details of kneading and dispersion are described in T. C. Patton, *Paint Flow and Pigment Dispersion* (published by John Wiley and Sons, 1964) and the like.

<Photocurable Composition>

The photocurable composition of the invention includes at least the pigment dispersion composition of the invention described above, an alkali-soluble resin, a photopolymerizable compound, and a photopolymerization initiator, and may also include other components as necessary. Since this photocurable composition includes at least one polymer compound of the invention as a pigment dispersant, the pigment is maintained in a good dispersed state in the composition, good color characteristics are obtained, and at the same time, high contrast can be obtained when used for constructing a color filter for example. Hereinafter, the respective components will be described in detail.

(Pigment Dispersion Composition)

The photocurable composition of the invention is configured by using at least one pigment dispersion composition. Details of the pigment dispersion composition of the invention constituting the photocurable composition are as described above.

The content of the pigment dispersion composition in the photocurable composition is preferably such an amount as to give a content of pigment in the range of 5 to 70% by mass with respect to the total solid content (mass) of the photocurable composition, and more preferably such an amount as to give a content of the pigment in the range of 15 to 60% by mass with respect to the total solid content (mass) of the photocurable composition. A content of the pigment dispersion composition within the above-described range provides sufficient color density, and is effective for securing excellent color characteristics.

(Alkali-Soluble Resin)

The photocurable composition of the invention contains at least one alkali-soluble resin. The alkali-soluble resin may be appropriately selected from alkali-soluble resins which are high-molecular-weight polymers, and have at least one group that enhances the alkali solubility (for example, a carboxyl group, a phosphoric acid group, a sulfonic acid group, or the like) in molecules (preferably molecules having an acrylic copolymer or a styrenic copolymer as the main chain). Among these, those which are soluble in organic solvents and developable with weak aqueous alkali solutions are more preferable.

For the production of the alkali-soluble resin, for example, methods based on known radical polymerization methods may be applied. In the case of producing the alkali-soluble resin by a radical polymerization method, the polymerization conditions such as temperature, pressure, type and amount of the radical initiator, type of the solvent, and the like may be easily set by those having ordinary skill in the art, and the conditions may also be experimentally set.

The aforementioned high-molecular-weight polymer is preferably a polymer having a carboxylic acid in a side chain. Examples thereof include methacrylic acid copolymers, acrylic acid copolymers, itaconic acid copolymers, crotonic acid copolymers, maleic acid copolymers, partially esterified maleic acid copolymers and the like, such as those described in JP-A No. 59-44615, Japanese Patent Application Publication (JP-B) Nos. 54-34327, 58-12577 and 54-25957, JP-A Nos. 59-53836 and 59-71048, and acidic cellulose derivatives having a carboxylic acid in a side chain, and products obtained by addition of acid anhydrides to polymers having a hydroxyl group. Further, high-molecular-weight polymers having a (meth)acryloyl group in a side chain may also be mentioned as preferred examples.

As specific examples of the alkali-soluble resin, copolymers of (meth)acrylic acid and one or more other monomers capable of copolymerizing with (meth)acrylic acid are particularly suitable.

Examples of such other monomers capable of copolymerizing with (meth)acrylic acid include (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, and (meth)acrylonitrile.

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (meth)acrylate, 3-phenoxy-2-hydroxypropyl (meth)acrylate, 2-chloroethyl (meth)acrylate, glycidyl (meth)acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-allyloxyethyl (meth)acrylate, propargyl (meth)acrylate, benzyl (meth)acrylate, (meth)acrylic acid diethylene glycol monomethyl ether, (meth)acrylic acid diethylene glycol monoethyl ether, (meth)acrylic acid triethylene glycol monomethyl ether, (meth)acrylic acid triethylene glycol monoethyl ether, (meth)acrylic acid polyethylene glycol monomethyl ether, (meth)acrylic acid polyethylene glycol monoethyl ether, β-phenoxyethoxyethyl (meth)acrylate, nonylphenoxypolyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, and γ-butyrolactone (meth)acrylate.

Examples of the crotonic acid esters include butyl crotonate and hexyl crotonate.

Examples of the vinyl esters include vinyl acetate, vinyl chloroacetate, vinyl propionate, vinyl butyrate, vinyl methoxyacetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include (meth)acrylamide, N-methyl(meth)acrylamide, N-ethyl(meth)acrylamide, N-propyl(meth)acrylamide, N-isopropyl(meth)acrylamide, N-n-butylacryl(meth)amide, N-t-butyl(meth)acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-nitrophenylacrylamide, N-ethyl-N-phenylacrylamide, N-benzyl(meth)acrylamide, (meth)acryloylmorpholine, diacetone acrylamide, N-methylolacrylamide, N-hydroxyethylacrylamide, vinyl (meth)acrylamide, N,N-diallyl(meth)acrylamide, and N-allyl(meth)acrylamide.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group (for example, t-Boc) that allows deprotection by an acidic substance, methyl vinylbenzoate, and α-methylstyrene.

Examples of the vinyl ethers include methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxyethyl vinyl ether, and phenyl vinyl ether.

Examples of the vinyl ketones include methyl vinyl ketone, ethyl vinyl ketone, propyl vinyl ketone, and phenyl vinyl ketone.

Examples of the olefins include ethylene, propylene, isobutylene, butadiene, and isoprene.

Examples of the maleimides include maleimide, butylmaleimide, cyclohexylmaleimide, and phenylmaleimide.

(Meth)acrylonitrile, a heterocyclic group substituted by a vinyl group (for example, vinylpyridine, N-vinylpyrrolidone, or vinylcarbazole), N-vinylformamide, N-vinylacetamide, N-vinylimidazole, vinylcaprolactone, and the like are also usable.

Other than the above-mentioned compounds, for example, a vinyl monomer having a functional group such as a urethane group, a urea group, a sulfonamide group, a phenol group or an imide group, is also usable. The monomer having such a urethane group or urea group can be appropriately synthesized, for example, using an addition reaction of an isocyanate group and a hydroxyl group or amino group. Specifically, the monomer may be appropriately synthesized by an addition reaction of an isocyanate group-containing monomer and a compound containing one hydroxyl group or compound containing one primary or secondary amino group, or an addition reaction of a hydroxyl group-containing monomer or primary or secondary amino group-containing monomer and monoisocyanate, or the like.

Among these, in particular, a benzyl (meth)acrylate/(meth)acrylic acid copolymer, or a multi-component copolymer formed from benzyl (meth)acrylate/(meth)acrylic acid/one or more other monomer is suitable.

Other than these, a polymer formed by copolymerizing 2-hydroxyethyl methacrylate is also useful. The polymer may be mixed in any amount upon use.

Other than the above-mentioned compounds, further examples include 2-hydroxypropyl (meth)acrylate/polystyrene macromonomer/benzyl methacrylate/methacrylic acid copolymer, 2-hydroxy-3-phenoxypropyl acrylate/polymethyl methacrylate macromonomer/benzyl methacrylate/methacrylic acid copolymer, 2-hydroxyethyl methacrylate/polystyrene macromonomer/methyl methacrylate/methacrylic acid copolymer, and 2-hydroxyethyl methacrylate/polystyrene macromonomer/benzyl methacrylate/methacrylic acid copolymer, such as those described in JP-A No. 7-140654.

Furthermore, a (meth)acrylic resin having an allyl group or vinyl ester group and a carboxyl group in side chain(s), alkali-soluble resins containing a double bond in a side chain as described in JP-A Nos. 2000-187322 and 2002-62698, and alkali-soluble resins having an amide group in a side chain as described in JP-A No. 2001-242612, are preferable due to their excellent balance between film strength, sensitivity and developability.

The weight average molecular weight of the alkali-soluble resin that can be used in the invention is preferably 5,000 or greater, and more preferably in the range of 10,000 to 300,000. The number average molecular weight is preferably 1,000 or greater, and more preferably in the range of 2,000 to 250,000. The polydispersity (weight average molecular weight/number average molecular weight) is preferably in the range of 1.1 to 10, and more preferably in the range of 1.2 to 5.

The alkali-soluble resin may be any of random polymer, block polymer, graft polymer, and the like.

The alkali-soluble resin that can be used in the invention may be synthesized by a conventional known method. Examples of the solvent used at the time of synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. Only one of these solvents may be used singly, or, alternatively, a mixture of two or more of these solvents may be used.

Examples of the radical polymerization initiator used for the synthesis of an alkali-soluble resin that can be used in the invention include known compounds such as azo initiators and peroxide initiators.

Moreover, it is possible to use, as the alkali-soluble resin, the polymer compound of the invention represented by the above-described Formula (1) or the above-described Formula (2).

The content of the alkali-soluble resin in the photocurable composition is preferably from 1 to 20% by mass, more preferably from 2 to 15% by mass, and particularly preferably from 3 to 12% by mass, with respect to the total solid content of the composition.

(Photopolymerizable Compound)

The photocurable composition of the invention includes at least one photopolymerizable compound. The photopolymerizable compound that can be used in the invention is an addition polymerizable compound having at least one ethylenic unsaturated double bond, and is selected from compounds having at least one, and preferably two or more, terminal ethylenic unsaturated bonds. Such a class of compounds are widely known in the pertinent industrial fields, and may be used in the invention without particularly restrictions. These compounds take a chemical form of, for example, monomer, prepolymer (i.e., dimer, trimer and oligomer), or a mixture thereof, or a copolymer thereof. Examples of the monomer and copolymers thereof include unsaturated carboxylic acids (for example, acrylic acid, methacrylic acid, itaconic acid, crotonic acid, isocrotonic acid, and maleic acid), and esters and amides thereof. It is preferable to use an ester of an unsaturated carboxylic acid and an aliphatic polyhydric alcohol compound or an amide of an unsaturated carboxylic acid and an aliphatic polyvalent amine compound. It is also preferable to use an adduct of an unsaturated carboxylic acid ester or amide having a nucleophilic substituent such as a hydroxyl group, an amino group or a mercapto group, with a monofunctional or polyfunctional isocyanate or epoxy; a dehydration condensation product of the unsaturated carboxylic acid ester or amide having a nucleophilic substituent such as a hydroxyl group, an amino group or a mercapto group, with a monofunctional or polyfunctional carboxylic acid; or the like. Furthermore, an adduct of an unsaturated carboxylic acid ester or amide having an electrophilic substituent such as an isocyanate group or an epoxy group, with a monofunctional or polyfunctional alcohol, amine or thiol; and a substitution product of an unsaturated carboxylic acid ester or amide having a leaving substituent such as a halogen group or a tosyloxy group, with a monofunctional or polyfunctional alcohol, amine or thiol, are also suitable. As another example, it is also possible to use a class of compounds in which the unsaturated carboxylic acid is replaced by an unsaturated phosphonic acid, styrene, vinyl ether or the like.

Specific examples of the monomer of the ester of an aliphatic polyhydric alcohol compound and an unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, and the like.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of the crotonic acid ester include ethylene glycol dicrotonate, tetramethylene glycol dicrotonate, pentaerythritol dicrotonate, and sorbitol tetradicrotonate. Examples of the isocrotonic acid ester include ethylene glycol diisocrotonate, pentaerythritol diisocrotonate, and sorbitol tetraisocrotonate. Examples of the maleic acid ester include ethylene glycol dimaleate, triethylene glycol dimaleate, pentaerythritol dimaleate, and sorbitol tetramaleate.

As the examples of other esters, for example, it is also preferable to use the following: aliphatic alcohol-based esters described in JP-B No. 51-47334 and JP-A No. 57-196231; those having an aromatic skeleton as described in JP-A Nos. 59-5240, 59-5241 and 2-226149; those containing an amino group as described in JP-A No. 1-165613; and the like. Furthermore, the above-mentioned ester monomer may be used as a mixture.

Specific examples of the monomer of the amide of an aliphatic polyvalent amine compound and an unsaturated carboxylic acid, include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide. Other examples of preferred amide monomers include those having a cyclohexylene structure as described in JP-B No. 54-21726.

Furthermore, urethane addition polymerizable compounds produced by an addition reaction between isocyanate and a hydroxyl group are also suitable, and specific examples thereof include the vinylurethane compound containing two or more polymerizable vinyl groups in one molecule, which is produced by addition of a vinyl monomer containing a hydroxyl group represented by the following formula (I) to a polyisocyanate compound having two or more isocyanate groups in one molecule, as described in JP-B No. 48-41708.

$$CH_2=C(R)COOCH_2CH(R')OH \qquad (I)$$

wherein R and R' each independently represent H or $CH_3$.

Urethane acrylates such as those described in JP-A No. 51-37193, JP-B Nos. 2-32293 and 2-16765, or the urethane compounds having an ethylene oxide skeleton as described in JP-B Nos. 58-49860, 56-17654, 62-39417 and 62-39418, are also suitable. Furthermore, when the addition polymerizable compounds having an amino structure or sulfide structure in the molecule, as described in JP-A Nos. 63-277653, 63-260909, and 1-105238 are used, a photopolymerizable composition having a very excellent photosensitive speed may be obtained.

Other examples include: polyfunctional acrylates and methacrylates such as polyester acrylates and epoxy acrylates obtained by allowing epoxy resins and (meth)acrylic acid to react, such as those described in JP-A No. 48-64183, JP-B Nos. 49-43191 and 52-30490; the specific unsaturated compounds described in JP-B Nos. 46-43946, 1-40337 and 1-40336; and the vinylphosphonic acid compounds described in JP-A No. 2-25493. In some cases, the structure containing a perfluoroalkyl group as described in JP-A No. 6122048 is suitably used.

Those introduced in Journal of the Adhesion Society of Japan, Vol. 20, No. 7, pp. 300-308 (1984) as photocurable monomers and oligomers are also usable.

With regard to these addition polymerizable compounds, details of the usage thereof, such as the structure of the compound, whether the compound is used alone or in combination, the amount of addition, and the like, may be arbitrarily set in accordance with the performance design of the final photosensitive material: The conditions are selected, for example from the following viewpoints.

From the viewpoint of sensitivity, a structure having a large content of unsaturated group per one molecule is preferred, and in many cases, bi- or higher functionality is preferred. In order to increase the strength of the image portion, that is, the cured film, a tri- or higher-functional compound is favorable, and a method is also effective in which sensitivity and strength are both controlled by using compounds having different functionalities and/or different polymerizable groups (for example, an acrylic acid ester, a methacrylic acid ester, a styrene compound, a vinyl ether compound) in combination. From the viewpoint of curing sensitivity, it is preferable to use a compound containing two or more (meth)acrylic acid ester structures, it is more preferable to use a compound containing three or more of (meth)acrylic acid ester structures, and it is most preferable to use a compound containing four or more (meth)acrylic acid ester structures. From the viewpoints of curing sensitivity and the developability of unexposed portions, the compound preferably contains an EO-modified product. Also, from the viewpoints of curing sensitivity and the strength of exposed portions, a compound containing a urethane bond is preferred.

Also with regard to the compatibility with other components in the polymerizable layer (for example, alkali-soluble resin, initiator, colorant (pigment, dye, and the like)) and dispersibility, the selection and way of use of the addition polymerizable compound are important factors, and for example, compatibility is enhanced, in some cases, by using a low purity compound or using two or more compounds in combination. A specific structure may be selected for the purpose of enhancing the adhesiveness of the substrate, the after-mentioned overcoat layer, or the like.

From the above-mentioned viewpoints, preferable examples include bisphenol A diacrylate, an EO-modified product of bisphenol A diacrylate, trimethylolpropane triacrylate, trimethylolpropane tri(acryloyloxypropyl) ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, an EO-modified product of pentaerythritol tetraacrylate, and an EO-modified product of dipentaerythritol hexaacrylate. As to commercially available products, urethane oligomers UAS-10, UAB-140 (manufactured by Sanyo-Kokusaku Pulp Co., Ltd.), DPHA-40H (manufactured by Nippon Kayaku Co., Ltd.), UA-306H, UA-306T, UA-3061, AH-600, T-600, and AI-600 (manufactured by Kyoeisha Chemical Co., Ltd.) are preferred.

Among them, an EO-modified product of bisphenol A diacrylate, pentaerythritol triacrylate, pentaerythritol tetraacrylate, dipentaerythritol pentaacrylate, dipentaerythritol hexaacrylate, tri(acryloyloxyethyl) isocyanurate, an EO-modified product of pentaerythritol tetraacrylate, an EO-modified product of dipentaerythritol hexaacrylate, and the like are more preferred, and as to commercially available products, DPHA-40H (manufactured by Nippon Kayaku Co., Ltd.), UA-306H, UA-306T, UA-3061, AH-600, T-600, and AI-600 (manufactured by Kyoeisha Chemical Co., Ltd.) are more preferred.

Only one photopolymerizable compound may be used singly, and it is also possible to use a combination of two or more photopolymerizable compounds.

The content of the photopolymerizable compound in the photocurable composition is preferably from 1 to 90% by mass, more preferably from 5 to 80% by mass, and even more preferably from 10 to 70% by mass, with respect to the total solid content of the composition. When the content of the photopolymerizable compound is within the above-mentioned range, curing reaction proceeds sufficiently.

In particular, when the photocurable composition of the invention is used for the formation of a colored pattern of a color filter, the content is preferably in the range of 5 to 50% by mass, more preferably 7 to 40% by mass, and even more preferably 10 to 35% by mass.

(Photopolymerization Initiator)

The photocurable composition of the invention includes at least one photopolymerization initiator.

The photopolymerization initiator according to the invention is a compound that is degraded by light and thereby initiates and promotes the polymerization of the after-mentioned compound containing an ethylenic unsaturated bond. The photopolymerization initiator is preferably a compound having absorption in the wavelength range of 300 to 500 nm. It is possible to use only a single photopolymerization initiator, or it is also possible to use two or more photopolymerization initiators in combination.

Examples of the photopolymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic borate compounds, disulfone compounds, oxime ester compounds, onium salt compounds, and acylphosphine (oxide) compounds.

Hereinafter, each of these compounds will be described in detail.

Examples of the organic halogenated compounds include, specifically, the compounds described in Wakabayashi, et al., *Bull. Chem. Soc. Japan* 42, 2924 (1969); U.S. Pat. No. 3,905, 815, JP-B No. 46-4605, JP-A Nos. 48-36281, 55-32070, 60-239736, 61-169835, 61-169837, 62-58241, 62-212401, 63-70243 and 63-298339; M. P. Hutt, *Journal of Heterocyclic Chemistry* 1 (No. 3) (1970), in particular, oxazole compounds substituted by a trihalomethyl group and s-triazine compounds substituted by a trihalomethyl group.

As the s-triazine compounds, a s-triazine derivative in which at least one mono-, di- or tri-halogen-substituted methyl group is bound to the s-triazine ring is more preferable. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis (trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis (trichlorometyl)-s-triazine, 2-styryl-4,6-bis (trichloromethyl)-s-triazine, 2-(p-methoxystyryl)-4,6-bis (trichloromethyl)-s-triazine, 2-(p-i-propyloxystyryl)-4,6-bis (trichloromethyl)-s-triazine, 2-(p-tolyl)-4,6-bis (trichloromethyl)-s-triazine, 2-(4-naphthoxynaphthyl)-4,6-bis(trichloromethyl)-s-triazine, 2-phenylthio-4,6-bis (trichloromethyl)-s-triazine, 2-benzylthio-4,6-bis (trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis (tribromomethyl)-s-triazine.

Examples of the oxydiazole compounds include 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, and 2-trichloromethyl-5-(4-styryl)styryl-1,3,4-oxodiazole.

Examples of the carbonyl compounds include benzophenone derivatives such as benzophenone, Michler's ketone, 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexyl phenyl ketone, α-hydroxy-2-methylphenylpropananone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; and benzoic acid ester derivatives such as ethyl p-dimethylaminobenzoate, and ethyl p-diethylaminobenzoate.

Examples of the ketal compounds include benzyl methyl ketal and benzyl-β-methoxyethyl ethyl acetal.

Examples of the benzoin compounds include benzoin isopropyl ether, benzoin isobutyl ether, benzoin methyl ether, and methyl o-benzoylbenzoate.

Examples of the acridine compounds include 9-phenylacridine and 1,7-bis(9-acridinyl)heptane.

Examples of the organic peroxide compounds include trimethylcyclohexanone peroxide, acetylacetone peroxide, 1,1-bis(tert-butylperoxy)-3,3,5-trimethylcyclohexane, 1,1-bis (tert-butylperoxy)cyclohexane, 2,2-bis(tert-butylperoxy) butane, tert-butyl hydroperoxide, cumene hydroperoxide, diisopropylbenzene hydroperoxide, 2,5-dimethylhexane-2, 5-dihydroperoxide, 1,1,3,3-tetramethylbutyl hydroperoxide, tert-butylcumyl peroxide, dicumyl peroxide, 2,5-dimethyl-2, 5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tersyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), and carbonyl di(t-hexylperoxy dihydrogen diphthalate).

Examples of the azo compounds include the azo compounds described in JP-A No. 8-108621.

Examples of the coumarin compounds include 3-methyl-5-amino-((s-triazin-2-yl)amino)-3-phenylcoumarin, 3-chloro-5-diethylamino-((s-triazin-2-yl)amino)-3-phenylcoumarin, and 3-butyl-5-dimethylamino-((s-triazin-2-yl)amino)-3-phenylcoumarin.

Examples of the azide compounds include the organic azide compounds described in U.S. Pat. No. 2,848,328, U.S. Pat. No. 2,852,379 and U.S. Pat. No. 2,940,853, and 2,6-bis(4-azidobenzylidene)-4-ethylcyclohexanone (BAC-E).

Examples of the metallocene compounds include various titanocene compounds described in JP-A Nos. 59-152396, 61-151197, 63-41484, 2-249, 2-4705 and 5-83588, such as dicyclopentadienyl-Ti-bis-phenyl, di-cyclopentadienyl-Ti-bis-2,6-difluorophenyl-1-yl, di-cyclopentadienyl-Ti-bis-2,4-di-fluorophenyl-1-yl, di-cyclopentadienyl-Ti-bis-2,4,6-trifluorophenyl-1-yl, di-cyclopentadienyl-Ti-bis-2,3,5,6-tetrafluorophenyl-1-yl, di-cyclopentadineyl-Ti-bis-2,3,4,5,6-pentafluorophenyl-1-yl, di-methylcyclopentadienyl-Ti-bis-2,6-difluorophenyl-1-yl, di-methylcyclopentadienyl-Ti-bis-2,4,6-trifluorophenyl-1-yl, di-methylcyclopentadienyl-Ti-bis-2,3,5,6-tetrafluorophenyl-1-yl, and di-methylcyclopentadienyl-Ti-bis-2,3,4,5,6-pentafluorophenyl-1-yl, and the iron-arene complexes described in JP-A Nos. 1-304453 and 1-152109.

Examples of the hexaarylbiimidazole compounds include various compounds described in JP-8 No. 6-29285, U.S. Pat. Nos. 3,479,185, 4,311,783 and 4,622,286, and the like, and specifically include 2,2'-bis(o-chlorophenyl)-4,4',5,5'-tetraphenylbiimidazole, 2,2'-bis(o-bromophenyl))-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,d-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

As the organic borate compounds, specific examples include the organic boric acid salts described in JP-A Nos. 62-143044, 62-150242, 9-188685, 9-188686, 9-188710, 2000-131837 and 2002-107916, Japanese Patent No. 2764769, Japanese Patent Application No. 2000-310808, Kunz, Martin, "Rad Tech '98. Proceeding Apr. 19-22, 1998, Chicago," and the like; the organic boron-sulfonium complexes or organic boron-oxosulfonium complexes described in JP-A Nos. 6-157623, 6-175564 and 6-175561; the organic boron-iodonium complexes described in JP-A Nos. 6-175554 and 6-175553; the organic boron-phosphonium complexes described in JP-A No. 9-188710; and the organic boron-transition metal coordination complexes described in JP-A Nos. 6-348011, 7-128785, 7-140589, 7-306527 and 7-292014, and the like.

Examples of the disulfone compounds include the compounds described in JP-A Nos. 61-166544 and 2002-328465 (Japanese Patent Application No. 2001-132318).

Examples of the oxime ester compounds include the compounds described in J.C.S. Perkin II (1979) 1653-1660, J.C.S. Perkin II (1979) 156-162, Journal of Photopolymer Science and Technology (1995) 202-232, and JP-A No. 2000-66385; and the compounds described in JP-A No. 2000-80068, Japanese Patent Application National Publication (Laid-Open) No. 2004-534797.

Examples of the onium salt compounds include the diazonium salts described in S. I. Schlesinger, Photogr. Sci. Eng., 18, 387 (1974) and T. S. Bal, et al., Polymer, 21, 423 (1980); the ammonium salts described in U.S. Pat. No. 4,069,055 and JP-A No. 4-365049; the phosphonium salts described in U.S. Pat. Nos. 4,069,055 and 4,069,056; and the iodonium salts described in European Patent No. 104,143, U.S. Pat. Nos. 339,049 and 410,201, JP-A Nos. 2-150848 and 2-296514.

The iodonium salts that can be suitably used in the invention are diaryliodonium salts. From the viewpoint of stability, the iodonium salts are each preferably substituted by two or more electron-donating group such as an alkyl group, an alkoxy group or an aryloxy group. As another preferred form of the sulfonium salt, an iodonium salt having absorption at a wavelength of 300 nm or longer in which one substituent of the triarylsulfonium salt has a coumarin or anthraquinone structure, or the like is preferred.

Examples of the sulfonium salts that can be suitably used in the invention include the sulfonium salts described in European Patent Nos. 370,693, 390,214, 233,567, 297,443 and 297,442, U.S. Pat. Nos. 4,933,377, 161,811, 410,201, 339, 049, 4,760,013, 4,734,444 and 2,833,827, German Patent Nos. 2,904,626, 3,604,580 and 3,604,581. The sulfonium salts are preferably substituted by an electron-withdrawing group from the viewpoint of stable sensitivity. As for the electron-withdrawing groups, those having a Hammett value that is greater than 0 are preferred. Examples of preferred electron-withdrawing groups include a halogen atom and a carboxylic acid.

Another preferred sulfonium salt is a sulfonium salt having absorption at a wavelength of 300 nm or longer in which one substituent of the triarylsulfonium salt has a coumarin or anthraquinone structure. Another preferred sulfonium salt is a sulfonium salt having absorption at a wavelength of 300 nm or longer in which a triarylsulfonium salt has an allyloxy group and/or an arylthio group as a substituent or substituents.

Examples of the onium salt compounds include onium salts such as the selenonium salts described in J. V. Crivello et al., Macromolecules, 10(6), 1307 (1977) and J. V. Crivello et al., J. Polymer Sci., Polymer Chem. Ed., 17, 1047 (1979); and the arsonium salts described in C. S. Wen et al, The Proc. Conf. Rad. Curing ASIA, p. 478, Tokyo, October (1988).

Examples of the acylphosphine (oxide) compounds include IRGACURE 819, DAROCURE 4265, DAROCURE TPO and the like, all manufactured by Ciba Specialty Chemicals, PLC.

As the photopolymerization initiator used in the invention, compounds selected from the group consisting of trihalomethyltriazine compounds, benzyl dimethyl ketal compounds, α-hydroxyketone compounds, α-aminoketone compounds, acylphosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzene-iron complexes and salts thereof, halomethyloxadiazole compounds, and 3-aryl-substituted coumarin compounds, are preferred from the viewpoint of exposure sensitivity.

More preferred are trihalomethyltriazine compounds, α-aminoketone compounds, acylphosphine compounds, phosphine oxide compounds, oxime compounds, biimidazole compounds, onium compounds, benzophenone compounds, and acetophenone compounds, while at least one compound selected from the group consisting of trihalomethyltriazine compounds, α-aminoketone compounds, oxime compounds, biimidazole compounds and benzophenone compounds is even more preferred. Biimidazole compounds are most preferred.

The content of the photopolymerization initiator in the photocurable composition is preferably from 0.1 to 50% by mass, more preferably from 0.5 to 30% by mass, and particularly preferably from 1 to 20% by mass, with respect to the total solid content of the composition. Within this range, good sensitivity and pattern forming properties are obtained.

Next, components other than those described above will be discussed.

—Solvent—

In general, the pigment dispersion composition and photocurable composition of the invention may be suitably prepared using a solvent, together with the above-described components.

Examples of the solvent include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; 3-oxypropionic acid alkyl esters such as methyl 3-oxypropionate and ethyl 3-oxypropionate (for example, methyl 3-methoxypropionate, ethyl 3-methoxypropionate, methyl 3-ethoxypropionate, ethyl 3-ethoxypropionate); 2-oxypropionic acid alkyl esters such as methyl 2-oxypropionate, ethyl 2-oxypropionate and propyl 2-oxypropionate (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate); and methyl pyruvate, ethyl pyruvate, propyl pyruvate, methyl acetoacetate, ethyl acetoacetate, methyl 2-oxobutanoate, ethyl 2-oxobutanoate, and the like;

ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, and the like;

ketones, for example, methyl ethyl ketone, cyclohexanone, 2-heptanone, 3-heptanone, and the like; and aromatic hydrocarbons, for example, toluene, xylene, and the like.

Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and the like are suitable.

Only a single solvent may be used, or two or more solvents may be used in combination.

—Sensitizer—

The photocurable composition of the invention may also contain a sensitizer, for the purpose of improving the radical generation efficiency of the radical initiator, and shifting the photosensitive wavelength to a longer wavelength. As the sensitizer that can be used in the invention, those which sensitize the above-described photopolymerization initiator by an electron transfer mechanism or energy transfer mechanism are preferred.

As the sensitizer that can be used in the invention, there may be mentioned compounds which belong to the classes of compounds listed below and which have an absorption wavelength in the wavelength region of 300 μm to 450 nm.

Preferred examples of the sensitizer include those which belong to the following classes of compounds and which have an absorption wavelength in the region of 330 nm to 450 nm.

Examples include polynuclear aromatics (for example, phenanthrene, anthracene, pyrene, perylene, triphenylene, 9,10-dialkoxyanthracene), xanthenes (for example, fluorescein, eosin, erythrosine, Rhodamine B, Rose Bengal), thioxanthones (isopropylthioxanthone, diethylthioxanthone, chlorothioxanthone), cyanines (for example, thiacarbocyanine, oxacarbocyanine), merocyanines (for example, merocyanine, carbomerocyanine), phthalocyanines, thiazines (for example, thionine, Methylene Blue, Toluidine Blue), acridines (for example, Acridine Orange, chloroflavin, acriflavine), anthraquinones (for example, anthraquinone), squaliums (for example, squalium), Acridine Orange, coumarins (for example, 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, acetophenone, benzophenone, thioxathone, aromatic ketone compounds such as Michler's ketone, heterocyclic compounds such as N-aryloxazolidinone, and the compounds described in European Patent No. 568,993, U.S. Pat. Nos. 4,508,811 and 5,227,227, JP-A Nos. 2001-125255 and 11-271969, and the like.

More preferred examples of the sensitizer include the compounds represented by the following formulas (i) to (iv).

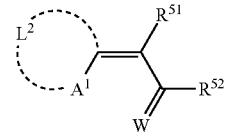

Formula (i)

In Formula (i), $A^1$ represents a sulfur atom or $NR^{50}$; $R^{50}$ represents an alkyl group or an aryl group; $L^2$ represents a non-metal atomic group which, together with the adjacent $A^1$ and the adjacent carbon atom, forms a basic nucleus of a dye; $R^{51}$ and $R^{52}$ each independently represent a hydrogen atom or a monovalent non-metal atomic group; $R^{51}$ and $R^{52}$ may be bound to each other to form an acidic nucleus of a dye; and W represents an oxygen atom or a sulfur atom.

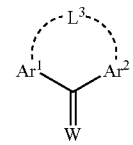

Formula (ii)

In Formula (ii), $Ar^1$ and $Ar^2$ each independently represent an aryl group, and are linked through a linkage formed by -$L^3$-, wherein $L^3$ represents —O— or —S—; and W has the same definition as in Formula (i).

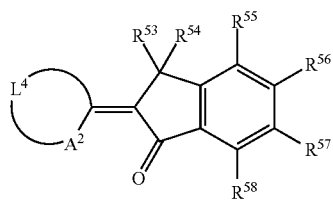

Formula (iii)

In Formula (iii), $A^2$ represents a sulfur atom or $NR^{59}$; $L^4$ represents a non-metal atomic group which, together with the adjacent $A^2$ and the carbon atom, forms a basic nucleus of a dye; $R^{53}$, $R^{54}$, $R^{55}$, $R^{56}$, $R^{57}$ and $R^{58}$ each independently represent a monovalent non-metal atomic group; and $R^{59}$ represents an alkyl group or an aryl group.

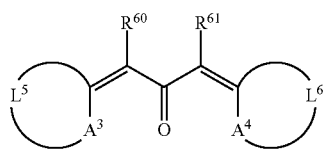

Formula (iv)

In Formula (iv), $A^3$ and $A^4$ each independently represent —S—, —$NR^{62}$— or —$NR^{63}$—; $R^{62}$ and $R^{63}$ each independently represent a substituted or unsubstituted alkyl group, or a substituted or unsubstituted aryl group; $L^5$ and $L^6$ each independently represent a non-metal atomic group which, together with the adjacent $A^3$ or $A^4$ and the adjacent carbon atom, forms a basic nucleus of a dye; $R^{60}$ and $R^{61}$ each independently represent a monovalent non-metal atomic group, or may be bound to each other to form an aliphatic or aromatic ring.

Only a single sensitizer may be used, or it is also possible to use two or more sensitizers in combination.

The content of the sensitizer in the photocurable composition of the invention is preferably from 0.1 to 20% by mass, and more preferably from 0.5 to 15% by mass, in terms of the solid content, from the viewpoints of the efficiency of light absorption to deep portions, and the efficiency of initiation and degradation.

—Co-Sensitizer—

The photocurable composition of the invention preferably contains a co-sensitizer. The co-sensitizer according to the invention has functions to further enhance the sensitivity of the sensitizing dye or initiator to active radiation, or suppress the inhibition of polymerization of the polymerizable compound by oxygen.

Examples of such co-sensitizer include amines, for example, the compounds described in M. R. Sander et al., *Journal of Polymer Society*, vol. 10, p. 3173 (1972), JP-B No. 44-20189, JP-A Nos. 51-82102, 52-134692, 59-138205, 60-84305, 62-18537 and 64-33104, Research Disclosure No. 33825, and the like. Specific examples include triethanolamine, p-dimethylaminobenzoic acid ethyl ester, p-formyldimethylaniline, and p-methylthiodimethylaniline.

Other examples of the co-sensitizer include thiols and sulfides, for example, the thiol compounds described in JP-A No. 53-702, JP-B No. 55-500806 and JP-A No. 5-142772; and the disulfide compounds described in JP-A No. 56-75643, and specifically include 2-mercaptobenzothiazole, 2-mercaptobenzoxazole, 2-mercaptobenzoimidazole, 2-mercapto-4(3H)-quinazoline, and β-mercaptonaphthalene.

Furthermore, other examples of the co-sensitizer include amino acid compounds (for example, N-phenylglycine), the organometallic compounds described in JP-B No. 48-42965 (for example, tributyltin acetate), the hydrogen donors described in JP-B No. 55-34414, and the sulfur compounds described in JP-'A No. 6-308727 (for example, trithiane).

The content of these co-sensitizers is preferably in the range of 0.1 to 30% by mass, more preferably in the range of 1 to 25% by mass, and even more preferably in the range of 0.5 to 20% by mass, with respect to the mass of the total solid content of the photocurable composition, from the viewpoint of enhancing the curing rate through a balance between polymer growth rate and chain transfer.

—Other Components—

The pigment dispersion composition or photocurable composition of the invention may include, if necessary, various additives such as a fluorine-containing organic compound, a thermal polymerization inhibitor, a colorant, a photopolymerization initiator, another filler, a polymer compound other than the polymer compound represented by Formula (1) or (2) and the alkali-soluble resin, a surfactant, an adhesion promoting agent, an antioxidant, an ultraviolet absorbent, and an aggregation inhibitor.

(Fluorine-Containing Organic Compound)

When a fluorine-containing organic compound is included, the liquid characteristics (particularly, fluidity) of a coating solution can be improved, and the uniformity of the coating thickness can be improved and the amount of the coating solution can be decreased. That is, since the surface tension between the substrate and the coating solution is lowered and the wettability on the substrate is improved, the coatability on the substrate is improved. Therefore, even when a thin film having a thickness of approximately a few micrometers is formed with a small amount of the solution, the fluorine-containing organic compound is effective in that a film having a uniform thickness with less thickness unevenness can be formed.

The fluorine content of the fluorine-containing organic compound is preferably from 3 to 40% by mass, more preferably from 5 to 30% by mass, and particularly preferably from 7 to 25% by mass. A fluorine content within the above-described range is effective in terms of the uniformity of the coating thickness and the effects in decreasing the amount of the solution, provides a favorable solubility in the composition.

Examples of the fluorine-containing organic compound include MEGAFAC F171, MEGAFAC F172, MEGAFAC F173, MEGAFAC F177, MEGAFAC F141, MEGAFAC F142, MEGAFAC F143, MEGAFAC F144, MEGAFAC R30, MEGAFAC F437 (manufactured by Dainippon Ink and Chemicals, Inc.), FLUORAD FC430, FLUORAD FC431, FLUORAD FC171 (manufactured by Sumitomo 3M, Ltd.), and SURFLON S-382, SURFLON SC-101, SURFLON SC-103, SURFLON SC-104, SURFLON SC-105, SURFLON SC1068, SURFLON SC-381, SURFLON SC-383, SURFLON 5393, SURFLON KH-40 (manufactured by Asahi Glass Co., Ltd.).

The fluorine-containing organic compound is particularly effective in, for example, preventing coating unevenness or thickness unevenness when the coating film formed by coating is made thin. The compound is also effective in slit coating, in which shortage of liquid supply easily occurs.

The amount of addition of the fluorine-containing organic compound is preferably 0.001 to 2.0% by mass, and more preferably 0.005 to 1.0% by mass, relative to the total mass of the pigment dispersion composition or photocurable composition.

(Thermal Polymerization Initiator)

It is also effective for the pigment dispersion composition or photocurable composition of the invention to include a thermal polymerization initiator. Examples of the thermal polymerization initiator include various azo compounds and peroxide compounds. The azo compounds may be azobis compounds, while examples of the peroxide compounds include ketone peroxide, peroxyketal, hydroperoxide, dialkyl peroxide, diacyl peroxide, peroxyester, and peroxydicarbonate.

(Surfactant)

The pigment dispersion composition or photocurable composition of the invention is constituted preferably using various surfactants from the viewpoint of improving the coating properties. Various nonionic, cationic and anionic surfactants may be used. Among them, fluorine-containing surfactants having a perfluoroalkyl group are preferred as the nonionic surfactants.

Specific examples of the fluorine-containing surfactant include the MEGAFAC (registered trademark) Series manufactured by Dainippon Ink and Chemicals, Inc., and the FLUORAD (registered trademark) Series manufactured by 3M Company.

Other than the above-described components, as specific examples of the additives for the pigment dispersion composition or photocurable composition, there may be mentioned fillers such as glass and alumina; alkali-soluble resins such as itaconic acid copolymers, crotonic acid copolymers, maleic acid copolymers, partially esterified maleic acid copolymers, acidic cellulose derivatives, a product obtained by addition of an acid anhydride to a polymer having a hydroxyl group, alcohol-soluble nylon, and a phenoxy resin formed from bisphenol A and epichlorohydrin; surfactants such as non-ionic, cationic and anionic surfactants, specifically, cationic surfactants such as phthalocyanine derivatives (commercially available product: EFKA-745 (manufactured by Morishita Chemical Industry Co., Ltd.)); organosiloxane polymer, KP341 (manufactured by Shin-Etsu Chemical Co., Ltd.), (meth)acrylic (co)polymers, POLYFLOW No. 75, No. 90, No. 95 (manufactured by Kyoeisha Chemical Co., Ltd.), and W001 (manufactured by Yusho Co., Ltd.);

as examples of other additives, nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters (PLURONIC L10, L31, L61, L62, 10R5, 17R2 and 25R2, TETRONIC 304, 701, 704, 901, 904 and 150R1; all manufactured by BASF SE); anionic surfactants such as W004, WOOS and W017 (Yusho Co., Ltd.); polymeric dispersants such as EFKA-46, EFKA-47, EFKA-47EA, EFKA POLYMER-100, EFKA POLYMER-400, EFKA POLYMER-401, EFKA POLYMER-450 (manufactured by Morishita Chemical Industry Co., Ltd.), DISPERSE AID 6, DISPERSE AID 8, DISPERSE AID 15, and DISPERSE AID 9100 (manufactured by San Nopco, Ltd.); various SOLSPERSE dispersants such as SOLSPERSE 3000, 5000, 9000, 12000, 13240, 13940, 17000, 24000, 26000 and 28000 (manufactured by Zeneca, PLC.); ADEKAPLURONIC L31, F38, L42, L44, L61, L64, F68, L72, P95, F77, P84, F87, P94, L101, P103, F108, L121, P-123 (manufactured by Asahi Denka Kogyo Co., Ltd.) and ISONET S-20 (manufactured by Sanyo Chemical Industries, Ltd.); ultraviolet absorbents such as 2-(3-t-butyl-5-methyl-2-hydroxyphenyl)-5-chlorobenzotriazole and alkoxybenzophenone; and aggregation inhibitors such as sodium polyacrylate.

Furthermore, in the case of attempting a further improvement of the developability of the photocurable composition by promoting the alkali solubility of the uncured portions, an organic carboxylic acid, preferably a low molecular weight organic carboxylic acid having a molecular weight of 1000 or less, may be added to the photocurable composition. Specific examples thereof include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemimellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydroatropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

(Thermal Polymerization Inhibitor)

According to the invention, in order to prevent unnecessary thermal polymerization of polymerizable compounds during the production or storage of the photocurable composition, it is desirable to add a small amount of thermal polymerization inhibitor.

Examples of the thermal polymerization inhibitor that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, and N-nitrosophenylhydroxyamine cerium(III) salt.

The amount of addition of the thermal polymerization inhibitor is preferably from about 0.01% by mass to about 5% by mass, relative to the mass of the total composition. Furthermore, if necessary, in order to prevent the inhibition of polymerization by oxygen, a higher fatty acid derivative such as behenic acid or behenic acid amide may be added and allowed to localize at the surface of the photosensitive layer during post-coating drying. The amount of addition of the higher fatty acid derivative is preferably from about 0.5% by mass to about 10% by mass of the total composition.

The photocurable composition of the invention may be prepared by adding an alkali-soluble resin, a photopolymerizable compound and a photopolymerization initiator (preferably, together with a solvent) to the aforementioned pigment dispersion composition of the invention, and incorporating additives such as surfactants thereto, according to necessity.

<Color Filter and Method for Production Thereof>

Next, the color filter of the invention and the method for production thereof will be described.

The color filter of the invention characteristically has a colored pattern which is formed, using the photocurable composition of the invention, on a support.

Hereinafter, the color filter of the invention will be described in detail with reference to the method for production thereof (method of the invention for producing a color filter).

The method for producing the color filter of the invention characteristically includes the processes of providing the photocurable composition of the invention on a substrate directly or with another layer interposed therebetween, to form a photosensitive film (hereinafter sometimes simply referred to as "photosensitive film forming process"); exposing the formed photosensitive film patternwise (exposing through a mask) (hereinafter sometimes simply referred to as "exposure process"); and developing the photosensitive film after exposure, to form a colored pattern (hereinafter sometimes simply referred to as "development process").

Hereinafter, each of the processes in the production method of the invention will be described.

(Photosensitive Film Forming Process)

In the photosensitive film forming process, the photocurable composition of the invention is applied (provided) directly on a substrate or on a substrate having another layer, to form a photosensitive film.

Examples of the substrate that can be used in the current process include soda glass, PYREX (registered trademark) glass, quartz glass and substrates each obtained by attaching a transparent conductive film to any of these materials, which are used in liquid crystal display devices and the like; photoelectric conversion element substrates that are used in image pick-up elements, such as silicon substrate; and complementary metal oxide semiconductors (CMOS). These substrates may have black stripes that separate the respective pixels.

Furthermore, on these substrates, an undercoat layer (another layer) may be provided, if necessary, for the purpose of improving the adhesion with upper layers, preventing material diffusion, or flattening the substrate surface.

As the method of applying the photocurable composition of the invention onto the substrate, various coating methods such as slit coating, an inkjet method, spin coating, flow coating, roll coating and a screen printing method may be applied.

The coating film thickness of the photocurable composition is preferably from 0.1 to 10 μm, more preferably from 0.2 to 5 μm, and even more preferably from 0.2 to 3 μm.

Drying (prebaking) of the photosensitive film applied onto the substrate may be performed at a temperature of 50° C. to 140° C. for 10 to 300 seconds with a hot plate, an oven or the like.

(Exposure Process)

In the exposure process, the photosensitive film formed in the photosensitive film forming process is exposed through a mask having a predetermined mask pattern. In other words, patternwise exposure is performed.

In the current process, when the photosensitive film, which is the coating film, is exposed to light through a predetermined mask pattern, only the irradiated portions of the coating film can be cured.

As the radiation that can be used at the time of exposure, in particular, ultraviolet rays such as g-ray and i-ray are preferably used. The irradiation dose is preferably from 5 to 1500 mJ/cm$^2$, more preferably from 10 to 1000 mJ/cm$^2$, and most preferably from 10 to 500 mJ/cm$^2$.

When the color filter of the invention is to be used in a liquid crystal display device, the irradiation dose is, within the above-mentioned range, preferably from 5 to 200 mJ/cm$^2$, more preferably from 10 to 150 mJ/cm$^2$, and most preferably from 10 to 100 mJ/cm$^2$. Also, if the color filter of the invention is for a use in solid state image pick-up elements, the irradiation dose is, within the above-mentioned range, preferably from 30 to 1500 mJ/cm$^2$, more preferably from 50 to 1000 mJ/cm$^2$, and most preferably from 80 to 500 mJ/cm$^2$.

(Development Process)

Subsequently, by performing the development treatment, the portions that have been unexposed in the exposure process dissolves out in the developer solution, and only the photocured portions remain. As the developer solution, any developer solution which dissolves the film of the photocurable composition at the unexposed portions but does not dissolve the cured portions may be used. Specifically, it is possible to use any of combinations of various organic solvents, or an alkaline aqueous solution.

The development temperature is usually from 20° C. to 30° C., and the development time is from 20 to 90 seconds.

Examples of the organic solvents include the solvents described above that can be used for preparing the pigment dispersion composition or photocurable composition of the invention.

As the alkaline aqueous solution, for example, it is preferable to use, as the developer solution, an alkaline aqueous solution prepared by diluting an alkaline compound such as sodium hydroxide, potassium hydroxide, sodium carbonate, sodium hydrogen carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5,4,0]-7-undecene, with pure water to a concentration of 0.001 to 10% by mass, preferably 0.01 to 1% by mass.

Additionally, when a developer solution formed by such an alkaline aqueous solution is used, washing (rinsing) with pure water is generally conducted after development.

After the development process, excess developer solution is removed by washing, followed by drying, and further followed by heat treatment (post-baking).

The post-baking is a post-development heat treatment for achieving thorough curing, and a thermal curing treatment, usually at 100° C. to 240° C., is performed. When the substrate is a glass substrate or a silicon substrate, the temperature is, within the above-described range, preferably from 200° C. to 240° C.

This post-baking treatment may be performed on the coating film after development in a continuous mode or batch mode, using a heating means such as a hot plate, a convection oven (hot air circulation type dryer) or a high frequency heater, such that the above-described condition is satisfied.

A color filter having desired colors is produced by repeating the above-described photosensitive film forming process, exposure process and development process (and optionally a heat treatment) for the number of times corresponding to the desired number of colors.

In the case of forming a film by providing the photocurable composition of the invention on a substrate, the thickness of the dried film is generally from 0.3 to 5.0 μm, preferably from 0.5 to 3.5 μm, and most desirably from 1.0 to 2.5 μm.

Examples of the substrate include alkali-free glass, soda glass, PYREX (registered trademark) glass, quartz glass and substrates each obtained by attaching a transparent conductive film on any of these materials, which are used in liquid crystal display devices; photoelectric conversion element substrates which are used in solid state image pick-up elements and the like, for example, silicon substrate; and plastic substrates. These substrates usually have black stripes for separating the respective pixels.

The plastic substrates each preferably have a gas barrier layer and/or a solvent resistant layer on a surface or surfaces thereof.

In the above description, use of the photocurable composition of the invention is described by describing mainly a use in pixels of a color filter. However, the photocurable composition may, of course, applied to a black matrix provided between pixels of a color filter. The black matrix may be formed by performing patternwise exposure and alkali development, and then performing post-baking to accelerate curing of the film, in the same manner as in the above-described method of producing pixels except for using a composition formed by adding a black colorant such as carbon black or titanium black as a colorant to the photocurable composition of the invention

EXAMPLES

Hereinafter, the present invention will be described more specifically by way of Examples, but the invention is not intended to be limited to the following Examples. Further, "%" and "parts" are on a mass basis unless mentioned otherwise.

Examples 1 to 57

In Examples 1 to 57, polymer compounds C-1 to C-57 of the invention were synthesized by the methods shown below.
<Synthesis of Mercaptan Compound Represented by Formula (3)>

As shown below, chain transfer agents B-1 to B-24 (aforementioned mercaptan compounds represented by Formula (3)) were synthesized.

Synthesis Example B-1

7.83 parts of dipentaerythritol hexakis(3-mercaptopropionate) [DPMP; manufactured by Sakai Chemical Industry Co., Ltd.], and 15.57 parts of a compound (A−1) shown below having an adsorptive moiety and a carbon-carbon double bond were dissolved in 93.60 parts of dimethylformamide, and the resulting solution was heated to 70° C. under a nitrogen stream. To this, 0.06 parts of 2,2'-azobis(2,4-dimethylvaleronitrile) [V-65, manufactured by Wako Pure Chemical Industries, Ltd.] was added, and the mixture was heated for 3 hours. 0.06 parts of V-65 was further added, and the resulting mixture was allowed to react at 70° C. for 3 hours under a nitrogen stream. The reaction mixture was cooled to room temperature, thereby providing a 20% solution of the mercaptan compound according to the invention (chain transfer agent B-1) shown below.

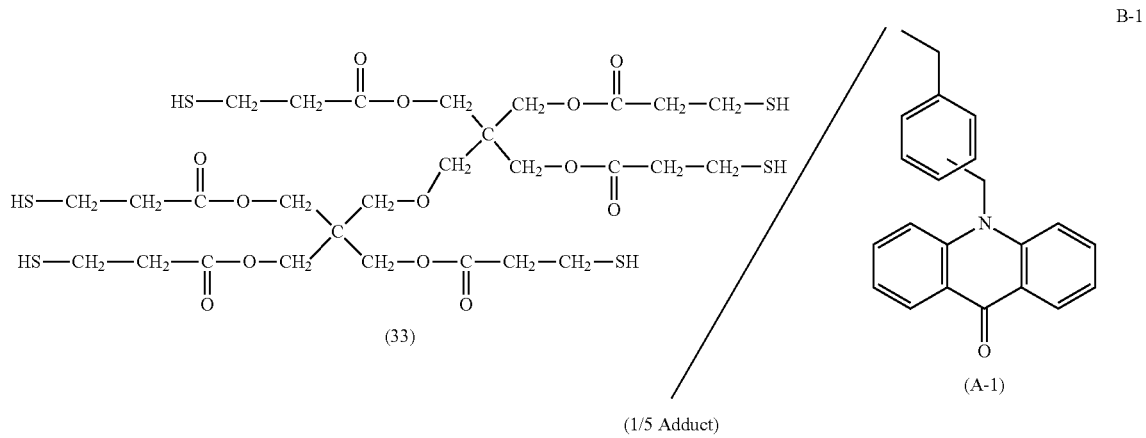

Synthesis Example B-2

A 20% solution of the mercaptan compound according to the invention (chain transfer agent B-2) shown below was obtained in the same manner as in the Synthesis Example B-1, except that 15.57 parts of the compound (A−1) having an adsorptive moiety and a carbon-carbon double bond and 93.60 parts of dimethylformamide in the Synthesis Example B-1 were changed to 11.76 parts of a compound (A-2) having an adsorptive moiety and a carbon-carbon double bond and 78.38 parts of dimethylformamide.

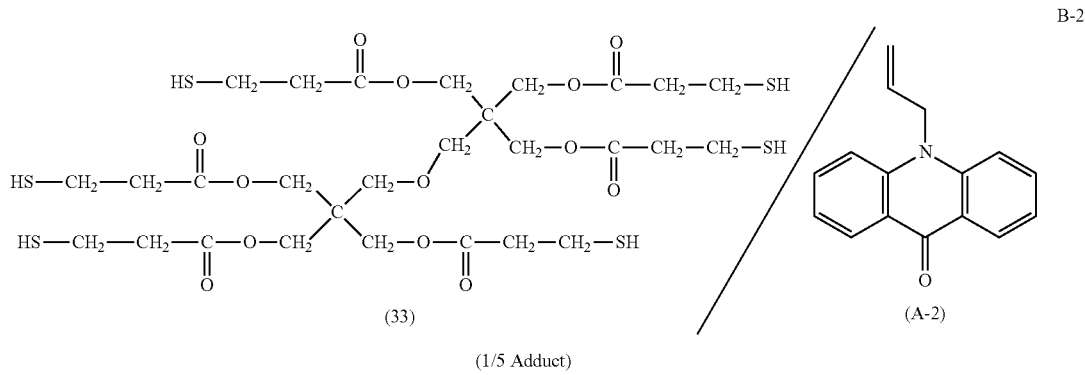

Synthesis Example B-3

A 20% solution of the mercaptan compound according to the invention (chain transfer agent B-3) shown below was obtained in the same manner as in the Synthesis Example B-1, except that 15.57 parts of the compound (A-1) having an adsorptive moiety and a carbon-carbon double bond and 93.60 parts of dimethylformamide in the Synthesis Example B-1 were changed to 14.61 parts of a compound (A-3) having an adsorptive moiety and a carbon-carbon double bond and 89.78 parts of dimethylformamide.

Synthesis Example B-5

A 20% solution of the mercaptan compound according to the invention (chain transfer agent B-5) shown below was obtained in the same manner as in the Synthesis Example B-1, except that 15.57 parts of the compound (A-1) having an adsorptive moiety and a carbon-carbon double bond and 93.60 parts of dimethylformamide in the Synthesis Example B-1 were changed to 14.67 parts of a compound (A-5) having an adsorptive moiety and a carbon-carbon double bond and 89.99 parts of dimethylformamide.

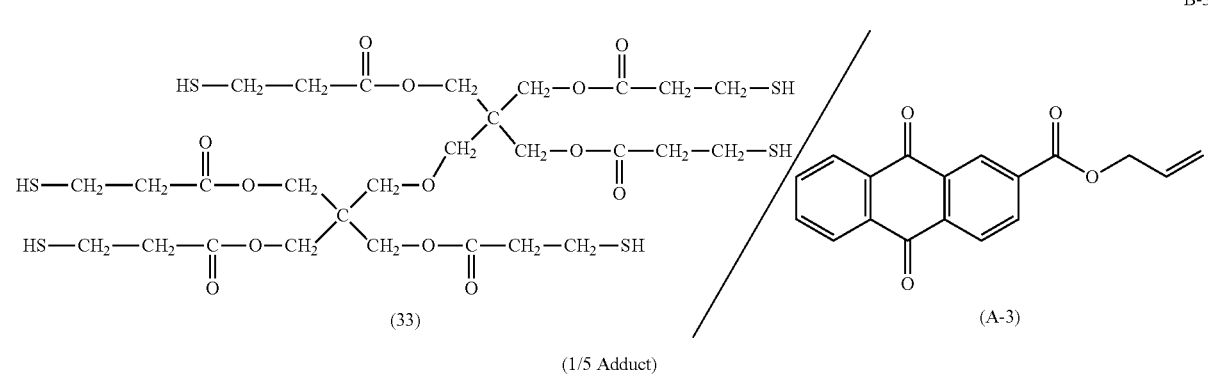

Synthesis Example B-4

A 20% solution of the mercaptan compound according to the invention (chain transfer agent B-4) shown below was obtained in the same manner as in the Synthesis Example B-1, except that 15.57 parts of the compound (A-1) having an adsorptive moiety and a carbon-carbon double bond and 93.60 parts of dimethylformamide in the Synthesis Example B-1 were changed to 17.52 parts of a compound (A-4) having an adsorptive moiety and a carbon-carbon double bond and 101.4 parts of dimethylformamide.

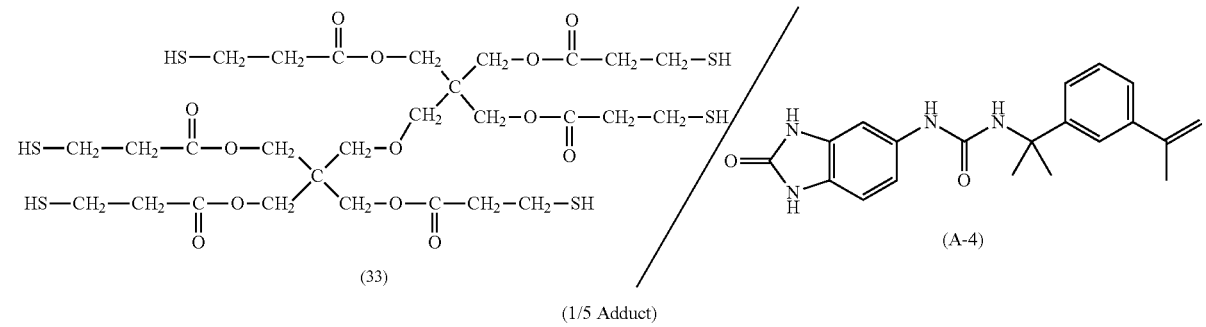

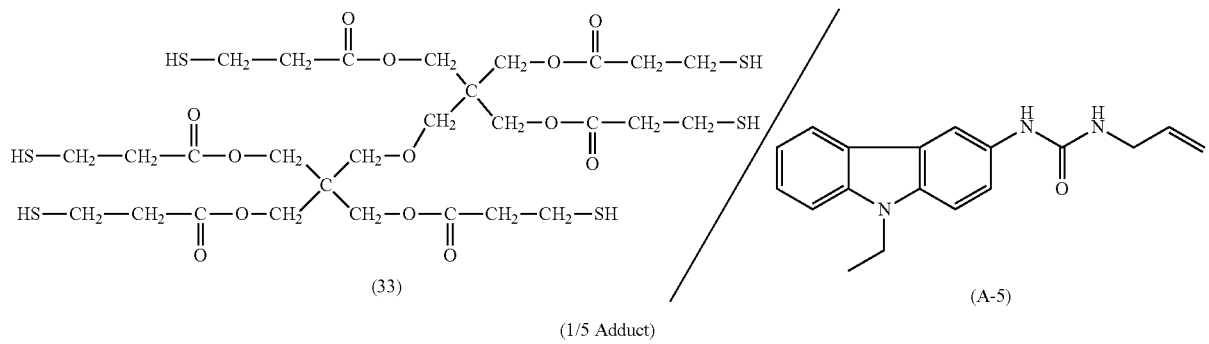

Synthesis Example B-6

A 30% solution of the mercaptan compound according to the invention (chain transfer agent B-6) shown below was obtained in the same manner as in the Synthesis Example B-1, except that 15.57 parts of the compound (A-1) having an adsorptive moiety and a carbon-carbon double bond and 93.60 parts of dimethylformamide in the Synthesis Example B-1 were changed to 9.66 parts of a compound (A-6) having an adsorptive moiety and a carbon-carbon double bond and 40.82 parts of dimethylformamide.

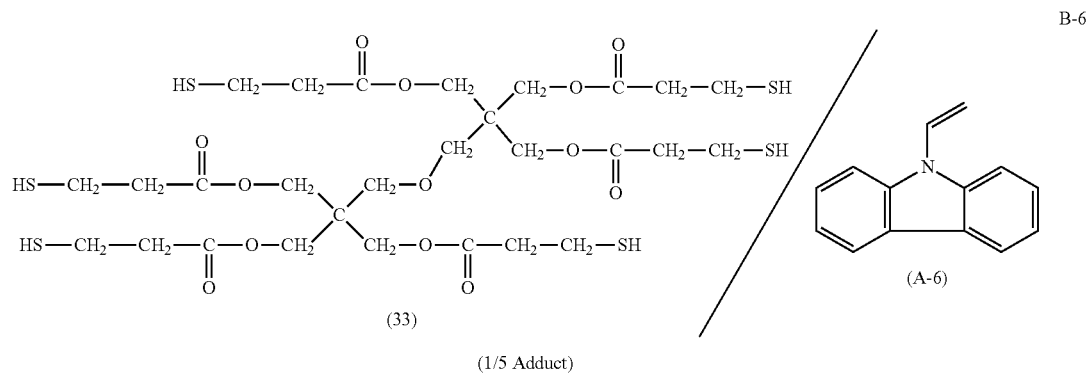

Synthesis Example B-7

A 30% solution of the mercaptan compound according to the invention (chain transfer agent B-7) shown below was obtained in the same manner as in the Synthesis Example B-1, except that 15.57 parts of the compound (A-1) having an adsorptive moiety and a carbon-carbon double bond and 93.60 parts of dimethylformamide in the Synthesis Example B-1 were changed to 10.06 parts of a compound (A-7) having an adsorptive moiety and a carbon-carbon double bond and 41.75 parts of 1-methoxy-2-propanol.

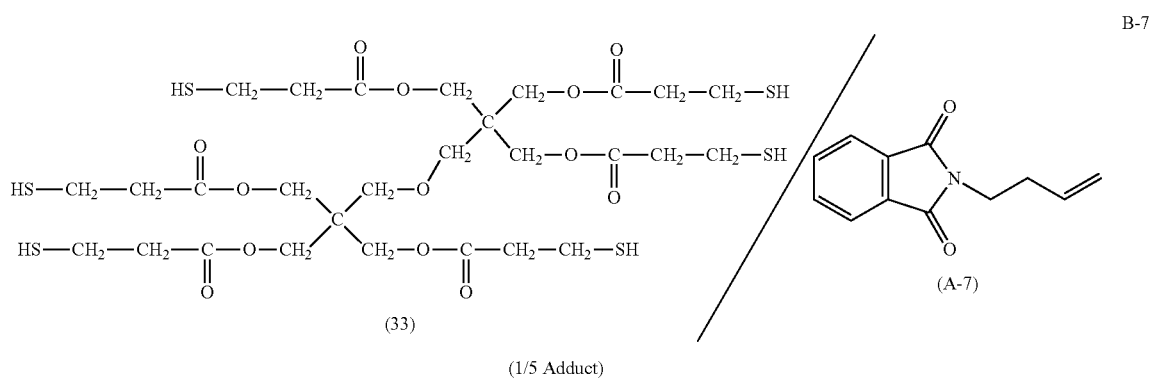

Synthesis Example B-8

A 30% solution of the mercaptan compound according to the invention (chain transfer agent B-8) shown below was obtained in the same manner as in the Synthesis Example B-1, except that 15.57 parts of the compound (A–1) having an adsorptive moiety and a carbon-carbon double bond and 93.60 parts of dimethylformamide in the Synthesis Example B-1 were changed to 7.01 parts of a compound (A-8) having an adsorptive moiety and a carbon-carbon double bond and 34.62 parts of 1-methoxy-2-propanol.

Synthesis Example B-10

A 30% solution of the mercaptan compound according to the invention (chain transfer agent B-10) shown below was obtained in the same manner as in the Synthesis Example B-1, except that 15.57 parts of the compound (A–1) having an adsorptive moiety and a carbon-carbon double bond and 93.60 parts of dimethylformamide in the Synthesis Example B-1 were changed to 12.44 parts of a compound (A-10) having an adsorptive moiety and a carbon-carbon double bond and 47.30 parts of 1-methoxy-2-propanol.

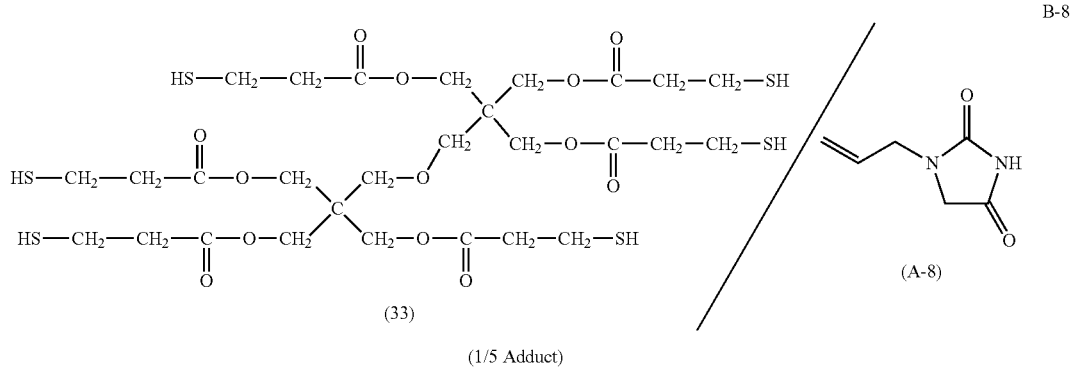

Synthesis Example B-9

A 30% solution of the mercaptan compound according to the invention (chain transfer agent B-9) shown below was obtained in the same manner as in the Synthesis Example B-1, except that 15.57 parts of the compound (A–1) having an adsorptive moiety and a carbon-carbon double bond and 93.60 parts of dimethylformamide in the Synthesis Example B-1 were changed to 4.85 parts of a compound (A-9) having an adsorptive moiety and a carbon-carbon double bond and 29.60 parts of 1-methoxy-2-propanol.

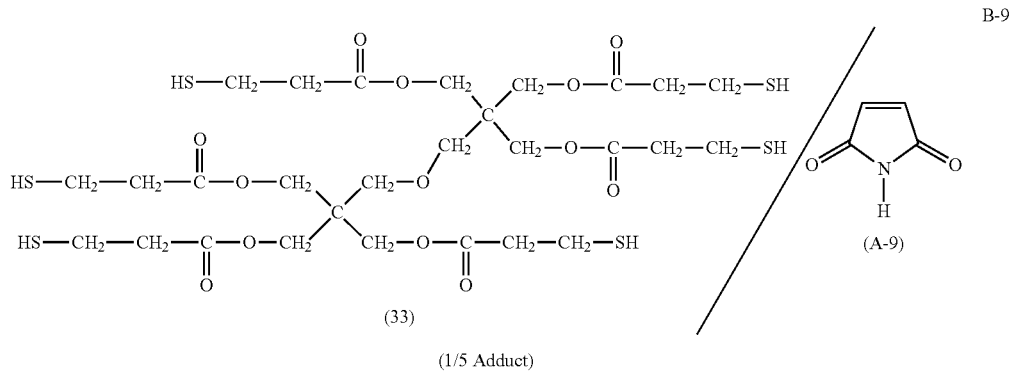

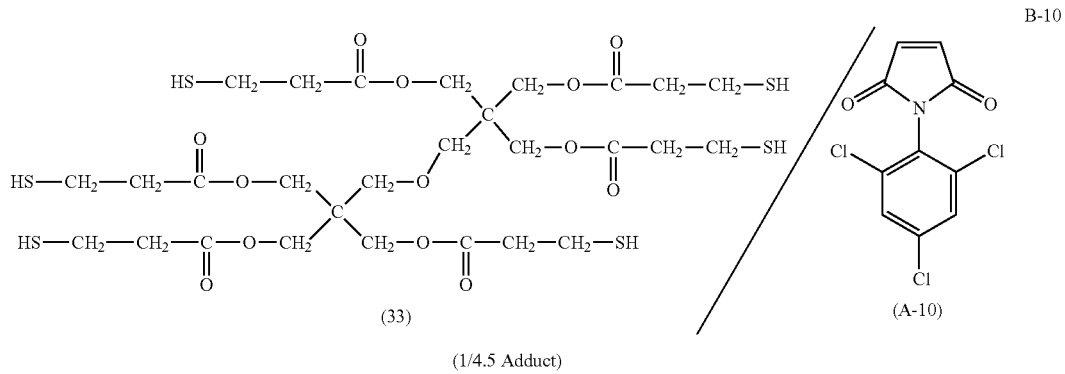

Synthesis Example B-11

4.89 parts of pentaerythritol tetrakis(3-mercaptopropionate) [PEMP; manufactured by Sakai Chemical Industry Co., Ltd.] and 15.19 parts of a compound (A-11) shown below having an adsorptive moiety and a carbon-carbon double bond were dissolved in 80.32 parts of dimethylformamide, and the resulting solution was heated to 70° C. under a nitrogen stream. To this, 0.04 parts of 2,2'-azobis(2,4-dimethylvaleronitrile) [V-65, manufactured by Wako Pure Chemical Industries, Ltd.] was added, and the mixture was heated for 3 hours. 0.04 parts of V-65 was further added, and the resulting mixture was allowed to react at 70° C. for 3 hours under a nitrogen stream. The reaction mixture was cooled to room temperature, thereby providing a 20% solution of the mercaptan compound according to the invention (chain transfer agent B-11) shown below.

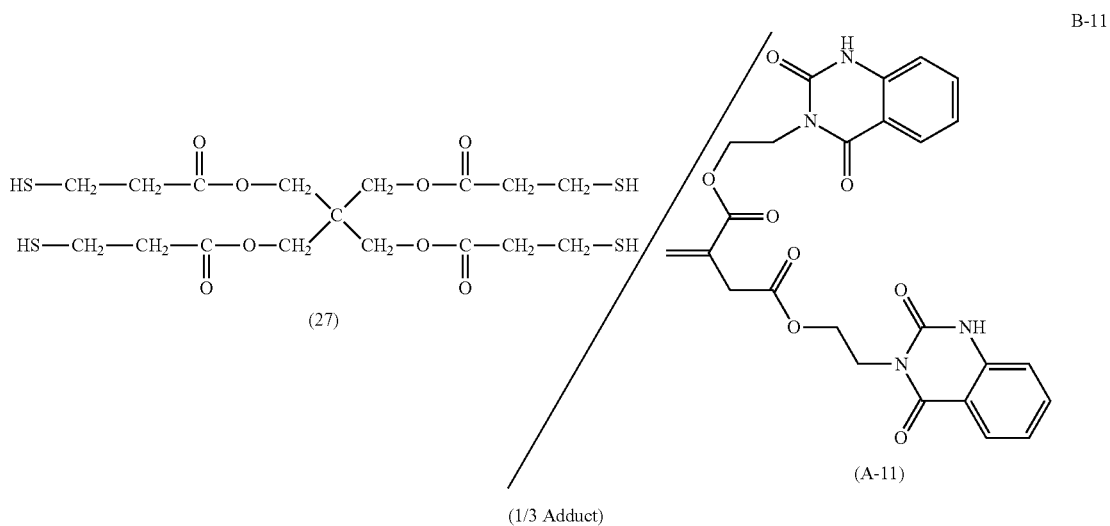

Synthesis Example B-12

A 20% solution of the mercaptan compound according to the invention (chain transfer agent B-12) shown below was obtained in the same manner as in the Synthesis Example B-11, except that 15.19 parts of the compound (A-11) having an adsorptive moiety and a carbon-carbon double bond and 80.32 parts of dimethylformamide in the Synthesis Example B-11 were changed to 14.41 parts of a compound (A-12) having an adsorptive moiety and a carbon-carbon double bond and 77.20 parts of dimethylformamide.

Synthesis Example B-14

A 30% solution of the mercaptan compound according to the invention (chain transfer agent B-14) shown below was obtained in the same manner as in the Synthesis Example B-1, except that 15.57 parts of the compound (A–1) having an adsorptive moiety and a carbon-carbon double bond and 93.60 parts of dimethylformamide in the Synthesis Example B-1 were changed to 4.71 parts of a compound (A-14) having an adsorptive moiety and a carbon-carbon double bond and 29.25 parts of 1-methoxy-2-propanol.

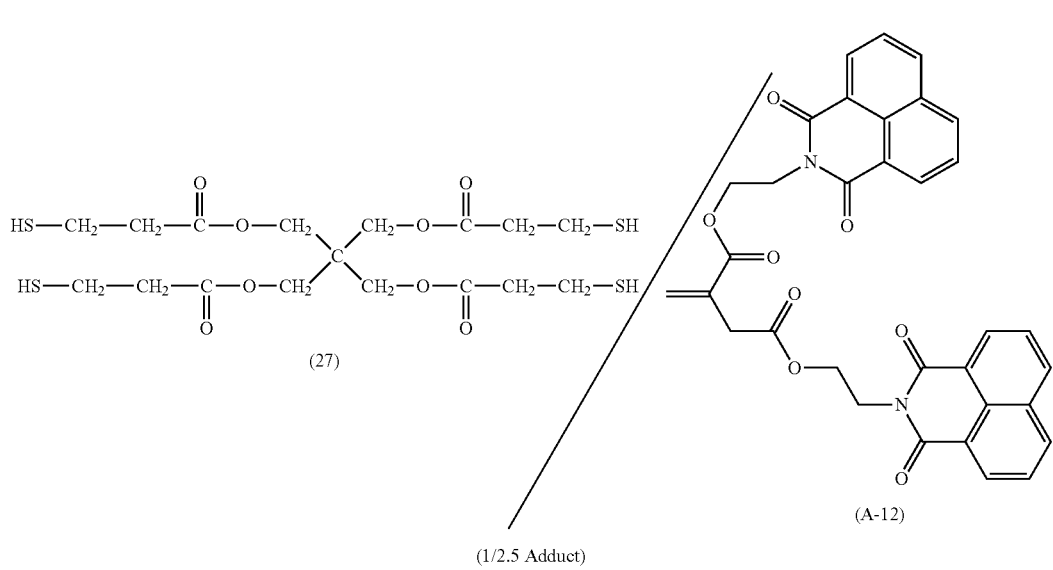

Synthesis Example B-13

A 30% solution of the mercaptan compound according to the invention (chain transfer agent B-13) shown below was obtained in the same manner as in the Synthesis Example B-1, except that 15.57 parts of the compound (A–1) having an adsorptive moiety and a carbon-carbon double bond and 93.60 parts of dimethylformamide in the Synthesis Example B-1 were changed to 5.26 parts of a compound (A-13) having an adsorptive moiety and a carbon-carbon double bond and 30.54 parts of 1-methoxy-2-propanol.

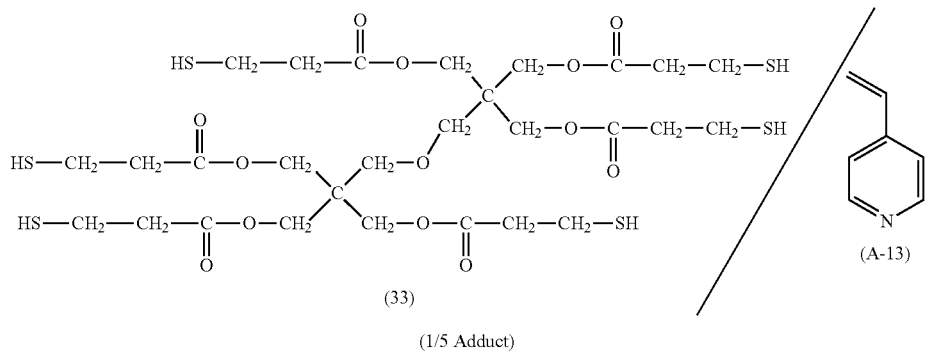

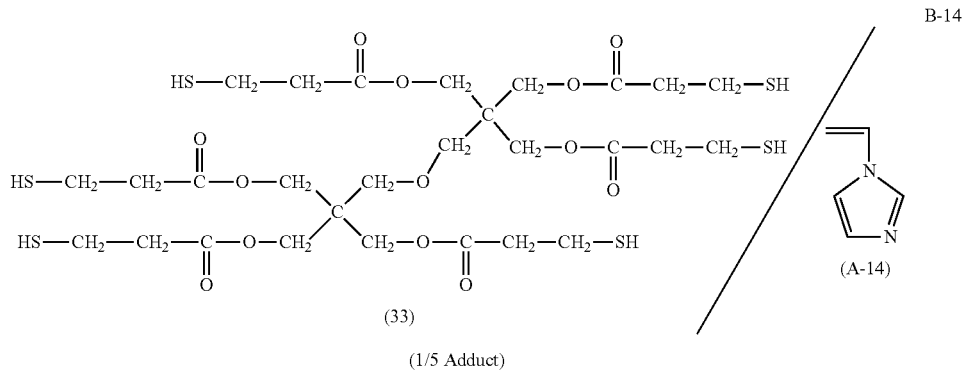

Synthesis Example B-15

7.83 parts of dipentaerythritol hexakis(3-mercaptopropionate) [DPMP; manufactured by Sakai Chemical Industry Co., Ltd.], and 6.51 parts of a compound having an adsorptive moiety and a carbon-carbon double bond (A-15) shown below were dissolved in 33.45 parts of 1-methoxy-2-propanol, and the resulting solution was heated to 70° C. under a nitrogen stream. To this, 0.06 parts of 2,2'-azobis(2,4-dimethylvaleronitrile) [V-65, manufactured by Wako Pure Chemical Industries, Ltd.] was added, and the mixture was heated for 3 hours. 0.06 parts of V-65 was further added, and the resulting mixture was allowed to react at 70° C. for 3 hours under a nitrogen stream. The reaction mixture was cooled to room temperature, to thus obtain a 30% solution of the mercaptan compound according to the invention (chain transfer agent B-15) shown below.

Synthesis Example B-16

A 30% solution of the mercaptan compound according to the invention (chain transfer agent B-16) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 5.80 parts of the compound (A-16) shown below having an adsorptive moiety and a carbon-carbon double bond and 31.81 parts of 1-methoxy-2-propanol.

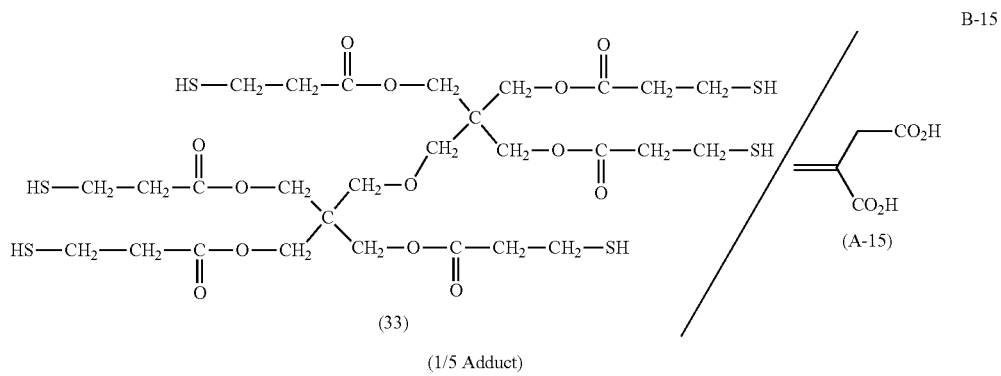

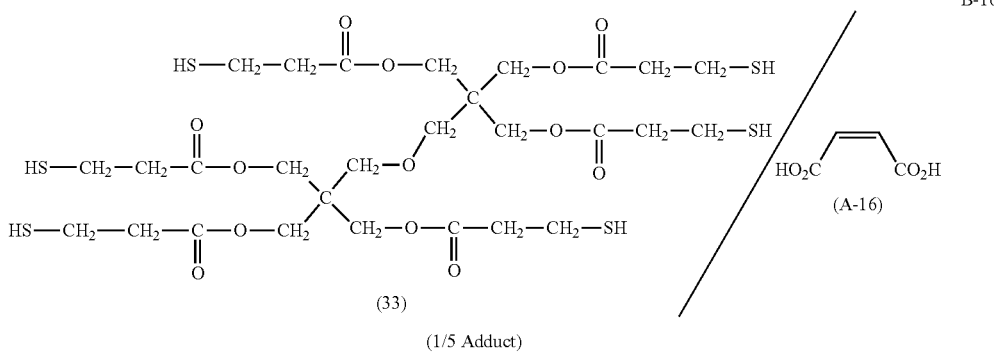

Synthesis Example B-17

A 30% solution of the mercaptan compound according to the invention (chain transfer agent B-17) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 12.46 parts of the compound (A-17) shown below having an adsorptive moiety and a carbon-carbon double bond and 47.35 parts of dimethylformamide.

Synthesis Example B-18

A 30% solution of the mercaptan compound according to the invention (chain transfer agent B-18) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 10.46 parts of the compound (A-18) shown below having an adsorptive moiety and a carbon-carbon double bond and 42.67 parts of dimethylformamide.

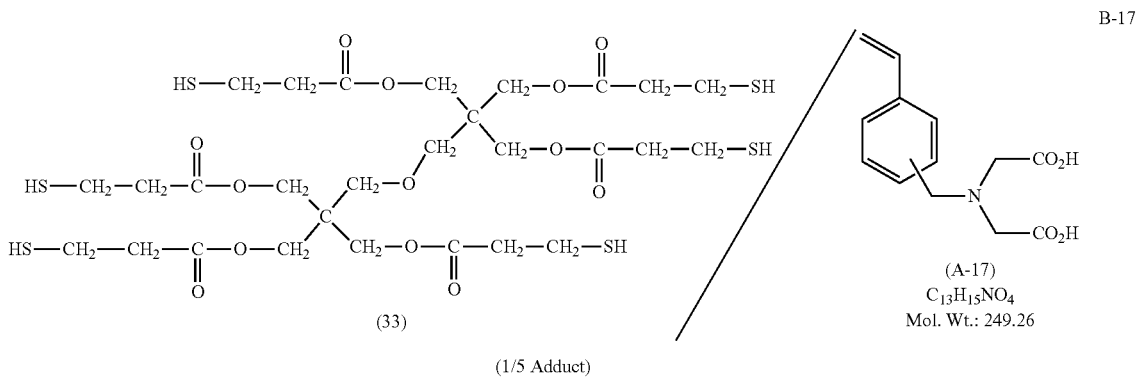

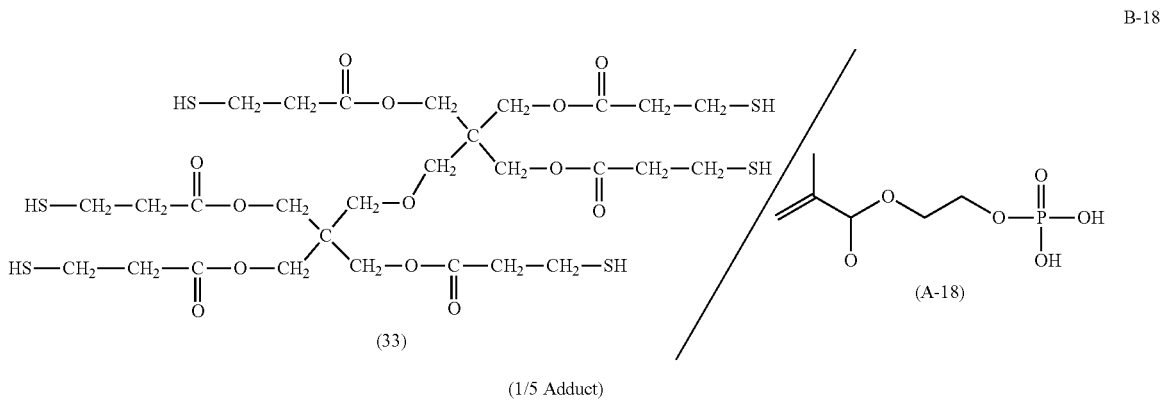

Synthesis Example B-19

A 30% solution of the mercaptan compound according to the invention (chain transfer agent B-19) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 10.36 parts of the compound (A-19) shown below having an adsorptive moiety and a carbon-carbon double bond and 42.45 parts of dimethylformamide.

Synthesis Example B-21

A 30% solution of the mercaptan compound according to the invention (chain transfer agent B-21) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 8.51 parts of the compound (A-21) shown below having an adsorptive moiety and a carbon-carbon double bond and 38.13 parts of 1-methoxy-2-propanol.

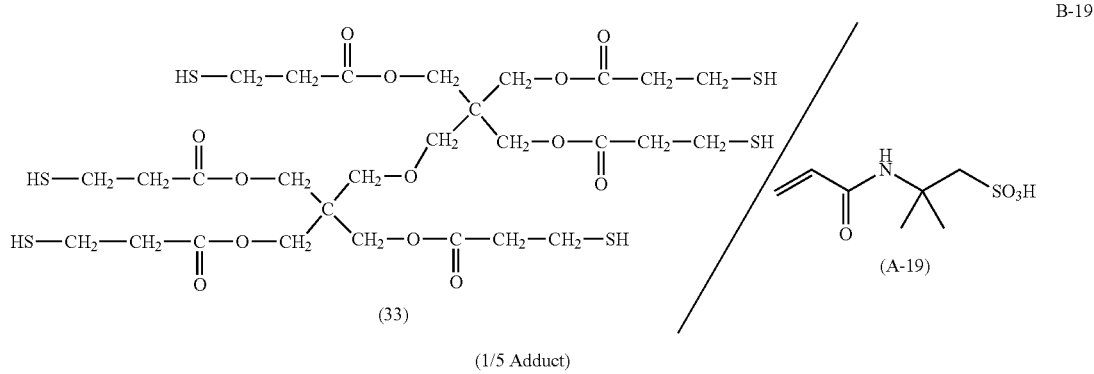

Synthesis Example B-20

A 30% solution of the mercaptan compound according to the invention (chain transfer agent B-20) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 7.86 parts of the compound (A-20) shown below having an adsorptive moiety and a carbon-carbon double bond and 36.61 parts of 1-methoxy-2-propanol.

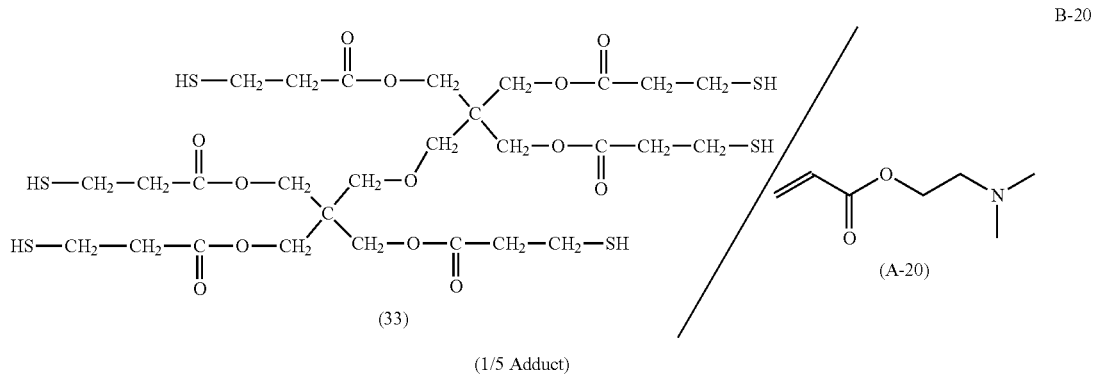

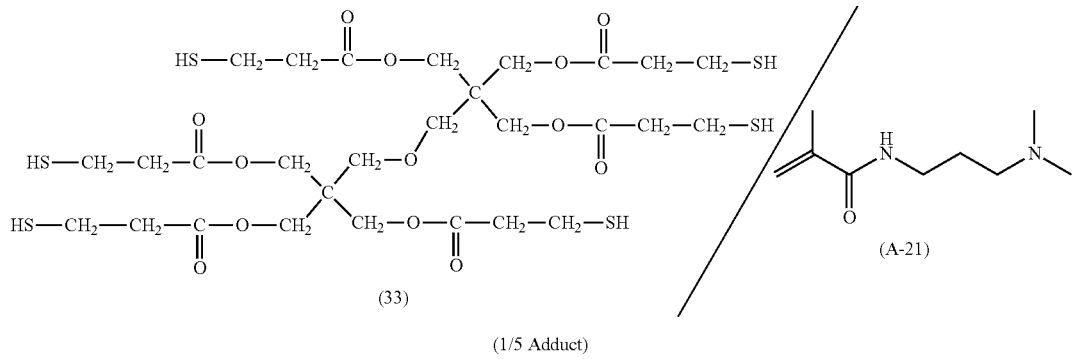

B-21

(1/5 Adduct)

Synthesis Example B-22

A 30% solution of the mercaptan compound according to the invention (chain transfer agent B-22) shown below was obtained in the same manner as in the Synthesis Example B-15, except that 6.51 parts of the compound (A-15) having an adsorptive moiety and a carbon-carbon double bond and 33.45 parts of 1-methoxy-2-propanol in the Synthesis Example B-15 were changed to 11.72 parts of the compound (A-22) shown below having an adsorptive moiety and a carbon-carbon double bond and 45.61 parts of 1-methoxy-2-propanol.

adsorptive moiety and a carbon-carbon double bond were dissolved in 20.51 parts of 1-methoxy-2-propanol, and the resulting solution was heated to 70° C. under a nitrogen stream. To this, 0.04 parts of 2,2'-azobis(2,4-dimethylvaleronitrile) [V-65, manufactured by Wako Pure Chemical Industries, Ltd.] was added, and the mixture was heated for 3 hours. 0.04 parts of V-65 was further added, and the resulting mixture was allowed to react at 70° C. for 3 hours under a nitrogen stream. The reaction mixture was cooled to room temperature, to thus obtain a 30% solution of the mercaptan compound according to the invention (chain transfer agent B-23) shown below.

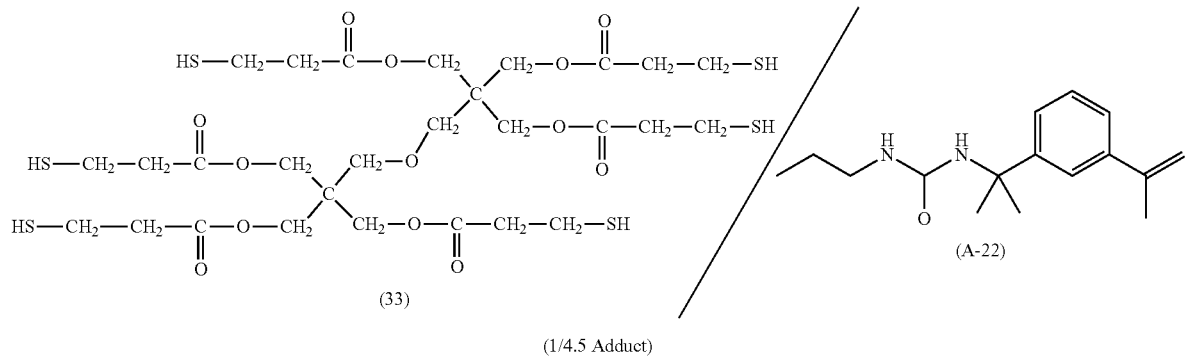

B-22

(1/4.5 Adduct)

Synthesis Example B-23

4.89 parts of pentaerythritol tetrakis(3-mercaptopropionate) [PEMP; manufactured by Sakai Chemical Industry Co., Ltd.], and 3.90 parts of a compound (A-15) having an

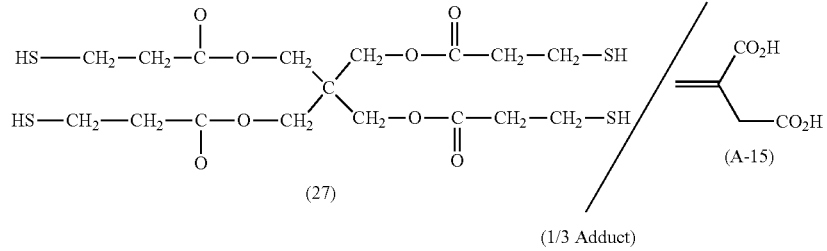

B-23

(1/3 Adduct)

Synthesis Example B-24

7.83 parts of dipentaerythritol hexakis(3-mercaptopropionate) [DPMP; manufactured by Sakai Chemical Industry Co., Ltd.], and 4.55 parts of a compound (A-15) having an adsorptive moiety and a carbon-carbon double bond were dissolved in 28.90 parts of 1-methoxy-2-propanol, and the resulting solution was heated to 70° C. under a nitrogen stream. To this, 0.04 parts of 2,2'-azobis(2,4-dimethylvaleronitrile) [V-65, manufactured by. Wako Pure Chemical Industries, Ltd.] was added, and the mixture was heated for 3 hours. 0.04 parts of V-65 was further added, and the resulting mixture was allowed to react at 70° C. for 3 hours under a nitrogen stream. The reaction mixture was cooled to room temperature, to thus obtain a 30% solution of the mercaptan compound according to the invention (chain transfer agent B-24) shown below.

and 20 parts of methyl methacrylate (MMA; monomer) was heated to 80° C. under a nitrogen stream. To this, 0.013 parts of 2,2'-azobis(isobutyronitrile) [AIBN, manufactured by Wako Pure Chemical Industries, Ltd.] was added, and the mixture was heated for 3 hours. Then, 0.013 parts of AIBN was further added, and the resulting mixture was allowed to react at 80° C. for 3 hours under a nitrogen stream. Subsequently, the reaction mixture was cooled to room temperature, and diluted with acetone. Re-precipitation using a large amount of methanol was conducted, followed by vacuum drying, thereby providing 19 parts of a solid of the polymer compound of the invention (C-1; polystyrene-equivalent weight average molecular weight: 14000) shown below.

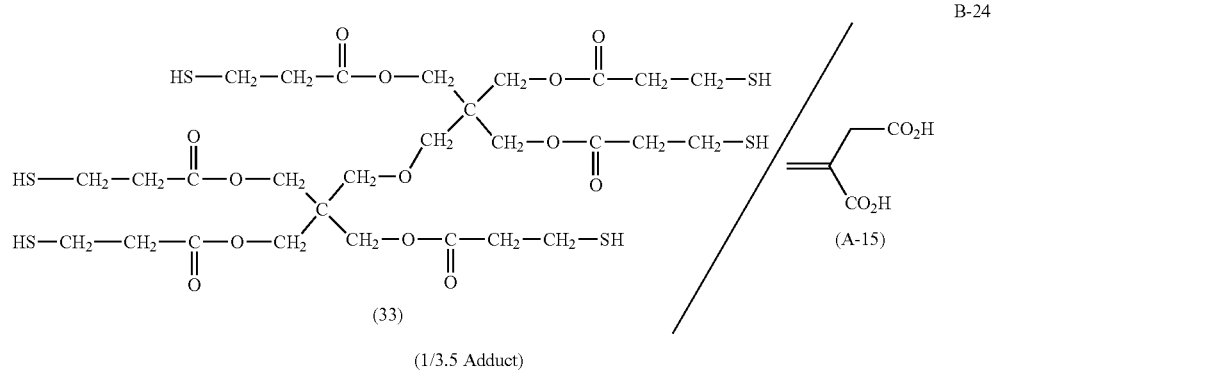

<Synthesis of Polymer Compound>

Subsequently, polymer compounds C-1 to C57 of the invention were synthesized as described below.

Synthesis Example C-1

A mixed solution of 46.80 parts of the 20% solution of the chain transfer agent B-1 obtained in Synthesis Example B-1

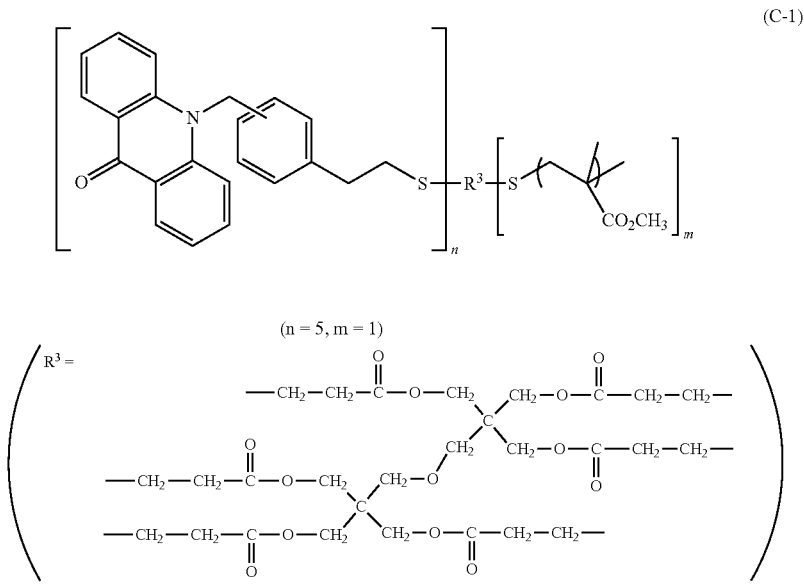

Synthesis Example C-2

23 parts of a solid of the polymer compound of the invention (C-2; polystyrene-equivalent weight average molecular weight: 30000) shown below was obtained in the same manner as in the Synthesis Example C-1, except that the amount of the 20% solution of chain transfer agent B-1 was changed from 46.80 parts to 23.40 parts and the amount of AIBN was changed from 0.013 parts to 0.007 parts.

Synthesis Example C-3

20 parts of a solid of the polymer compound of the invention (C-3; polystyrene-equivalent weight average molecular weight: 15000) shown below was obtained in the same manner as in the Synthesis Example C-1, except that 20 parts of methyl methacrylate in the Synthesis Example C-1 was changed to 19.5 parts of butyl methacrylate and 8.5 parts of 2-hydroxyethyl methacrylate.

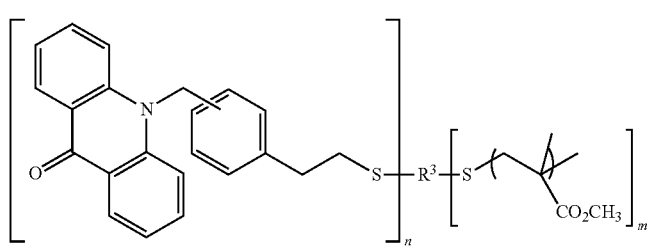

(C-2)

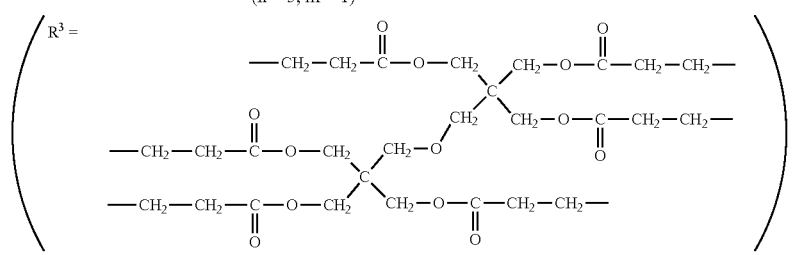

(n = 5, m = 1)

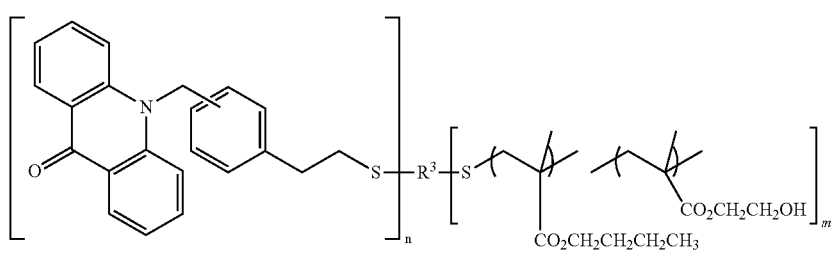

(C-3)

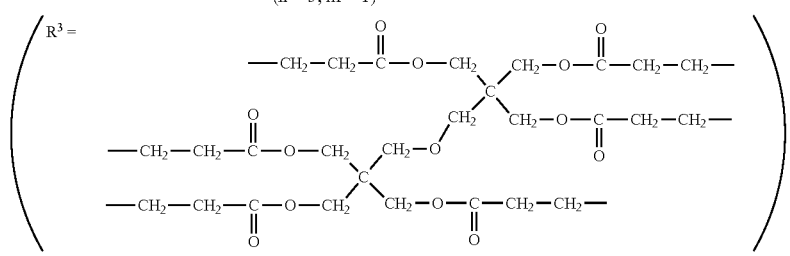

(n = 5, m = 1)

Synthesis Example C-4 to C-32

Furthermore, polymer compounds C-4 to C-32 of the invention were obtained in the same manner as in Synthesis Example C-1, except that the types and amounts of the chain transfer agent and monomer, the amount of AIBN, and the re-precipitation method were changed as indicated in the following Table 1 and Table 2.

TABLE 1

| Synthesis Example | Chain transfer agent | Monomer | AIBN | Re-precipitation method | Weight average molecular weight | Yield of polymer compound |
| --- | --- | --- | --- | --- | --- | --- |
| C-4 | 23.40 parts of B-1 solution | MMA 18 parts, MAA 2 parts | 0.007 parts | Re-precipitation with methanol/water (1/1) | 32000 | 18 parts |
| C-5 | 39.19 parts of B-2 solution | MMA 20 parts | 0.013 parts | Re-precipitation with methanol | 13000 | 21 parts |
| C-6 | 19.59 parts of B-2 solution | BMA 19.5 parts, HEMA 8.5 parts | 0.007 parts | Re-precipitation with methanol | 29000 | 22 parts |
| C-7 | 44.89 parts of B-3 solution | MMA 20 parts | 0.013 parts | Re-precipitation with methanol | 15000 | 24 parts |
| C-8 | 22.45 parts of B-3 solution | MMA 20 parts | 0.007 parts | Re-precipitation with methanol | 30000 | 22 parts |
| C-9 | 22.45 parts of B-3 solution | MMA 19 parts, MAA 1 parts | 0.007 parts | Re-precipitation with methanol/water (1/1) | 31000 | 21 parts |
| C-10 | 50.7 parts of B-4 solution | BMA 19.5 parts, HEMA 8.5 parts | 0.013 parts | Re-precipitation with methanol | 14000 | 25 parts |
| C-11 | 25.35 parts of B-4 solution | BMA 19.5 parts, HEMA 8.5 parts | 0.007 parts | Re-precipitation with methanol | 28000 | 22 parts |
| C-12 | 45.00 parts of B-5 solution | MMA 20 parts | 0.013 parts | Re-precipitation with methanol | 14000 | 26 parts |
| C-13 | 22.50 parts of B-5 solution | MMA 20 parts | 0.007 parts | Re-precipitation with methanol | 29000 | 22 parts |
| C-14 | 23.32 parts of B-6 solution | MMA 20 parts | 0.013 parts | Re-precipitation with methanol | 16000 | 23 parts |
| C-15 | 11.66 parts of B-6 solution | BMA 19.5 parts, HEMA 8.5 parts | 0.007 parts | Re-precipitation with methanol | 31000 | 21 parts |
| C-16 | 23.86 parts of B-7 solution | MMA 20 parts | 0.013 parts | Re-precipitation with methanol | 15000 | 23 parts |
| C-17 | 23.86 parts of B-7 solution | BMA 19.5 parts, HEMA 8.5 parts | 0.013 parts | Re-precipitation with methanol | 16000 | 22 parts |
| C-18 | 11.93 parts of B-7 solution | MMA 18 parts, MAA 2 parts | 0.007 parts | Re-precipitation with methanol/water (1/1) | 30000 | 20 parts |
| C-19 | 19.78 parts of B-8 solution | MMA 20 parts | 0.013 parts | Re-precipitation with methanol | 16000 | 23 parts |
| C-20 | 19.78 parts of B-8 solution | BMA 19.5 parts HEMA 8.5 parts | 0.013 parts | Re-precipitation with methanol | 14000 | 23 parts |

MMA—Methyl methacrylate
MAA—Methacrylic acid
BMA—n-Butyl methacrylate
HEMA—2-Hydroxyethyl methacrylate

TABLE 2

| Synthesis Example | Chain transfer agent | Monomer | AIBN | Re-precipitation method | Weight average molecular weight | Yield of polymer compound |
| --- | --- | --- | --- | --- | --- | --- |
| C-21 | 16.91 parts of B-9 solution | MMA 20 parts | 0.013 parts | Re-precipitation with methanol | 15000 | 22 parts |
| C-22 | 16.91 parts of B-9 solution | BMA 19.5 parts, HEMA 8.5 parts | 0.013 parts | Re-precipitation with methanol | 16000 | 22 parts |
| C-23 | 9.01 parts of B-10 solution | MMA 20 parts | 0.007 parts | Re-precipitation with methanol | 29000 | 19 parts |
| C-24 | 9.01 parts of B-10 solution | BMA 19.5 parts, HEMA 8.5 parts | 0.007 parts | Re-precipitation with methanol | 30000 | 19 parts |
| C-25 | 20.08 parts of B-11 solution | MMA 20 parts | 0.007 parts | Re-precipitation with methanol | 28000 | 21 parts |
| C-26 | 12.87 parts of B-12 solution | BMA 19.5 parts, HEMA 8.5 parts | 0.007 parts | Re-precipitation with methanol | 29000 | 20 parts |
| C-27 | 17.45 parts of B-13 solution | BMA 19.5 parts, HEMA 8.5parts | 0.013 parts | Re-precipitation with methanol | 14000 | 17 parts |
| C-28 | 8.73 parts of B-13 solution | MMA 20 parts | 0.007 parts | Re-precipitation with methanol | 24000 | 15 parts |
| C-29 | 8.73 parts of B-13 solution | MMA 19 parts, MAA 1 part | 0.007 parts | Re-precipitation with methanol/water (1/1) | 26000 | 16 parts |
| C-30 | 16.71 parts of B-14 solution | MMA 20 parts | 0.013 parts | Re-precipitation with methanol | 15000 | 17 parts |

TABLE 2-continued

| Synthesis Example | Chain transfer agent | Monomer | AIBN | Re-precipitation method | Weight average molecular weight | Yield of polymer compound |
|---|---|---|---|---|---|---|
| C-31 | 8.36 parts of B-14 solution | MMA 20 parts | 0.007 parts | Re-precipitation with methanol | 31000 | 18 parts |
| C-32 | 8.36 parts of B-14 solution | MMA 18 parts, MAA 2 parts | 0.007 parts | Re-precipitation with methanol/water (1/1) | 32000 | 18 parts |

MMA—Methyl methacrylate
MAA—Methacrylic acid
BMA—n-Butyl methacrylate
HEMA—2-Hydroxyethyl methacrylate In the following, the structures of the synthesized polymer compounds are shown. The indications such as (C-4) refer to the numbers of Synthesis Examples in the above Tables 1 and 2.

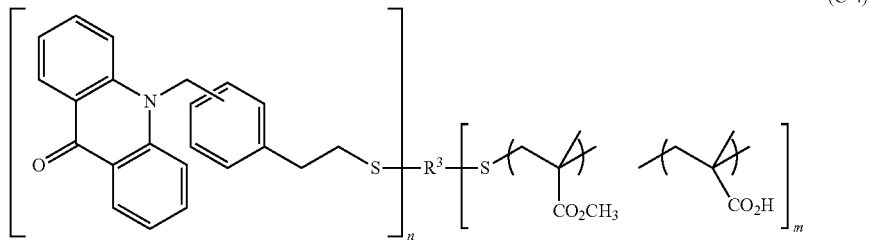

(C-4)

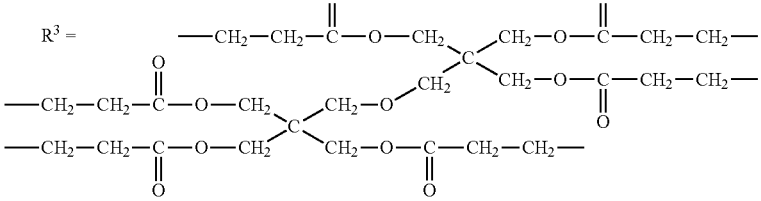

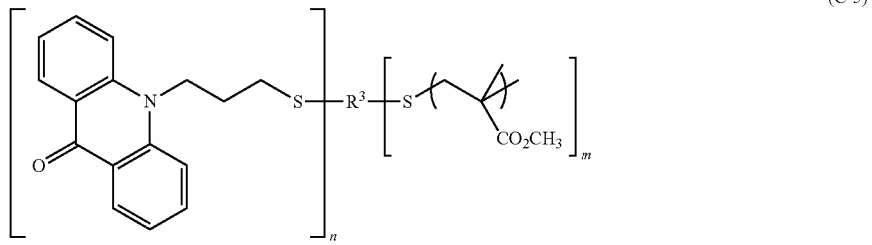

(C-5)

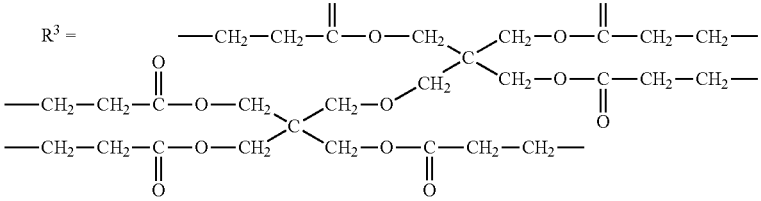

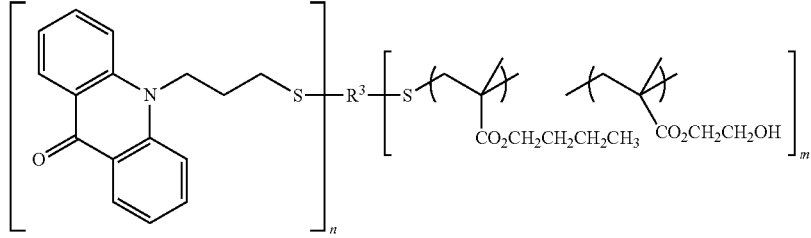

(C-6)

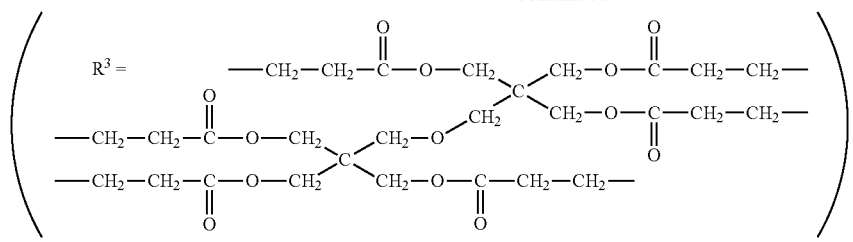
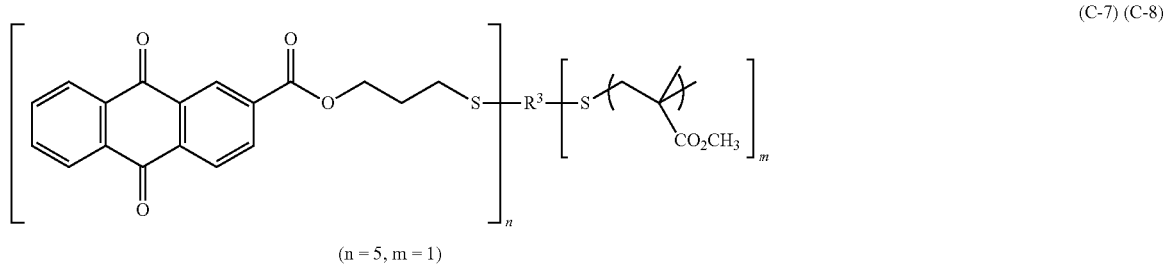
(n = 5, m = 1)
(C-7) (C-8)
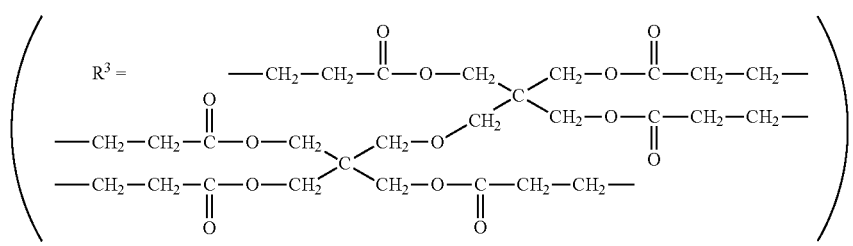
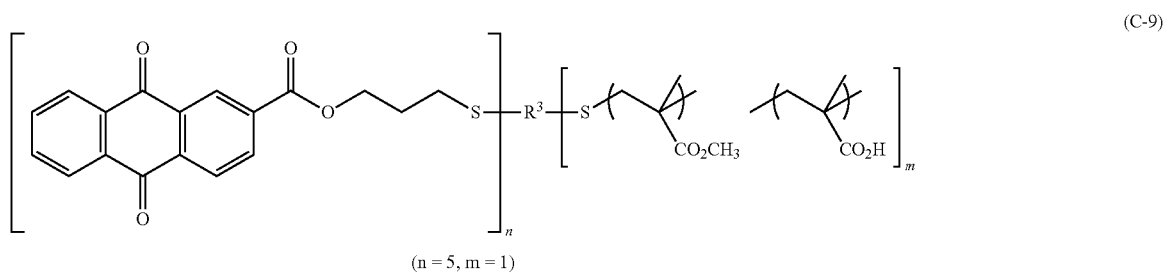
(n = 5, m = 1)
(C-9)
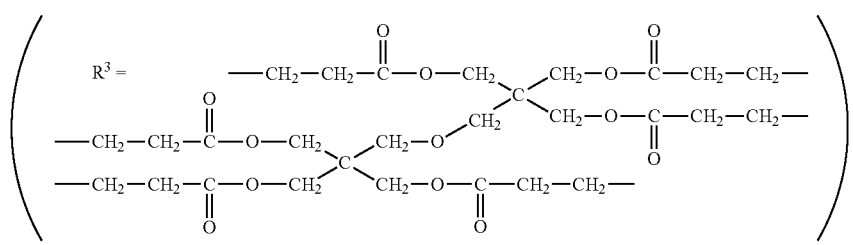
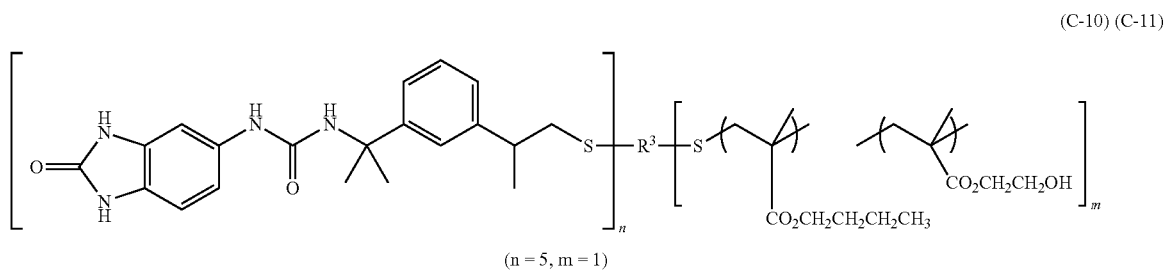
(n = 5, m = 1)
(C-10) (C-11)

-continued
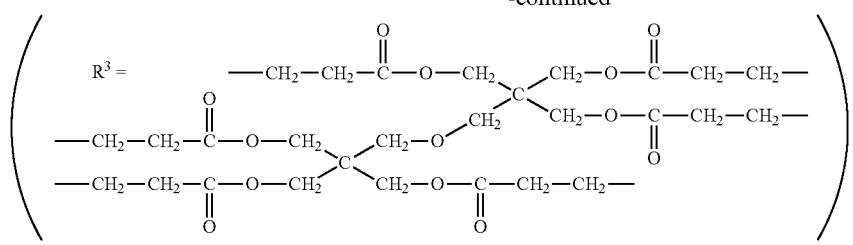
(C-12) (C-13)
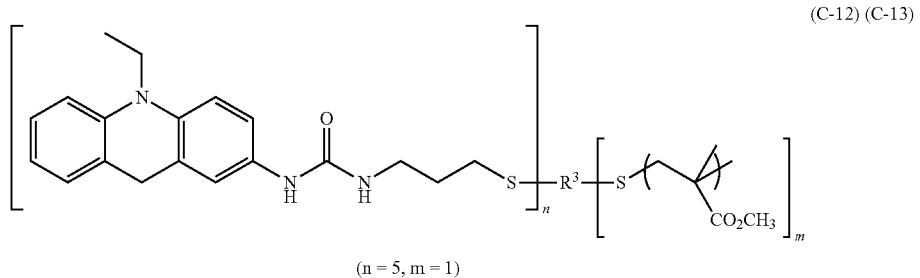
(n = 5, m = 1)
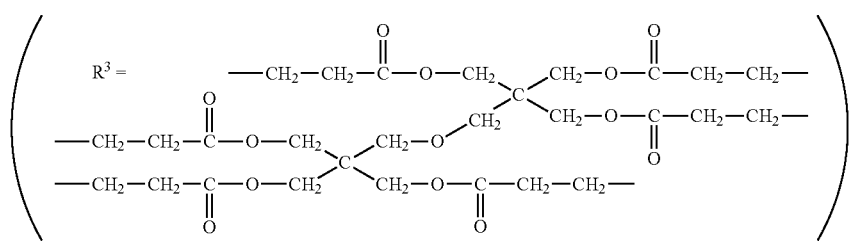
(C-14)
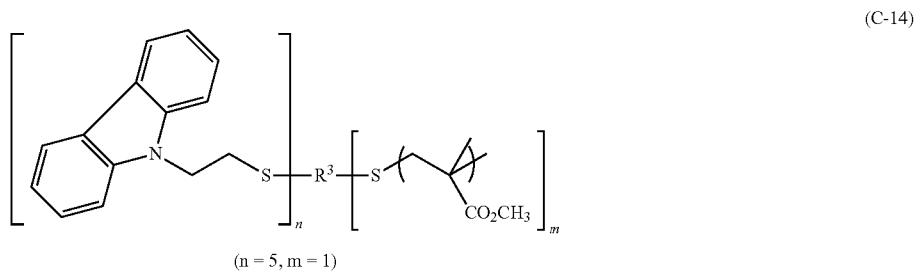
(n = 5, m = 1)
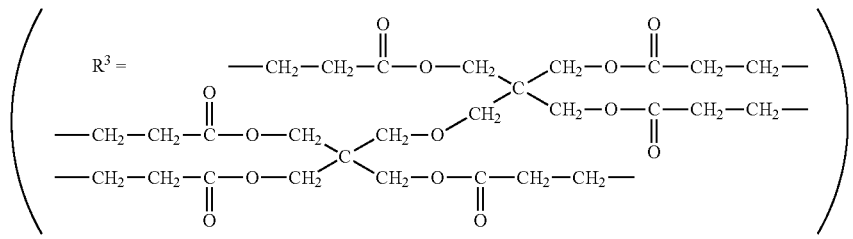
(C-15)
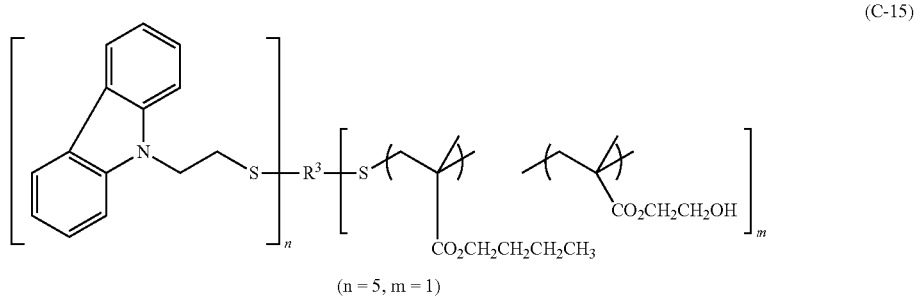
(n = 5, m = 1)

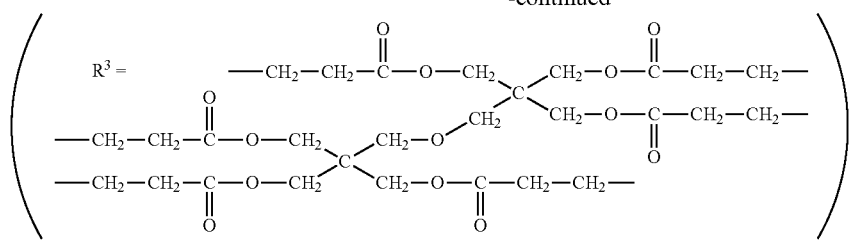
(C-16)
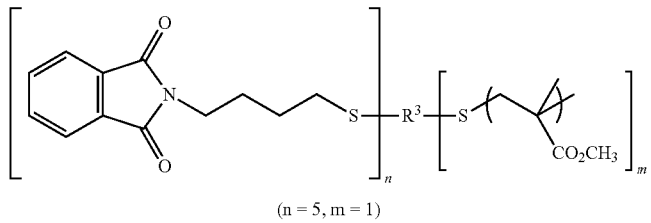
(n = 5, m = 1)
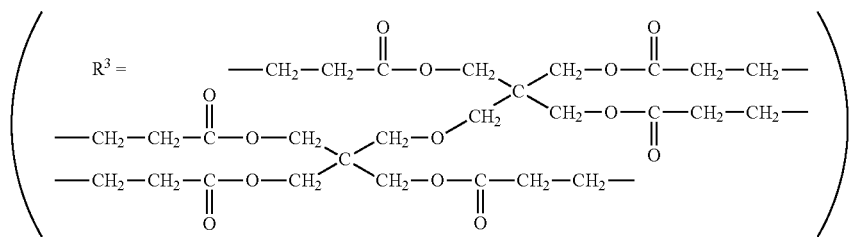
(C-17)
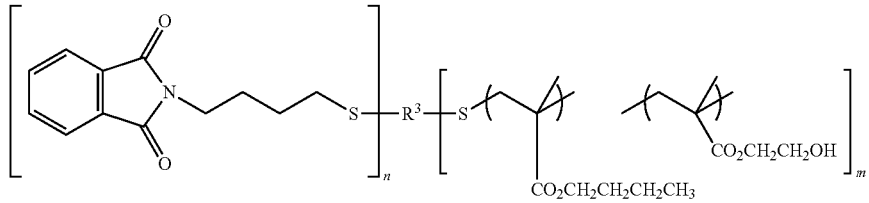
(n = 5, m = 1)
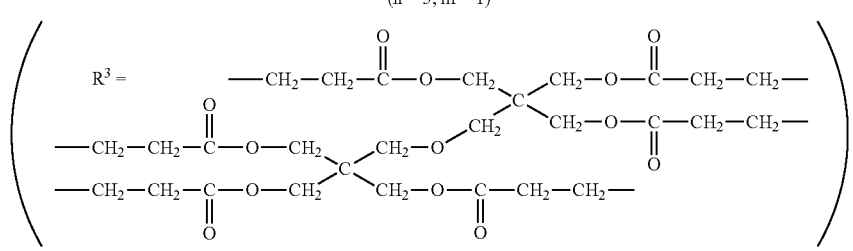
(C-18)
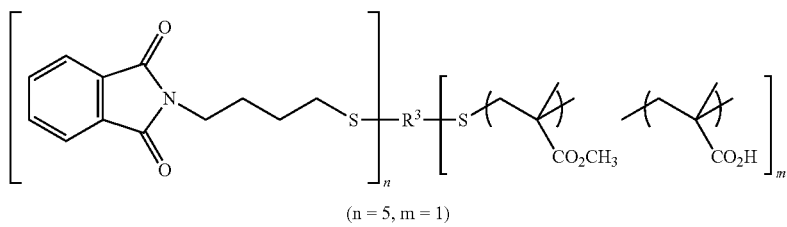
(n = 5, m = 1)
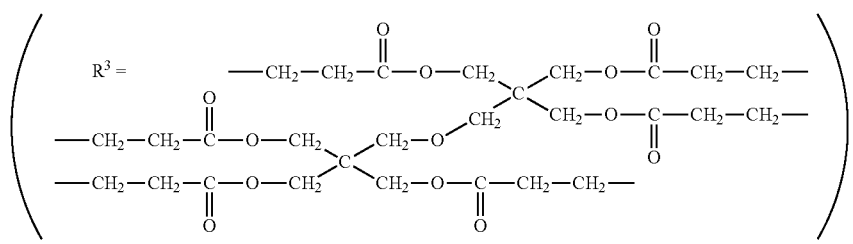

-continued
(C-19)
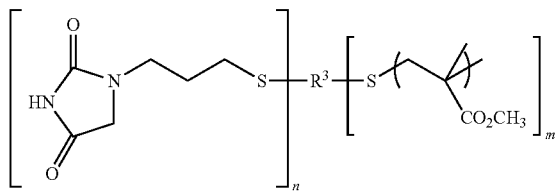
(n = 5, m = 1)
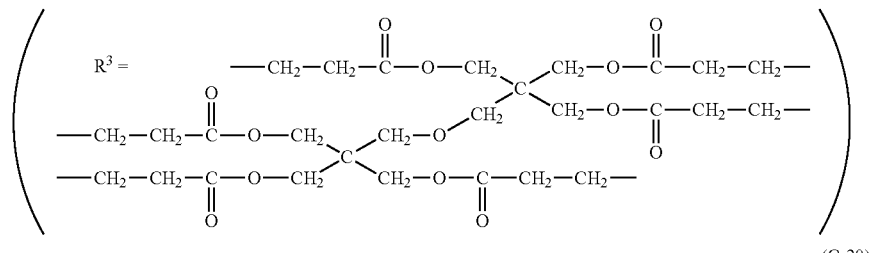
(C-20)
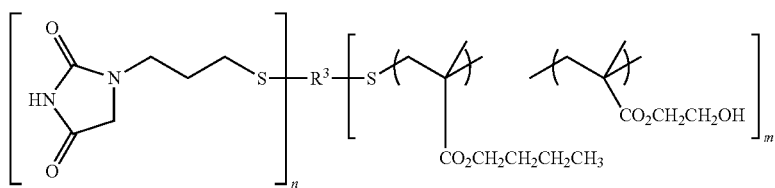
(n = 5, m = 1)
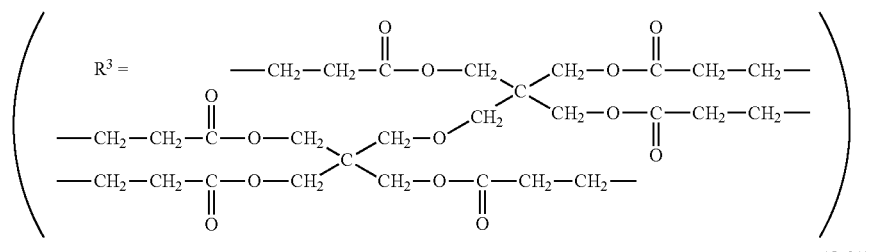
(C-21)
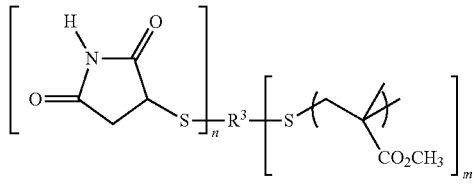
(n = 5, m = 1)
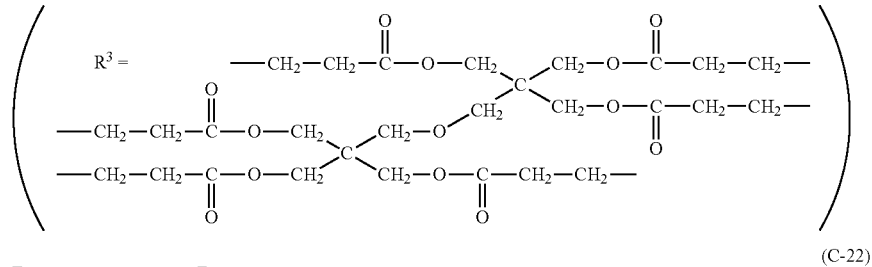
(C-22)
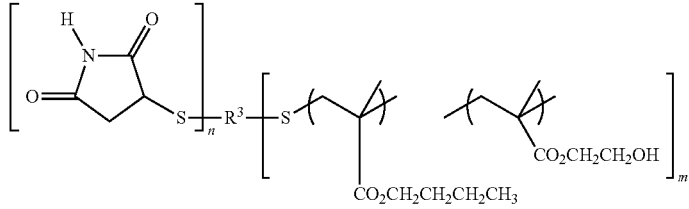
(n = 5, m = 1)

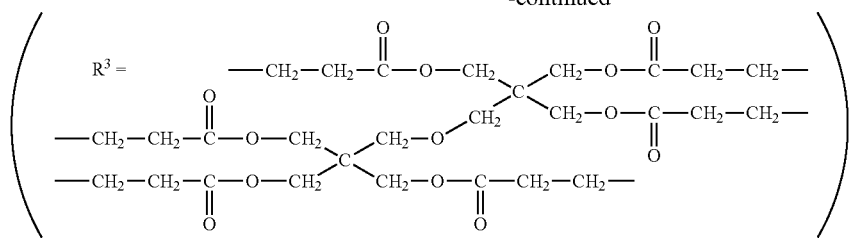
(C-23)
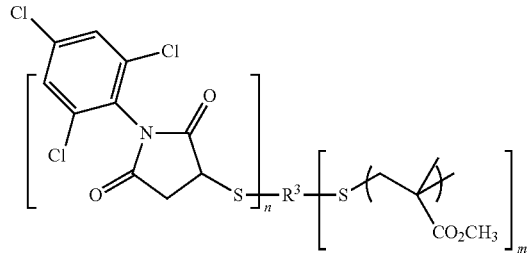
(n = 4.5, m = 1.5)
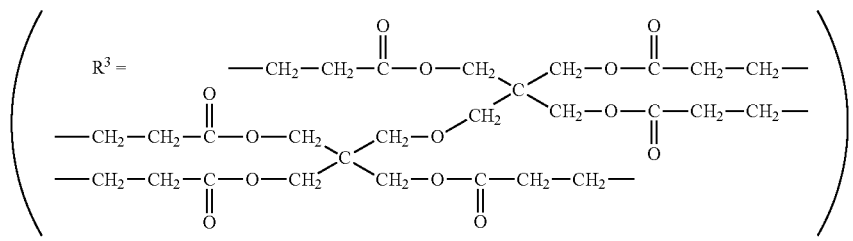
(C-24)
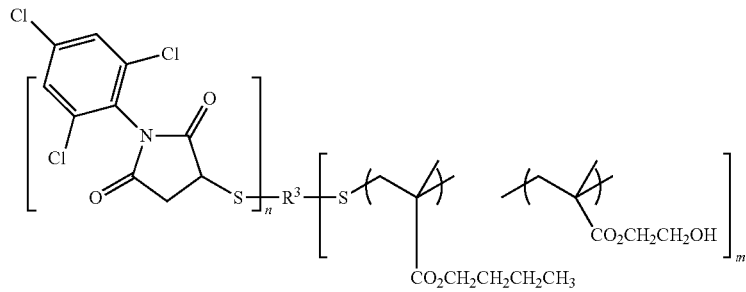
(n = 4.5, m = 1.5)
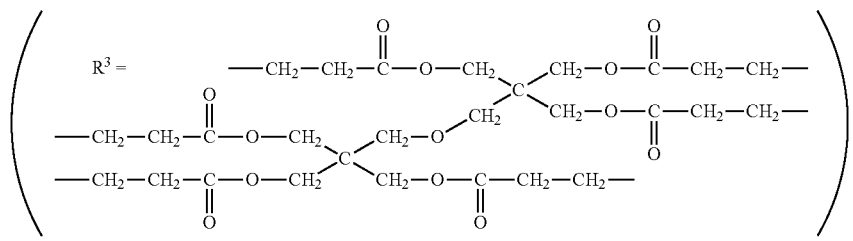

-continued
(C-25)
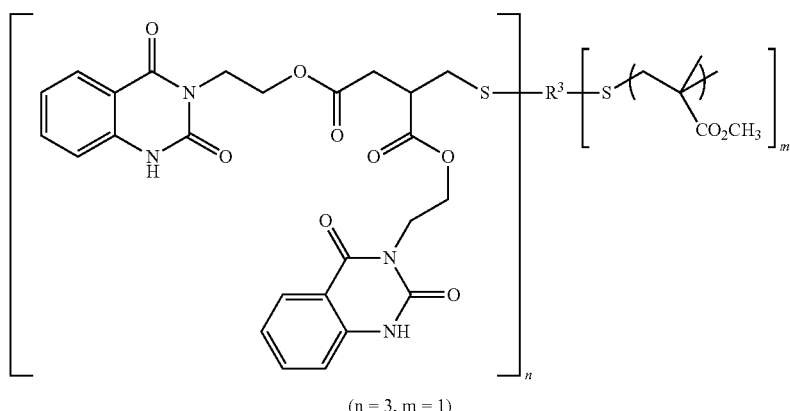
(n = 3, m = 1)
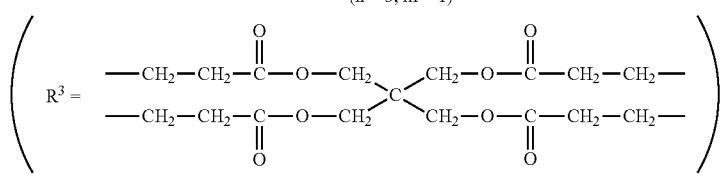
(C-26)
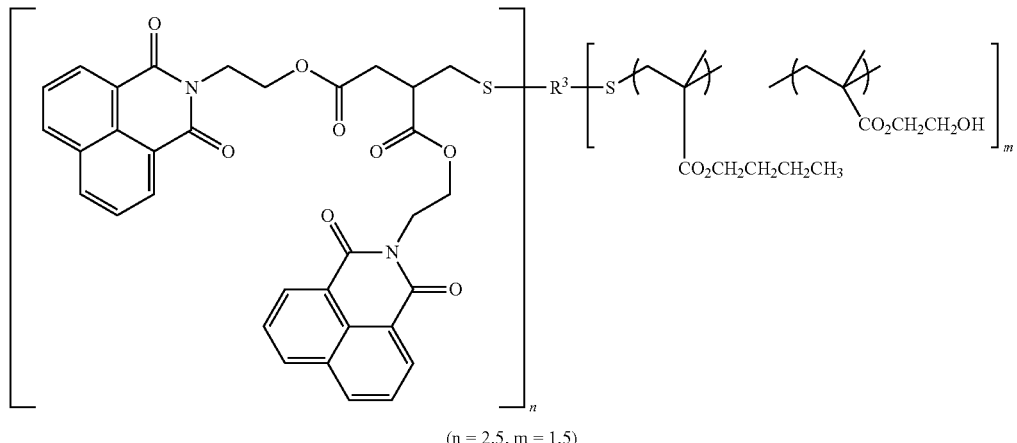
(n = 2.5, m = 1.5)
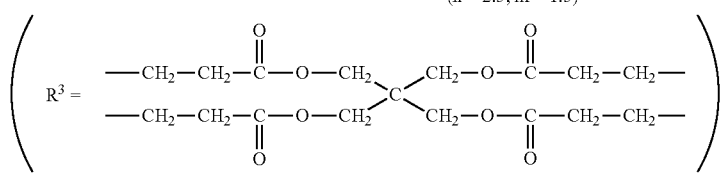
(C-27)
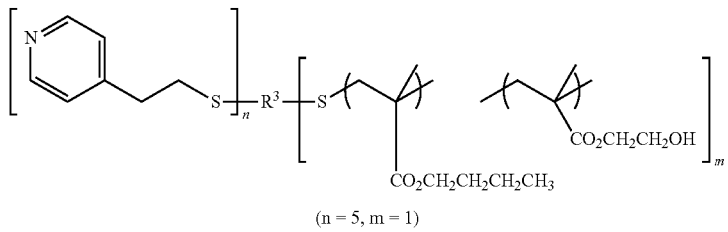
(n = 5, m = 1)
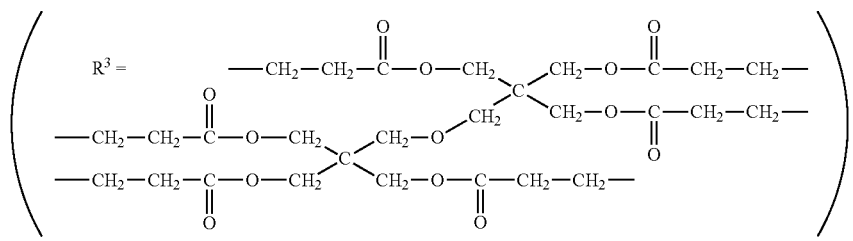

-continued
(C-28)
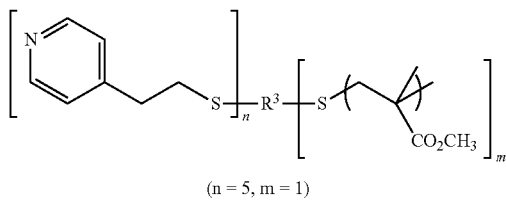
(n = 5, m = 1)
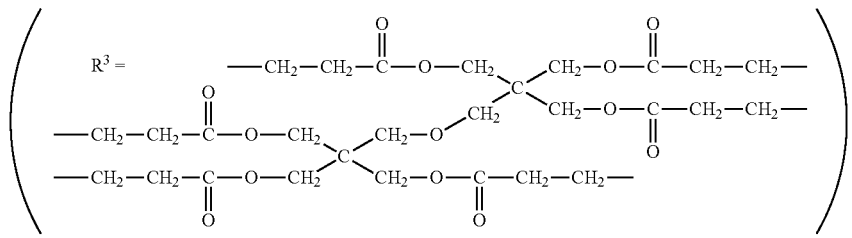
(C-29)
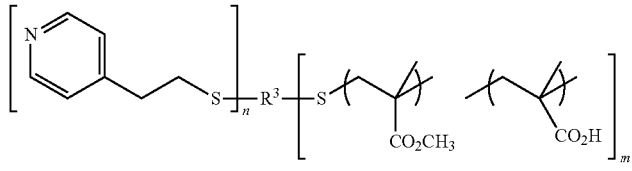
(n = 5, m = 1)
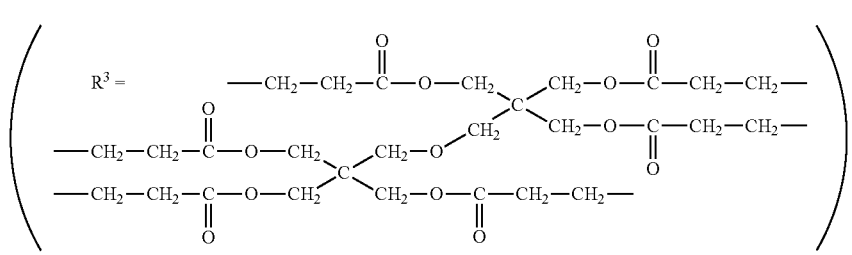
(C-30) (C-31)
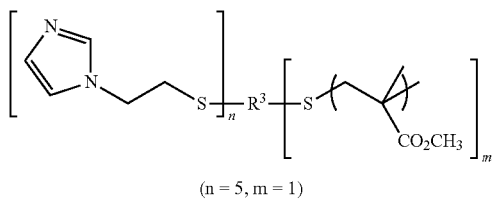
(n = 5, m = 1)
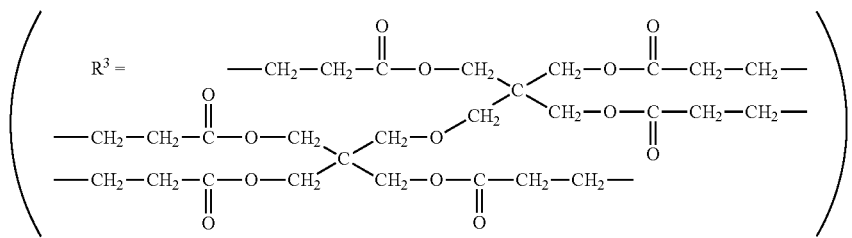
(C-32)
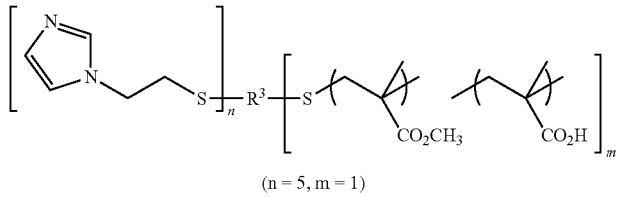
(n = 5, m = 1)

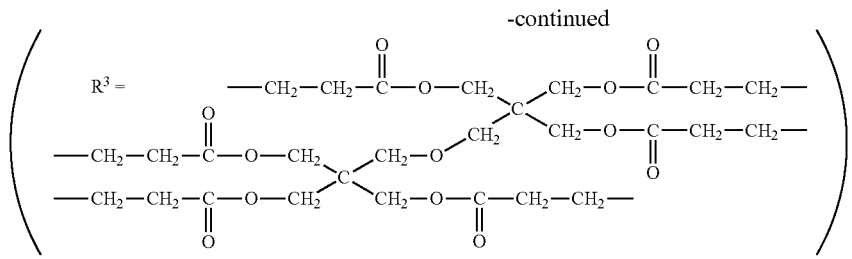

Synthesis Example C-33

A mixed solution of 19.11 parts of the 30% solution of chain transfer agent B-15 described in the Synthesis Example B-15 and 20 parts of methyl methacrylate was heated to 80° C. under a nitrogen stream. To this, 0.013 parts of 2,2'-azobis(isobutyronitrile) [AIBN, manufactured by Wako Pure Chemical Industries, Ltd.] was added, and the mixture was heated for 3 hours. 0.013 parts of AIBN was further added, and the resulting mixture was allowed to react at 80° C. for 3 hours under a nitrogen stream. Subsequently, the reaction mixture was cooled to room temperature, and diluted with acetone. Re-precipitatation using a large amount of methanol was conducted, followed by vacuum drying, thereby providing 13 parts of a solid of the polymer compound of the invention (C-33; polystyrene-equivalent weight average molecular weight: 12000) shown below.

(C-33)

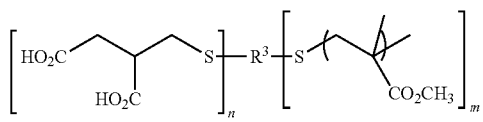

(n = 5, m = 1)

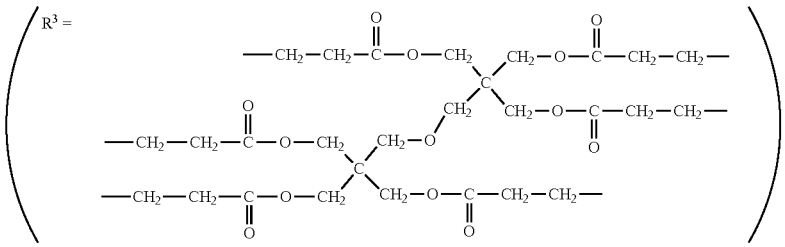

Synthesis Example C-34

14 parts of a solid of the polymer compound according to the invention (C-34; polystyrene-equivalent weight average molecular weight: 20000) shown below was obtained in the same manner as in the Synthesis Example C-33, except that the amount of the 30% solution of chain transfer agent B-15 was changed from 19.11 parts to 9.56 parts, and the amount of AIBN was changed from 0.013 parts to 0.007 parts.

(C-34)

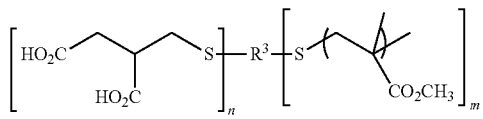

(n = 5, m = 1)

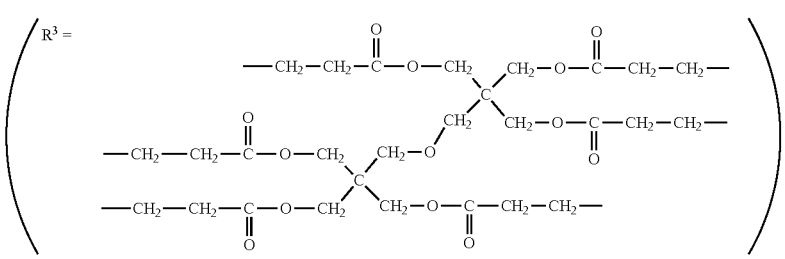

Synthesis Example C-35

13 parts of a solid of the polymer compound of the invention (C-35; polystyrene-equivalent weight average molecular weight: 13000) shown below was obtained in the same manner as in the Synthesis Example C-33, except that 20 parts of methyl methacrylate in the Synthesis Example C-33 was changed to 19.5 parts of butyl methacrylate and 8.5 parts of 2-hydroxyethyl methacrylate.

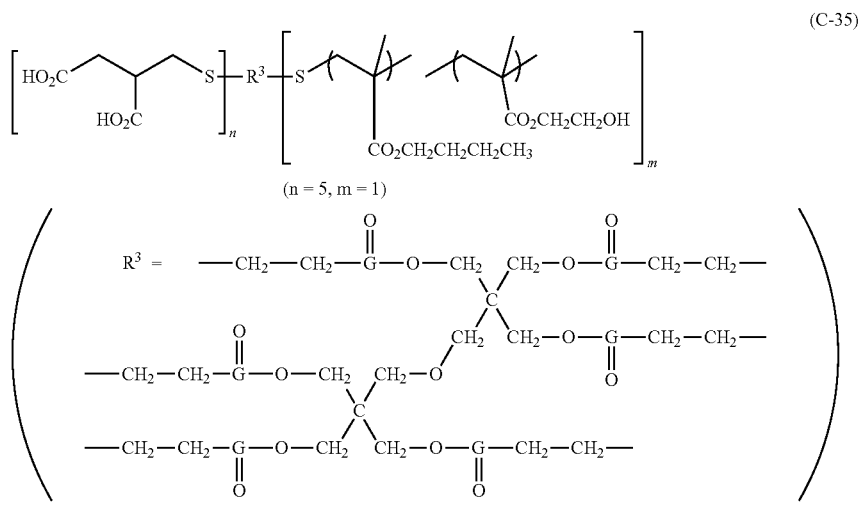

(C-35)

Synthesis Examples C-36 to C-55

Furthermore, polymer compounds C-36 to C-55 of the invention were obtained in the same manner as in Synthesis Example C-33, except that the types and amounts of the chain transfer agent and monomer, the amount of AIBN, and the re-precipitation method were changed as indicated in the following Table 3 and Table. 4.

TABLE 3

| Synthesis Example | Chain transfer agent | Monomer | AIBN | Re-precipitation method | Weight average molecular weight | Yield of polymer compound |
|---|---|---|---|---|---|---|
| C-36 | 9.56 parts of B-15 solution | MMA 19 parts, MAA 1 part | 0.007 parts | Re-precipitation with methanol/water (1/1) | 23000 | 15 parts |
| C-37 | 9.56 parts of B-15 solution | MMA 18 parts, MAA 2 parts | 0.007 parts | Re-precipitation with methanol/water (1/1) | 24000 | 15 parts |
| C-38 | 9.94 parts of B-15 solution | MMA 18 parts, AA 2 parts | 0.007 parts | Re-precipitation with methanol/water (1/1) | 20000 | 17 parts |
| C-39 | 9.03 parts of B-15 solution | MMA 18 parts, MK ester-SA 2 parts | 0.007 parts | Re-precipitation with methanol/water (1/1) | 23000 | 16 parts |
| C-40 | 18.18 parts of B-16 solution | MMA 20 parts | 0.013 parts | Re-precipitation with methanol | 13000 | 11 parts |
| C-41 | 9.09 parts of B16 solution | MMA 20 parts | 0.007 parts | Re-precipitation with methanol | 23000 | 12 parts |
| C-42 | 18.18 parts of B-16 solution | BMA 19.5 parts, HEMA 8.5 parts | 0.013 parts | Re-precipitation with methanol | 16000 | 11 parts |
| C-43 | 13.53 parts of B-17 solution | MMA 20 parts | 0.007 parts | Re-precipitation with methanol | 27000 | 13 parts |
| C-44 | 12.19 parts of B-18 solution | MMA 20 parts | 0.007 parts | Re-precipitation with methanol | 26000 | 11 parts |
| C-45 | 12.13 parts of B-19 solution | MMA 20 parts | 0.007 parts | Re-precipitation with methanol | 28000 | 10 parts |
| C-46 | 20.92 parts of B-20 solution | MMA 20 parts | 0.013 parts | Re-precipitation with methanol | 15000 | 18 parts |
| C-47 | 10.46 parts of B-20 solution | MMA 20 parts | 0.007 parts | Re-precipitation with methanol | 32000 | 19 parts |
| C-48 | 20.92 parts of B-20 solution | BMA 19.5 parts, HEMA 8.5 parts | 0.013 parts | Re-precipitation with methanol | 17000 | 22 parts |
| C-49 | 10.46 parts of B-20 solution | MMA 19 parts, MAA 1 part | 0.007 parts | Re-precipitation with methanol/water (1/1) | 30000 | 17 parts |

TABLE 3-continued

| Synthesis Example | Chain transfer agent | Monomer | AIBN | Re-precipitation method | Weight average molecular weight | Yield of polymer compound |
|---|---|---|---|---|---|---|
| C-50 | 21.79 parts of B-21 solution | MMA 20 parts | 0.013 parts | Re-precipitation with methanol | 22000 | 20 parts |

MMA - Methyl methacrylate
MAA - Methacrylic acid
AA - Acrylic acid
BMA - n-Butyl methacrylate
HEMA - 2-Hydroxyethyl methacrylate
MK ester-SA (manufactured by Shin Nakamura Chemical Co., Ltd.):

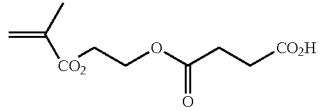

TABLE 4

| Synthesis Example | Chain transfer agent | Monomer | AIBN | Re-precipitation method | Weight average molecular weight | Yield of polymer compound |
|---|---|---|---|---|---|---|
| C-51 | 21.79 parts of B-21 solution | BMA 19.5 parts, HEMA 8.5 parts | 0.013 parts | Re-precipitation with methanol | 24000 | 24 parts |
| C-52 | 17.38 parts of B-22 solution | MMA 20 parts | 0.013 parts | Re-precipitation with methanol | 19000 | 20 parts |
| C-53 | 17.38 parts of B-22 solution | BMA 19.5 parts, HEMA 8.5 parts | 0.013 parts | Re-precipitation with methanol | 22000 | 22 parts |
| C-54 | 8.69 parts of B-22 solution | MMA 19 parts, MAA 1 part | 0.007 parts | Re-precipitation with methanol/water (1/1) | 31000 | 18 parts |
| C-55 | 11.72 parts of B-23 solution | MMA 20 parts | 0.013 parts | Re-precipitation with methanol | 11000 | 11 parts |

MMA—Methyl methacrylate
MAA—Methacrylic acid
BMA—n-Butyl methacrylate
HEMA—2-Hydroxyethyl methacrylate In the following, the structures of the synthesized polymer compounds are shown. In addition, indications such as (C-36) indicate the numbers of Synthesis Examples in the above Tables 3 and 4.

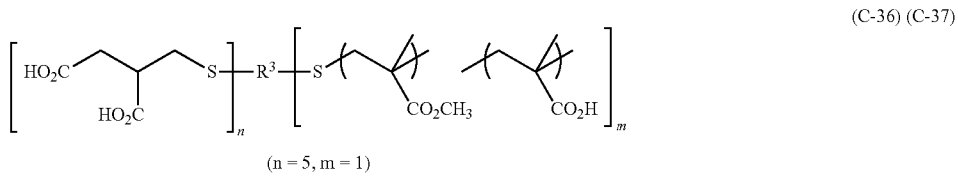

(C-36) (C-37)

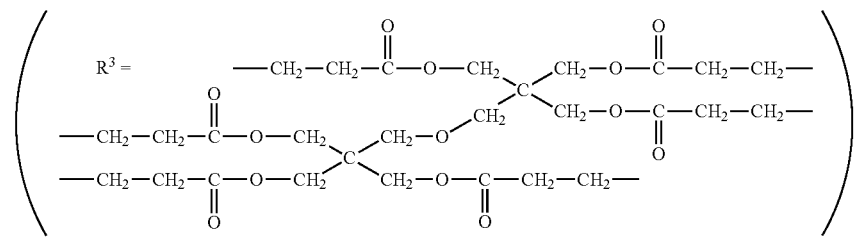

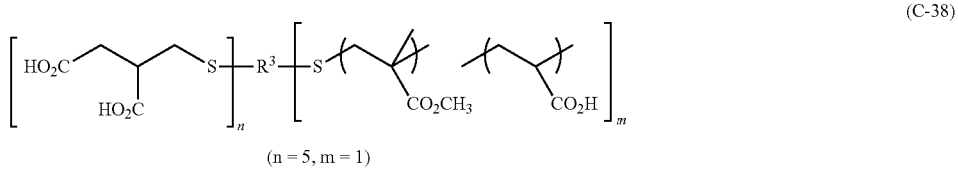

(C-38)

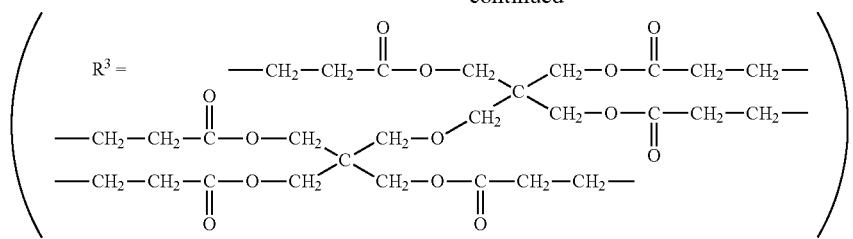
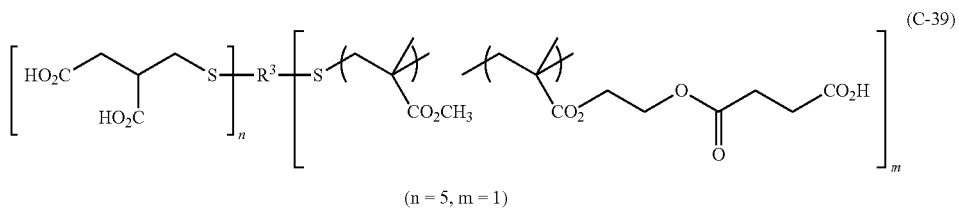
(C-39)
(n = 5, m = 1)
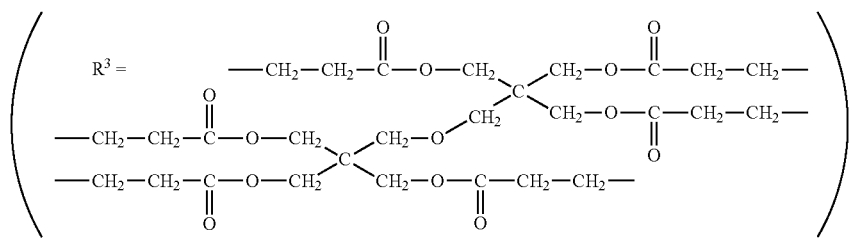
(C-40) (C-41)
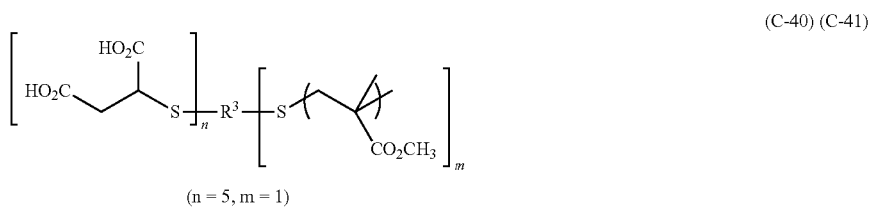
(n = 5, m = 1)
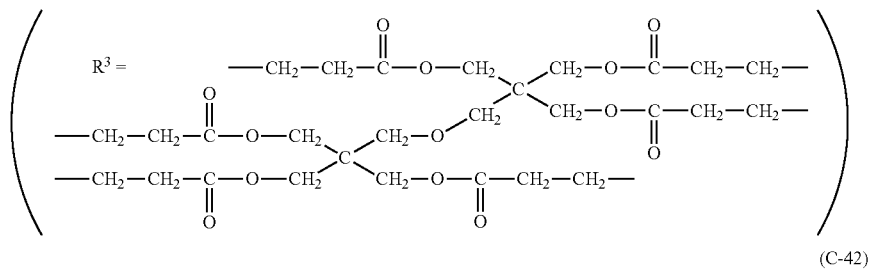
(C-42)
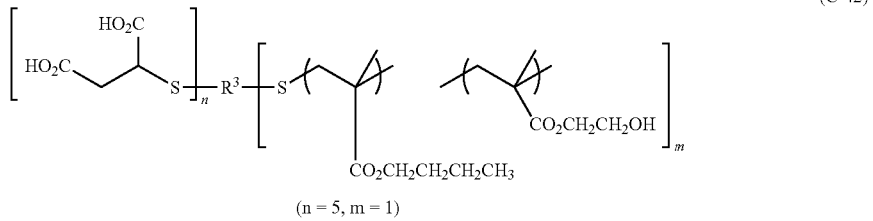
(n = 5, m = 1)
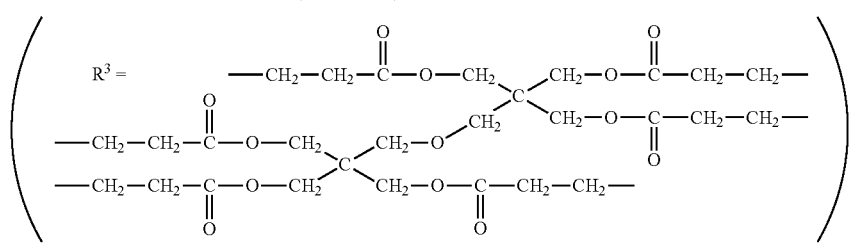

(C-43)
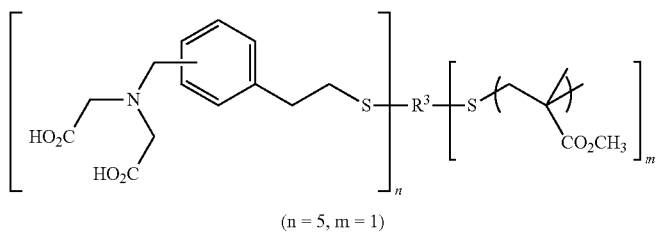
(n = 5, m = 1)
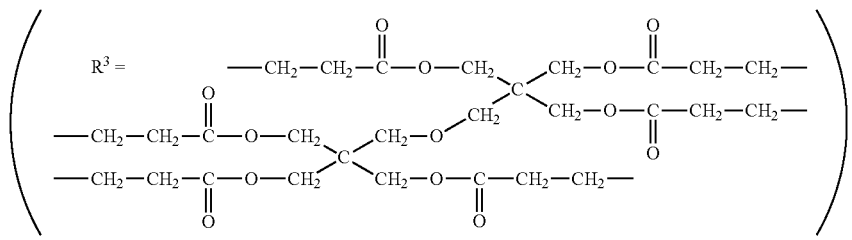
(C-44)
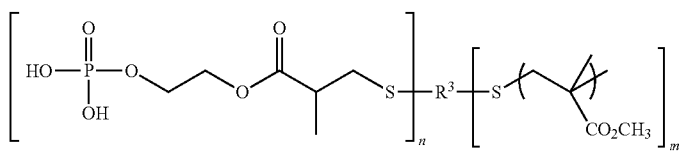
(n = 5, m = 1)
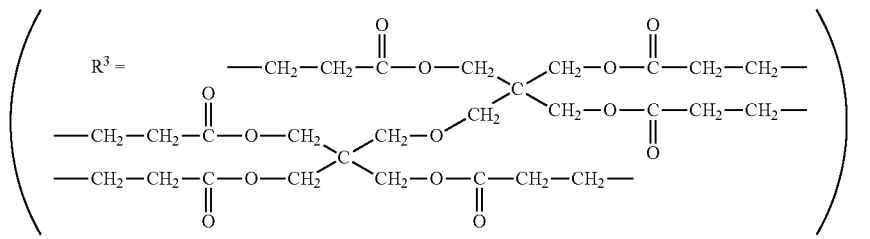
(C-45)
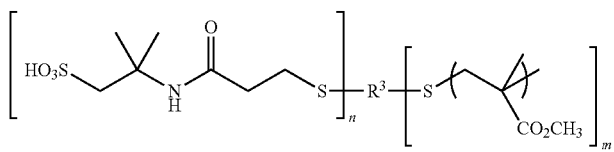
(n = 5, m = 1)
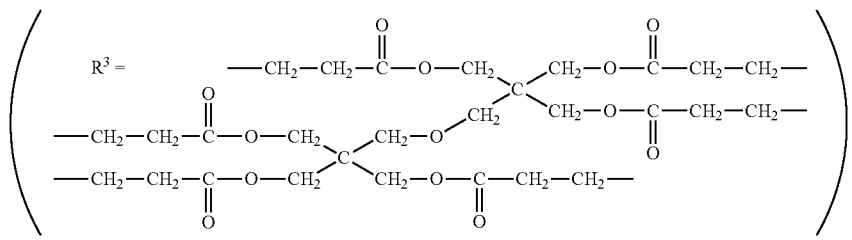
(C-46) (C-47)
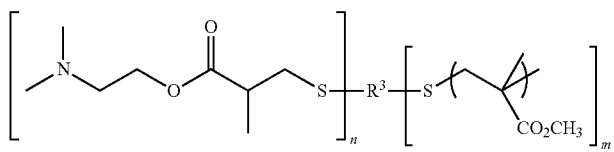
(n = 5, m = 1)

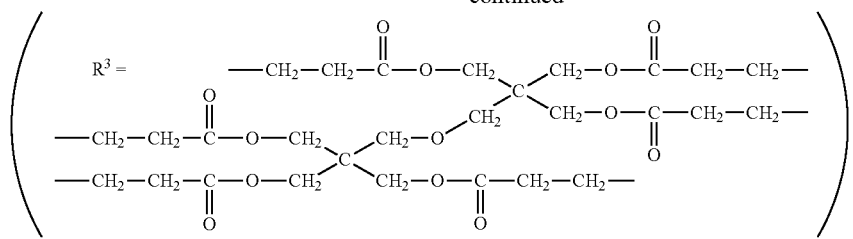
(C-48)
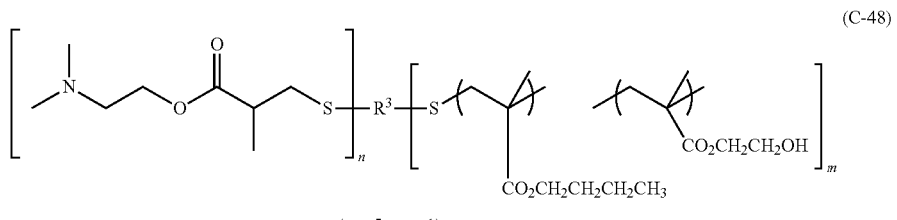
(n = 5, m = 1)
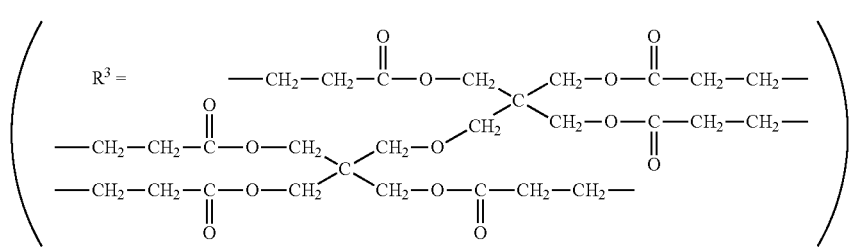
(C-49)
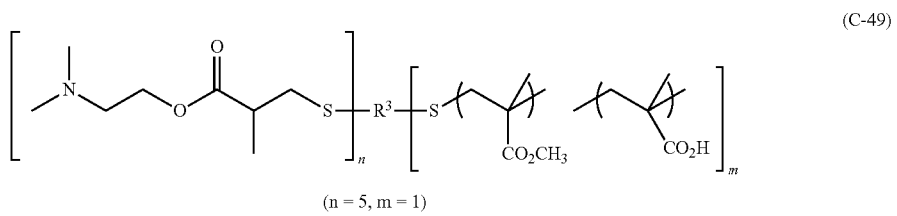
(n = 5, m = 1)
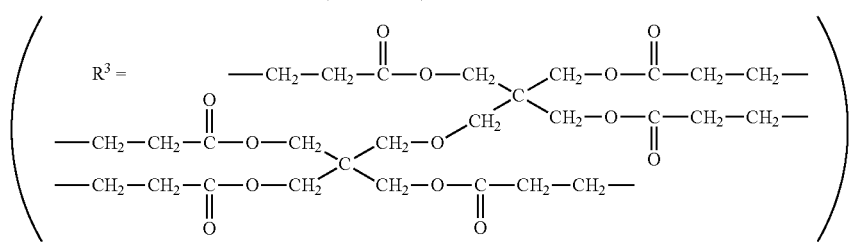
(C-50)
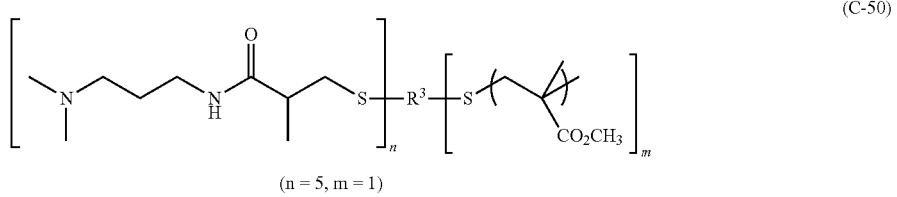
(n = 5, m = 1)
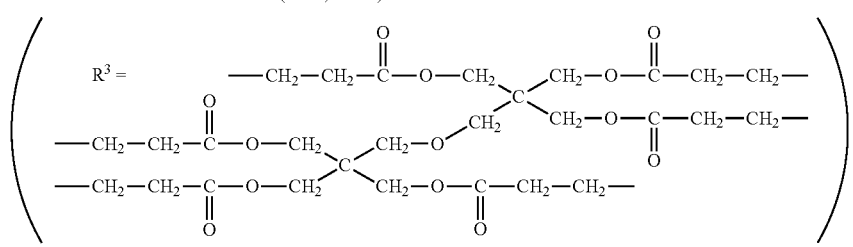

-continued
(C-51)
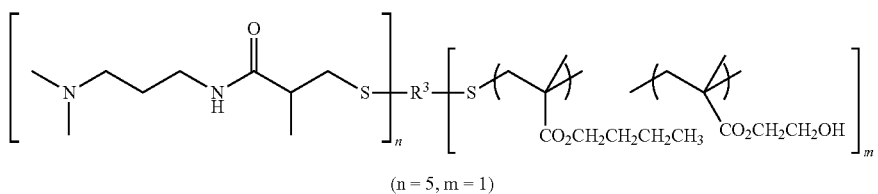
(n = 5, m = 1)
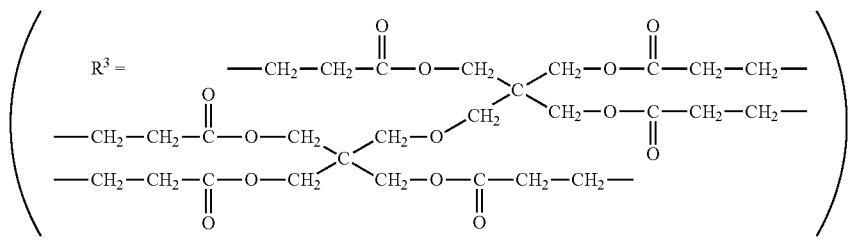
(C-52)
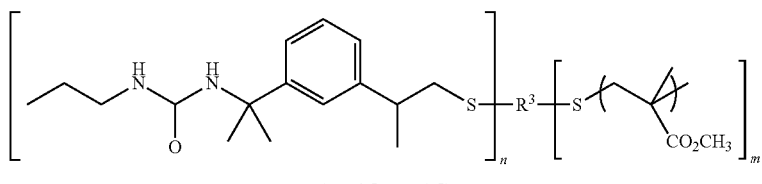
(n = 4.5, m = 1.5)
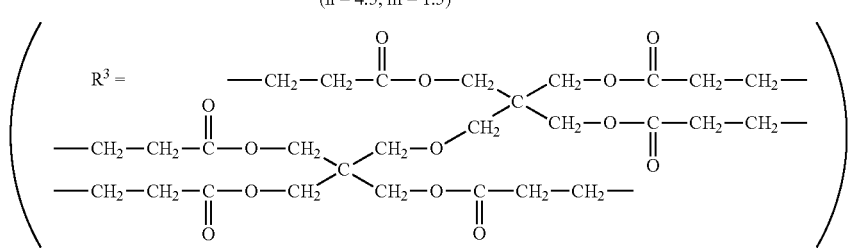
(C-53)
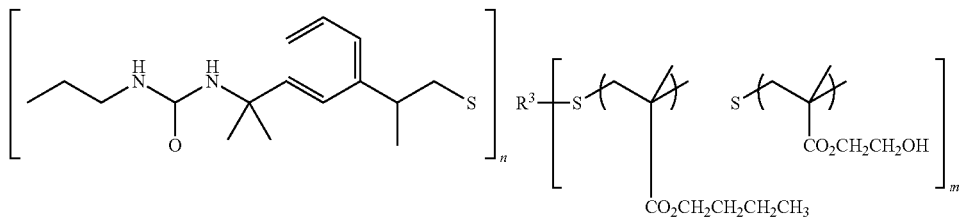
(n = 4.5, m = 1.5)
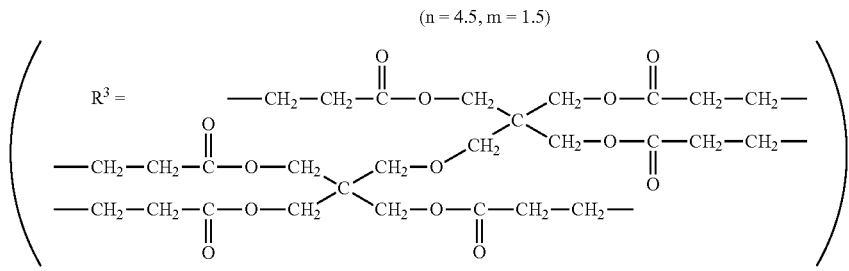
(C-54)
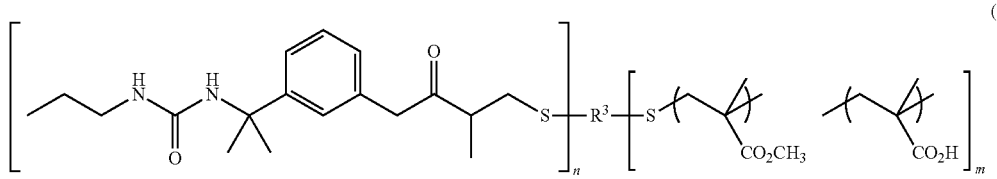
(n = 4.5, m = 1.5)

-continued

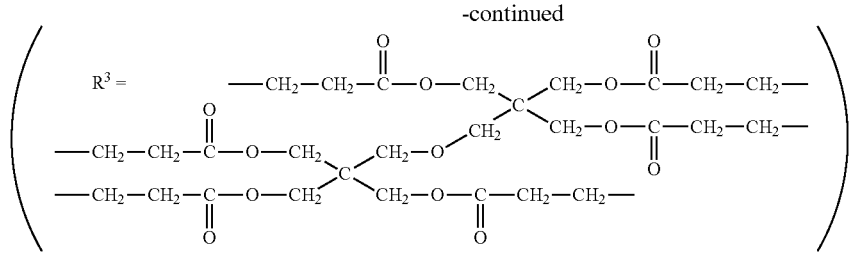

(C-55)

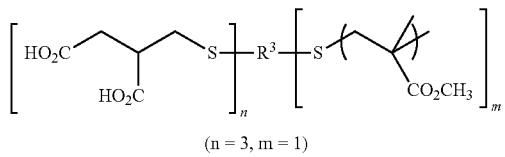

(n = 3, m = 1)

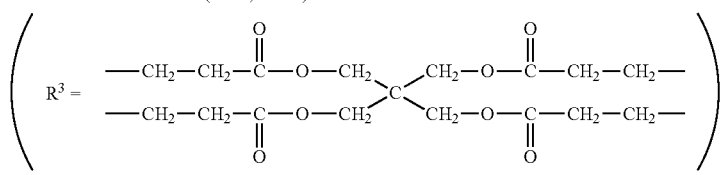

Synthesis Example C-56

A mixed solution of 4.99 parts of the 30% solution of chain transfer agent B-24 described in the Synthesis Example B-24, 19.0 parts of methyl methacrylate, 1.0 part of methacrylic acid, and 4.66 parts of 1-methoxy-2-propanol was heated to 90° C. under a nitrogen stream. While this mixed solution was stirred, a mixed solution of 0.139 parts of dimethyl 2,2'-azobisisobutyrate [V-601, manufactured by Wako Pure Chemical Industries, Ltd.], 5.36 parts of 1-methoxy-2-propanol, and 9.40 parts of 1-methoxy-2-propyl acetate was added dropwise over 2.5 hours. After completion of the dropwise addition, the mixture was allowed to react for 2.5 hours at 90° C., then a mixed solution of 0.046 parts of dimethyl 2,2'-azobisisobutyrate and 4.00 parts of 1-methoxy-2-propyl acetate was introduced, and the mixture was further allowed to react for 2 hours. To the reaction liquid, 1.52 parts of 1-methoxy-2-propanol and 21.7 parts of 1-methoxy-2-propyl acetate were added, and the mixture was cooled to room temperature, thereby providing a solution of the polymer compound according to the invention (C-56; polystyrene-equivalent weight average molecular weight: 24000) shown below (30% by mass of the polymer compound, 21% by mass of 1-methoxy-2-propanol, and 49% by mass of 1-methoxy-2-propyl acetate).

(C-56)

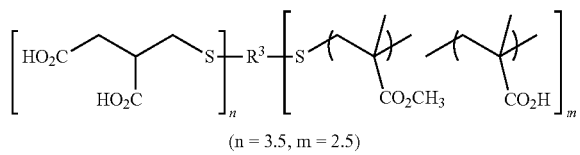

(n = 3.5, m = 2.5)

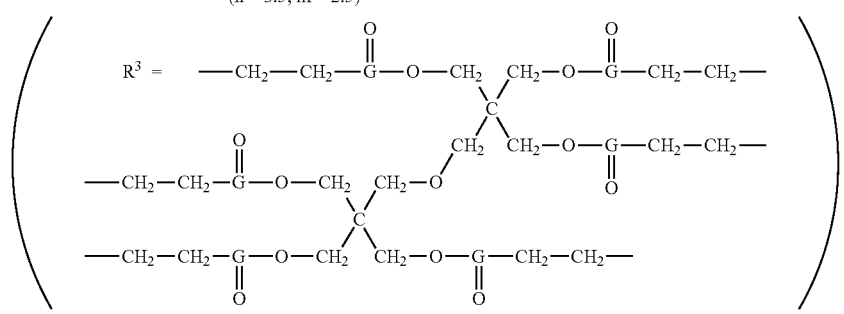

Synthesis Example C-57

A solution of the polymer compound according to the invention (C-57; polystyrene-equivalent weight average molecular weight: 25000) shown below (30% by mass of the polymer compound, 21% by mass of 1-methoxy-2-propanol, and 49% by mass of 1-methoxy-2-propyl acetate) was obtained in the same manner as in the Synthesis Example C-56, except that the mixed solution of 4.99 parts of the 30% solution of chain transfer agent B-24, 19.0 parts of methyl methacrylate, 1.0 part of methacrylic acid, and 4.66 parts of 1-methoxy-2-propanol described in the Synthesis Example C-56 was changed to a mixed solution of 5.03 parts of the 30% solution of chain transfer agent B-24, 18.0 parts of methyl methacrylate, 2.0 parts of methacrylic acid, and 4.66 parts of 1-methoxy-2-propanol.

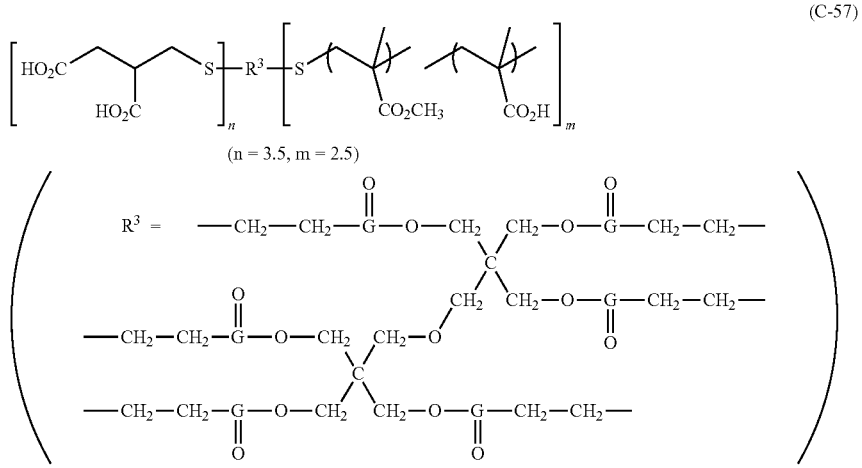

(C-57)

(n = 3.5, m = 2.5)

Example 58

Components of the following composition were mixed, and the resulting mixture was mixed by stirring for 3 hours using a homogenizer at a rotation speed of 3,000 rpm, to prepare a mixed solution.

[Composition]

| | |
|---|---|
| C.I. Pigment Red 254 | 90 parts |
| C.I. Pigment Red 177 | 10 parts |
| Polymer compound obtained in Synthesis C-1 above (pigment dispersant) | 50 parts |
| 1-Methoxy-2-propyl acetate | 850 parts |

Subsequently, the mixed solution obtained in the above was subjected to a dispersion treatment for 6 hours with a bead disperser (DISPERMAT, manufactured by Getzmann GmbH) using zirconia beads having a diameter of 0.3 mm. Subsequently, the mixed solution was subjected to another dispersion treatment at a flow rate of 500 g/min at a pressure of 2000 kg/cm$^3$, using a high pressure disperser equipped with a pressure reduction mechanism (NANO-3000-10, manufactured by Nippon B.E.E Co., Ltd.). This dispersion treatment was repeated 10 times, thereby providing a red pigment dispersion composition R1.

(Evaluation 1)

The obtained pigment dispersion composition was subjected to the following evaluations.

(1) Measurement and Evaluation of Viscosity

With respect to the obtained pigment dispersion composition, the viscosity $\eta^1$ of the pigment dispersion composition immediately after the dispersing, and the viscosity $\eta^2$ of the pigment dispersion composition after the pigment dispersion composition is left at room temperature for one week from the dispersing, were measured using an E type viscometer, and the degree of viscosity increase was evaluated. The evaluation results are shown in Table 5 below. Here, a lower viscosity suggests better dispersibility and dispersion stability.

(2) Measurement and Evaluation of Contrast

The obtained pigment dispersion composition was applied onto a glass substrate, so as to give a thickness of the coating film after drying of 1 μm and so as to produce a sample. The sample was placed between two olarization plates, and the amount of transmitted light when the polarization axes were parallel and the amount of transmitted light when the polarization axes were perpendicular were measured, and the ratio thereof was defined as contrast (Reference was made to 1990-nenn Dai-7-Kai Shikisaikougaku Conference, 512-shoku hyouji 10.4″ saizuTFT-LCDyou Color Filter (7$^{th}$ Color Optics Conference in 1990; Color Filter for 512-color 10.4″-size TFT-LCD) by Ueki, Koseki, Fukunaga and Yamanaka). The results of the measurement and evaluation are presented in Table 5 below. Here, a higher contrast suggests a higher degree of micronization, and a higher transmittance, that is, a higher coloring power.

Examples 59 to 112

Red pigment dispersion compositions R2 to R55 were prepared in the same manner as in Example 58, except that the pigment dispersant of Example 58 (polymer compound obtained in the Synthesis Example C-1) was replaced by the polymer compounds (pigment dispersants) obtained in the Synthesis Examples C-2 to C-55, respectively. Evaluation of the compositions was performed in the same manner as in Example 58.

Examples 113 and 114

Red pigment dispersion compositions R56 and R57 were prepared in the same manner as in Example 58, except that 50 parts of the pigment dispersant in Example 58 (polymer compound obtained in the Synthesis Example C-1) was respectively replaced by 167 parts of the polymer compounds obtained in the Synthesis Examples C-56 and C-57 (pigment dispersants, 30 mass % solutions), and the amount of 1-methoxy-2-propyl acetate was changed from 850 parts to 733 parts. Evaluation of the compositions was performed in the same manner as in Example 58.

Example 115

A green pigment dispersion composition G1 was prepared in the same manner as in Example 58, except that the red pigment dispersion composition of Example 58 was replaced by a green pigment dispersion composition having the following composition. Evaluation of the composition was performed in the same manner as in Example 58.

[Composition]

| | |
|---|---|
| C.I. Pigment Green 36 | 60 parts |
| C.I. Pigment Yellow 150 | 40 parts |
| Polymer compound obtained in Synthesis Example C-1 above (pigment dispersant) | 50 parts |
| 1-Methoxy-2-propyl acetate | 850 parts |

Examples 116 to 169

Green pigment dispersant compositions G2 to G55 were prepared in the same manner as in Example 115, except that the pigment dispersant of Example 115 (polymer compound obtained in the Synthesis Example C-1) was replaced by the polymer compounds obtained in the Synthesis Examples C-2 to C-55 (pigment dispersants), respectively. Evaluation of the compositions was performed in the same manner as in Example 58.

Examples 170 and 171

Green pigment dispersion compositions G56 and G57 were prepared in the same manner as in Example 115, except that 50 parts of the pigment dispersant in Example 115 (polymer compound obtained in the Synthesis Example C-1) was respectively replaced by 167 parts of the polymer compounds obtained in the Synthesis Examples C-56 and C-57 (pigment dispersants, 30 mass % solutions), and the amount of 1-methoxy-2-propyl acetate was changed from 850 parts to 733 parts. Evaluation of the compositions was performed in the same manner as in Example 58.

Example 172

A blue pigment dispersion composition B1 was prepared in the same manner as in Example 58, except that the red pigment dispersion composition of Example 58 was replaced by a blue pigment dispersion composition having the following composition. Evaluation of the composition was performed in the same manner as in Example 58.

[Composition]

| | |
|---|---|
| C.I. Pigment Blue 15:6 | 85 parts |
| C.I. Pigment Violet 23 | 15 parts |
| Polymer compound obtained in Synthesis Example C-1 above (pigment dispersant) | 50 parts |
| 1-Methoxy-2-propyl acetate | 850 parts |

Examples 173 to 195

Blue pigment dispersant compositions B2 to B24 were prepared in the same manner as in Example 172, except that the pigment dispersant of Example 172 (polymer compound obtained in the Synthesis Example C-1) was replaced by the polymer compounds obtained in the Synthesis Examples C-2 to C-9, Synthesis Examples C-12 to C-15 and Synthesis Examples C-33 to C-43 (pigment dispersants), respectively. Evaluation of the compositions was performed in the same manner as in Example 58.

Examples 196 and 197

Blue pigment dispersion compositions B25 and B26 were prepared in the same manner as in Example 172, except that 50 parts of the pigment dispersant in Example 172 (polymer compound obtained in the Synthesis Example C-1) was respectively replaced by 167 parts of the polymer compounds obtained in the Synthesis Examples C-56 and C-57 (pigment dispersants, 30 mass % solutions), and the amount of 1-methoxy-2-propyl acetate was changed from 850 parts to 733 parts. Evaluation of the compositions was performed in the same manner as in Example 58.

Comparative Example 1

A red pigment dispersion composition R58 was prepared in the same manner as in Example 58, except that the polymer compound of Example 58 (pigment dispersant), which was obtained in the Synthesis Example C-1, was replaced by the following copolymer D-1 of methyl methacrylate and the compound (A–1) (=85/15 [weight ratio], weight average molecular weight: 0,000). Evaluation of the composition was performed in the same manner as in Example 58.

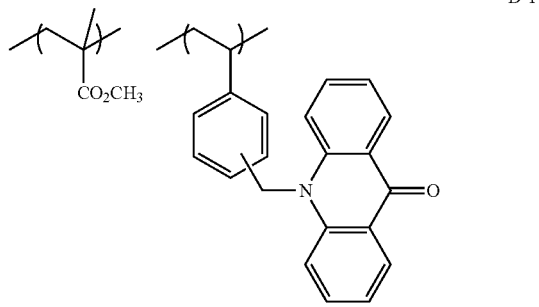

D-1

Comparative Example 2

A red pigment dispersion composition R59 was prepared in the same manner as in Example 58, except that the polymer compound of Example 58 (pigment dispersant), which was obtained in the Synthesis Example C-1, was replaced by the following poly(methyl methacrylate) D-2 having one acridone moiety at a terminal (weight average molecular weight: 15,000). Evaluation of the composition was performed in the same manner as in Example 58.

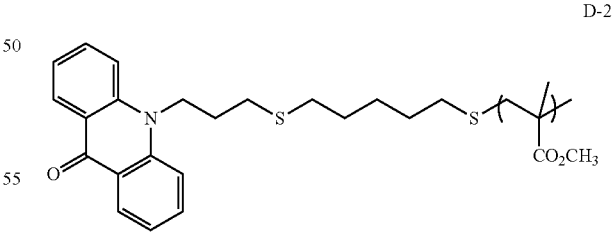

D-2

Comparative Example 3

A red pigment dispersion composition R60 was prepared in the same manner as in Example 58, except that the polymer compound of Example 58 (pigment dispersant), which was obtained in the Synthesis Example C-1, was replaced by the following poly(butyl methacrylate-co-2-hydroxyethyl methacrylate) D-3 (butyl methacrylate/2-hydroxyethyl methacrylate (=70/30 [mass ratio]) copolymer (weight average molecular weight: 16,000). Evaluation of the composition was performed in the same manner as in Example 58.

thalimide moiety at a terminal (weight average molecular weight: 16,000). Evaluation of the composition was performed in the same manner as in Example 58.

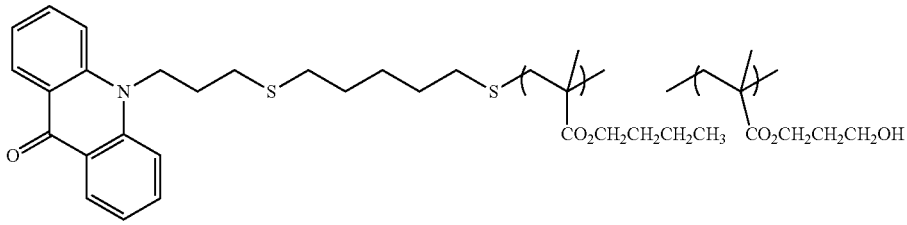

D-3

Comparative Example 4

A red pigment dispersion composition R61 was prepared in the same manner as in Example 58; except that the polymer compound of Example 58 (pigment dispersant), which was obtained in the Synthesis Example C-1, was replaced by the following poly(methyl methacrylate) D-4 having one anthraquinone moiety at a terminal (weight average molecular weight: 14,000). Evaluation of the composition was performed in the same manner as in Example 58.

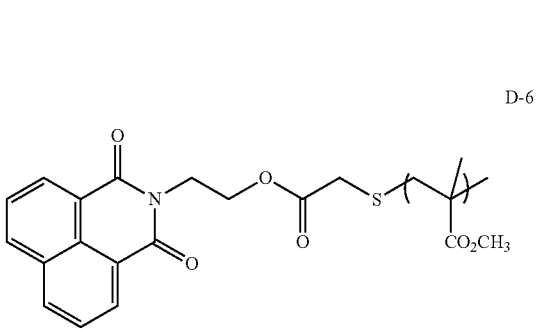

D-6

Comparative Example 7

A red pigment dispersion composition R64 was prepared in the same manner as in Example 90, except that the polymer compound of Example 90 (pigment dispersant), which was obtained in the Synthesis Example C-33, was replaced by the following copolymer D-7 of methyl methacrylate and methacrylic acid (=85/15 [mass ratio], weight average molecular weight: 15,000). Evaluation of the composition was performed in the same manner as in Example 58.

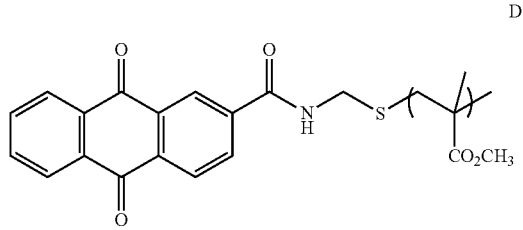

D-4

Comparative Example 5

A red pigment dispersion composition R62 was prepared in the same manner as in Example 58, except that the polymer compound of Example 58 (pigment dispersant), which was obtained in the Synthesis Example C-1, was replaced by the following poly(methyl methacrylate) D-5 having one phthalimide moiety at a terminal (weight average molecular weight: 15,000). Evaluation of the composition was performed in the same manner as in Example 58.

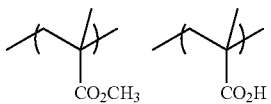

D-7

Comparative Example 8

A red pigment dispersion composition R65 was prepared in the same manner as in Example 90, except that the polymer compound of Example 90 (pigment dispersant), which was obtained in the Synthesis Example C-33, was replaced by the following poly(methyl methacrylate) D-8 having one carboxylic acid moiety at a terminal (weight average molecular weight: 13,000). Evaluation of the composition was performed in the same manner as in Example 58.

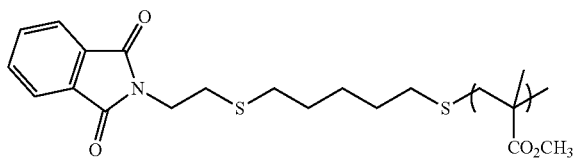

D-5

Comparative Example 6

A red pigment dispersion composition R63 was prepared in the same manner as in Example 58, except that the polymer compound of Example 58 (pigment dispersant), which was obtained in the Synthesis Example C-1, was replaced by the following poly(methyl methacrylate) D-6 having one naph-

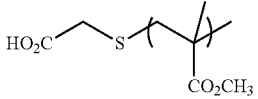

D-8

Comparative Example 9

A red pigment dispersion composition R66 was prepared in the same manner as in Example 90, except that the polymer compound of Example 90 (pigment dispersant), which was obtained in the Synthesis Example C-33, was replaced by the following poly(butyl methacrylate-co-2-hydroxyethyl methacrylate) copolymer D-9 having one carboxylic acid moiety at a terminal (butyl methacrylate/2-hydroxyethyl methacrylate (=70/30 [mass ratio]) (weight average molecular weight: 16,000). Evaluation of the composition was performed in the same manner as in Example 58.

D-9

Comparative Example 10

A red pigment dispersion composition R67 was prepared in the same manner as in Example 90, except that the polymer compound of Example 90 (pigment dispersant), which was obtained in the Synthesis Example C-33, was replaced by the poly(methyl methacrylate) D-10 having a sulfonic acid moiety at a terminal (weight average molecular weight: 8000), described in JP-A No 2002-273191. Evaluation of the composition was performed in the same manner as in Example 58.

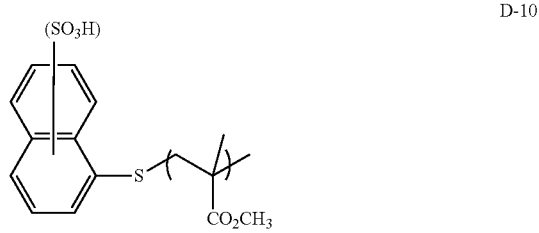

D-10

Comparative Example 11

A red pigment dispersion composition R68 was prepared in the same manner as in Example 90, except that the polymer, compound of Example 90 (pigment dispersant), which was obtained in the Synthesis Example C-33, was replaced by the following poly(methyl methacrylate) D-11 having one amino group at a terminal (weight average molecular weight: 15,000). Evaluation of the composition was performed in the same manner as in Example 58.

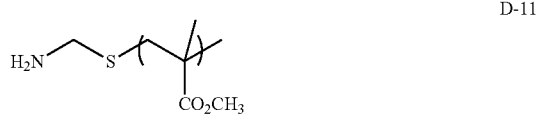

D-11

Comparative Example 12

A red pigment dispersion composition R69 was prepared in the same manner as in Example 90, except that the polymer compound of Example 90 (pigment dispersant), which was obtained in the Synthesis Example C-33, was replaced by the following poly(methyl methacrylate) D-12 having one propylurea group at a terminal (weight average molecular weight: 16,000). Evaluation of the composition was performed in the same manner as in Example 58.

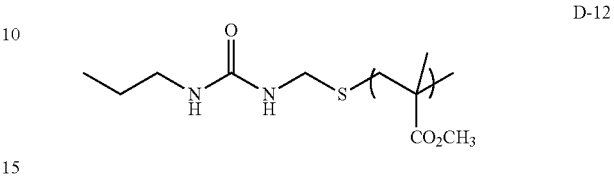

D-12

Comparative Examples 13 to 18

Green pigment dispersion compositions 058 to G63 were prepared in the same manner as in Example 115, except that the polymer compound of Example 115 (pigment dispersant), which was obtained in the Synthesis Example C-1, was respectively replaced by above-mentioned D1 to D6. Evaluation of the compositions was performed in the same manner as in Example 58.

Comparative Examples 19 to 24

Green pigment dispersion compositions G64 to G69 were prepared in the same manner as in Example 147, except that the polymer compound of Example 147 (pigment dispersant), which was obtained in the Synthesis Example C-33, was respectively replaced by above-mentioned D7 to D12. Evaluation of the compositions was performed in the same manner as in Example 58.

Comparative Examples 25 to 28

Blue pigment dispersion compositions B27 to B30 were prepared in the same manner as in Example 172, except that the polymer compound of Example 172 (pigment dispersant), which was obtained in the Synthesis Example C-1, was respectively replaced by above-mentioned D1 to D4. Evaluation of the compositions was performed in the same manner as in Example 58.

Comparative Examples 29 to 32

Blue pigment dispersion compositions B31 to B34 were prepared in the same manner as in Example 185, except that the polymer compound of Example 185 (pigment dispersant), which was obtained in the Synthesis Example C-33, was respectively replaced by above-mentioned D7 to D10. Evaluation of the compositions was performed in the same manner as in Example 18.

The polymer compounds used in the above Example 58 to 197 and Comparative Examples 1 to 32, and the evaluation results are shown together in the following Tables 5 to 8. In addition, indications such as C-1 in the tables show the numbers of Synthesis Examples for the polymer compounds used in the Examples.

TABLE 5

| Example (Composition) | Polymer compound | Viscosity immediately after dispersion, η1 (cp) | Viscosity after one week, η2 (cp) | Contrast |
|---|---|---|---|---|
| 58(R1) | C-1 | 11 | 13 | 1300 |
| 59(R2) | C-2 | 14 | 14 | 1250 |
| 60(R3) | C-3 | 11 | 13 | 1300 |
| 61(R4) | C-4 | 16 | 17 | 1250 |
| 62(R5) | C-5 | 12 | 14 | 1300 |
| 63(R6) | C-6 | 12 | 14 | 1300 |
| 64(R7) | C-7 | 14 | 15 | 1250 |
| 65(R8) | C-8 | 16 | 17 | 1200 |
| 66(R9) | C-9 | 16 | 17 | 1200 |
| 67(R10) | C-10 | 12 | 13 | 1300 |
| 68(R11) | C-11 | 13 | 13 | 1300 |
| 69(R12) | C-12 | 18 | 20 | 1200 |
| 70(R13) | C-13 | 20 | 20 | 1200 |
| 71(R14) | C-14 | 18 | 20 | 1200 |
| 72(R15) | C-15 | 19 | 19 | 1200 |
| 73(R16) | C-16 | 15 | 17 | 1250 |
| 74(R17) | C-17 | 15 | 17 | 1250 |
| 75(R18) | C-18 | 19 | 20 | 1250 |
| 76(R19) | C-19 | 19 | 21 | 1200 |
| 77(R20) | C-20 | 18 | 21 | 1200 |
| 78(R21) | C-21 | 24 | 30 | 1200 |
| 79(R22) | C-22 | 23 | 28 | 1200 |
| 80(R23) | C-23 | 15 | 17 | 1250 |
| 81(R24) | C-24 | 16 | 16 | 1250 |
| 82(R25) | C-25 | 12 | 13 | 1300 |
| 83(R26) | C-26 | 12 | 13 | 1300 |
| 84(R27) | C-27 | 12 | 13 | 1250 |
| 85(R28) | C-28 | 13 | 13 | 1250 |
| 86(R29) | C-29 | 14 | 15 | 1250 |
| 87(R30) | C-30 | 11 | 12 | 1300 |
| 88(R31) | C-31 | 11 | 11 | 1300 |
| 89(R32) | C-32 | 12 | 13 | 1300 |
| 90(R33) | C-33 | 11 | 13 | 1300 |
| 91(R34) | C-34 | 12 | 12 | 1250 |
| 92(R35) | C-35 | 11 | 13 | 1300 |
| 93(R36) | C-36 | 12 | 12 | 1250 |
| 94(R37) | C-37 | 12 | 13 | 1250 |
| 95(R38) | C-38 | 12 | 12 | 1250 |
| 96(R39) | C-39 | 12 | 12 | 1250 |
| 97(R40) | C-40 | 11 | 13 | 1300 |
| 98(R41) | C-41 | 12 | 12 | 1250 |
| 99(R42) | C-42 | 11 | 13 | 1300 |
| 100(R43) | C-43 | 13 | 14 | 1200 |
| 101(R44) | C-44 | 14 | 16 | 1200 |
| 102(R45) | C-45 | 14 | 16 | 1200 |
| 103(R46) | C-46 | 12 | 13 | 1250 |
| 104(R47) | C-47 | 12 | 12 | 1250 |
| 105(R48) | C-48 | 13 | 13 | 1250 |
| 106(R49) | C-49 | 12 | 13 | 1250 |
| 107(R50) | C-50 | 15 | 16 | 1200 |
| 108(R51) | C-51 | 15 | 16 | 1200 |
| 109(R52) | C-52 | 16 | 17 | 1200 |
| 110(R53) | C-53 | 17 | 17 | 1200 |
| 111(R54) | C-54 | 17 | 18 | 1200 |
| 112(R55) | C-55 | 15 | 17 | 1200 |
| 113(R56) | C-56 | 12 | 12 | 1250 |
| 114(R57) | C-57 | 12 | 12 | 1250 |

TABLE 6

| Example (Composition) | Polymer compound | Viscosity immediately after dispersion, η1 (cp) | Viscosity after one week, η2 (cp) | Contrast |
|---|---|---|---|---|
| 115(G1) | C-1 | 11 | 13 | 1500 |
| 116(G2) | C-2 | 13 | 13 | 1500 |
| 117(G3) | C-3 | 11 | 12 | 1500 |
| 118(G4) | C-4 | 15 | 16 | 1500 |
| 119(G5) | C-5 | 12 | 13 | 1500 |
| 120(G6) | C-6 | 12 | 13 | 1500 |
| 121(G7) | C-7 | 13 | 14 | 1500 |
| 122(G8) | C-8 | 13 | 15 | 1500 |
| 123(G9) | C-9 | 13 | 15 | 1500 |
| 124(G10) | C-10 | 12 | 13 | 1500 |
| 125(G11) | C-11 | 13 | 13 | 1500 |
| 126(G12) | C-12 | 14 | 15 | 1450 |
| 127(G13) | C-13 | 16 | 16 | 1400 |
| 128(G14) | C-14 | 15 | 16 | 1450 |
| 129(G15) | C-15 | 14 | 15 | 1450 |
| 130(G16) | C-16 | 13 | 15 | 1500 |
| 131(G17) | C-17 | 14 | 14 | 1450 |
| 132(G18) | C-18 | 15 | 15 | 1450 |
| 133(G19) | C-19 | 15 | 15 | 1450 |
| 134(G20) | C-20 | 13 | 17 | 1500 |
| 135(G21) | C-21 | 16 | 18 | 1400 |
| 136(G22) | C-22 | 13 | 15 | 1500 |
| 137(G23) | C-23 | 12 | 15 | 1500 |
| 138(G24) | C-24 | 13 | 14 | 1500 |
| 139(G25) | C-25 | 11 | 12 | 1500 |
| 140(G26) | C-26 | 11 | 12 | 1500 |
| 141(G27) | C-27 | 12 | 12 | 1450 |
| 142(G28) | C-28 | 13 | 13 | 1450 |
| 143(G29) | C-29 | 14 | 14 | 1450 |
| 144(G30) | C-30 | 11 | 11 | 1550 |
| 145(G31) | C-31 | 11 | 11 | 1550 |
| 146(G32) | C-32 | 11 | 12 | 1550 |
| 147(G33) | C-33 | 11 | 12 | 1500 |
| 148(G34) | C-34 | 11 | 11 | 1500 |
| 149(G35) | C-35 | 11 | 12 | 1500 |
| 150(G36) | C-36 | 11 | 11 | 1500 |
| 151(G37) | C-37 | 11 | 12 | 1500 |
| 152(G38) | C-38 | 11 | 11 | 1500 |
| 153(G39) | C-39 | 11 | 11 | 1500 |
| 154(G40) | C-40 | 11 | 12 | 1500 |
| 155(G41) | C-41 | 12 | 12 | 1500 |
| 156(G42) | C-42 | 11 | 12 | 1500 |
| 157(G43) | C-43 | 11 | 11 | 1500 |
| 158(G44) | C-44 | 15 | 17 | 1400 |
| 159(G45) | C-45 | 15 | 17 | 1400 |
| 160(G46) | C-46 | 11 | 12 | 1500 |
| 161(G47) | C-47 | 12 | 12 | 1450 |
| 162(G48) | C-48 | 13 | 13 | 1450 |
| 163(G49) | C-49 | 12 | 13 | 1450 |
| 164(G50) | C-50 | 14 | 15 | 1400 |
| 165(G51) | C-51 | 14 | 15 | 1400 |
| 166(G52) | C-52 | 15 | 17 | 1400 |
| 167(G53) | C-53 | 15 | 17 | 1400 |
| 168(G54) | C-54 | 16 | 17 | 1400 |
| 169(G55) | C-55 | 16 | 18 | 1400 |
| 170(G56) | C-56 | 11 | 11 | 1500 |
| 171(G57) | C-57 | 11 | 11 | 1500 |

TABLE 7

| Example (Composition) | Polymer compound | Viscosity immediately after dispersion, η1 (cp) | Viscosity after one week, η2 (cp) | Contrast |
|---|---|---|---|---|
| 172(B1) | C-1 | 13 | 14 | 1100 |
| 173(B2) | C-2 | 13 | 14 | 1100 |
| 174(B3) | C-3 | 13 | 14 | 1100 |
| 175(B4) | C-4 | 15 | 16 | 1100 |
| 176(B5) | C-5 | 14 | 15 | 1100 |
| 177(B6) | C-6 | 14 | 15 | 1100 |
| 178(B7) | C-7 | 15 | 16 | 1050 |
| 179(B8) | C-8 | 15 | 17 | 1050 |
| 180(B9) | C-9 | 15 | 17 | 1050 |
| 181(B10) | C-12 | 14 | 17 | 1100 |

TABLE 7-continued

| Example (Composition) | Polymer compound | Viscosity immediately after dispersion, η1 (cp) | Viscosity after one week, η2 (cp) | Contrast |
|---|---|---|---|---|
| 182(B11) | C-13 | 15 | 18 | 1050 |
| 183(B12) | C-14 | 15 | 18 | 1050 |
| 184(B13) | C-15 | 16 | 19 | 1000 |
| 185(B14) | C-33 | 11 | 12 | 1150 |
| 186(B15) | C-34 | 12 | 12 | 1100 |
| 187(B16) | C-35 | 11 | 12 | 1150 |
| 188(B17) | C-36 | 12 | 12 | 1150 |
| 189(B18) | C-37 | 11 | 12 | 1150 |
| 190(B19) | C-38 | 11 | 12 | 1150 |
| 191(B20) | C-39 | 11 | 12 | 1150 |
| 192(B21) | C-40 | 12 | 12 | 1100 |
| 193(B22) | C-41 | 11 | 12 | 1150 |
| 194(B23) | C-42 | 12 | 13 | 1100 |
| 195(B24) | C-43 | 12 | 13 | 1100 |
| 196(B25) | C-56 | 12 | 12 | 1150 |
| 197(B26) | C-57 | 12 | 12 | 1250 |

TABLE 8

| Comparative example (Composition) | Polymer compound | Viscosity immediately after dispersion, η1 (cp) | Viscosity after one week, η2 (cp) | Contrast |
|---|---|---|---|---|
| 1(R58) | D-1 | * High viscosity | ** | 800 |
| 2(R59) | D-2 | 1200 or higher | ** | 900 |
| 3(R60) | D-3 | 1200 or higher | ** | 900 |
| 4(R61) | D-4 | 1200 or higher | ** | 950 |
| 5(R62) | D-5 | 1200 or higher | ** | 900 |
| 6(R63) | D-6 | 1200 or higher | ** | 900 |
| 7(R64) | D-7 | * High viscosity | ** | 800 |
| 8(R65) | D-8 | 1200 or higher | ** | 900 |
| 9(R66) | D-9 | 1200 or higher | ** | 900 |
| 10(R67) | D-10 | 1200 or higher | ** | 950 |
| 11(R68) | D-11 | 1200 or higher | ** | 900 |
| 12(R69) | D-12 | 1200 or higher | ** | 900 |
| 13(G58) | D-1 | * High viscosity | — | 900 |
| 14(G59) | D-2 | 1200 or higher | ** | 1000 |
| 15(G60) | D-3 | 1200 or higher | ** | 1000 |
| 16(G61) | D-4 | 1200 or higher | ** | 1000 |
| 17(G62) | D-5 | 1200 or higher | ** | 1000 |
| 18(G63) | D-6 | 1200 or higher | ** | 1000 |
| 19(G64) | D-7 | * High viscosity | — | 900 |
| 20(G65) | D-8 | 1200 or higher | ** | 1000 |
| 21(G66) | D-9 | 1200 or higher | ** | 1000 |
| 22(G67) | D-10 | 1200 or higher | ** | 1000 |
| 23(G68) | D-11 | 1200 or higher | ** | 1000 |
| 24(G69) | D-12 | 1200 or higher | ** | 1000 |
| 25(B27) | D-1 | * High viscosity | — | 600 |
| 26(B28) | D-2 | 1200 or higher | ** | 700 |
| 27(B29) | D-3 | 1200 or higher | ** | 700 |
| 28(B30) | D-4 | 1200 or higher | ** | 700 |
| 29(B31) | D-7 | * High viscosity | — | 600 |
| 30(B32) | D-8 | 1200 or higher | ** | 700 |
| 31(B33) | D-9 | 1200 or higher | ** | 700 |
| 32(B34) | D-10 | 1200 or higher | ** | 700 |

* During dispersing, the viscosity became extremely high, and dispersion could not be achieved.
** Gelation occurred, and thus measurement was not performed.

Example 198

To the pigment dispersion composition R1 obtained in Example 58, components of the following composition were further added and mixed under stirring, to prepare a photocurable composition (color resist solution) of the invention.

[Composition]

| | |
|---|---|
| Dipentaerythritol hexaacrylate | 80 parts |
| 4-[o-Bromo-p-N,N-di(ethoxycarbonyl)aminophenyl]-2,6-di(trichloromethyl)-S-triazine (photopolymerization initiator) | 30 parts |
| Propylene glycol monomethyl ether acetate solution of benzyl methacrylate/methacrylic acid (=70/30 [molar ratio]) copolymer (weight average molecular weight: 10,000) (solid content: 40%) | 200 parts |
| 1-Methoxy-2-propyl acetate | 490 parts |

The obtained photocurable composition (color resist solution) was applied onto a glass substrate having a size of 100 mm×100 mm (1737, manufactured by Corning, Inc.), such that the x value, an index of color density, became 0.650. The applied composition was dried in an oven at 90° C. for 60 seconds (prebaking). Subsequently, the whole of a surface of the coating film was exposed at a dose of 200 mJ/cm$^2$ (illuminance: 20 mW/cm$^2$), and the coating film after exposure was covered with a 1% aqueous solution of an alkali developer solution CDK-1 (manufactured by FUJIFILM Electronic Materials, Inc.), and was left to stand still for 60 seconds. After the standing, pure water was sprayed in shower form, to thus wash away the developer solution. Then, the coating film, which had been exposed and developed as described above, was subjected to a heat treatment in an oven at 220° C. for 1 hour (post-baking), to thereby form a colored resin film for color filter on the glass substrate. Thus, a colored filter substrate (color filter) was produced.

(Evaluation 2)

For the colored filter substrate thus produced, the Y value and contrast were measured as follows.

(3) Y value

For the colored filter substrate produced, the Y value was measured using MCPD-2000 manufactured by Otsuka Electronics Co, Ltd. A greater Y value suggests higher transmittance.

(4) Contrast

A polarizing plate was placed on the colored resin film of the colored filter substrate to sandwich the colored resin film, and the luminance of when the polarizing plate was parallel and the luminance of when the polarizing plate was perpendicular were measured using BM-5 manufactured by Topcon Corp. The value obtained by dividing the luminance of when the polarizing plate is parallel by the luminance of when the polarizing plate is perpendicular (=luminance of when the polarizing plate is parallel/luminance of when the polarizing plate is perpendicular) was defined as an index for evaluating the contrast.

Examples 199 to 254

Photocurable compositions (color resist solutions) were prepared in the same manner as in Example 198, except that the pigment dispersion composition R1 of Example 198 was respectively replaced by the pigment dispersion compositions R2 to R57 obtained in Examples 59 to 114. Evaluation of the compositions was performed in the same manner as in Example 198.

Example 255

To the pigment dispersion composition G1 obtained in Example 115, components of the following composition were further added and mixed under stirring, to prepare a photocurable composition (color resist solution) of the invention.

[Composition]

| | |
|---|---|
| Dipentaerythritol hexaacrylate | 50 parts |
| 4-[o-bromo-p-N,N-di(ethoxycarbonyl)aminophenyl]-2,6-di(trichloromethyl)-S-triazine (photopolymerization initiator) | 20 parts |
| Propylene glycol monomethyl ether acetate solution of benzyl methacrylate/methacrylic acid (=70/30 [molar ratio]) copolymer (weight average molecular weight: 10,000) (solid content: 40%) | 50 parts |
| 1-Methoxy-2-propyl acetate | 180 parts |

The obtained photocurable composition (color resist solution) was applied onto a glass substrate having a size of 100 mm×100 mm (1737, manufactured by Corning, Inc.), such that the y value, an index of the color density, became 0.600. The applied composition was dried in an oven at 90° C. for 60 seconds (prebaking). Subsequently, the whole of a surface of the coating film was exposed at a dose of 200 mJ/cm$^2$ (illuminance: 20 mW/cm$^2$), and the coating film after exposure was covered with a 1% aqueous solution of an alkali developer solution CDK-1 (manufactured by FUJIFILM Electronic Materials, Inc.), and was left to stand still for 60 seconds. After the standing, pure water was sprayed in shower form, to thus wash away the developer solution. Then, the coating film, which had been exposed and developed as described above, was subjected to a heat treatment in an oven at 220° C. for 1 hour (post-baking), to thereby form a colored resin film for a color filter on the glass substrate. Thus, a colored filter substrate (color filter) was produced.

Measurement of the Y value and contrast of the produced colored filter substrate was performed in the same manner as in Evaluation 2 of Example 198.

Examples 256 to 311

Photocurable compositions (color resist solutions) were prepared in the same manner as in Example 255, except that the pigment dispersion composition G1 of Example 255 was respectively replaced by the pigment dispersion compositions G2 to G57 obtained in Examples 116 to 171. Evaluation of the compositions was performed in the same manner as in Evaluation 2 of Example 198.

Example 312

To the pigment dispersion composition B1 obtained in Example 172, components of the following composition were further added and mixed under stirring, to prepare a photocurable composition (color resist solution) of the invention.

[Composition]

| | |
|---|---|
| Dipentaerythritol hexaacrylate | 150 parts |
| 4-[o-Bromo-p-N,N-di(ethoxycarbonyl)aminophenyl-2,6-di(trichloromethyl)-S-triazine (photopolymerization initiator) | 60 parts |
| Propylene glycol monomethyl ether acetate solution of benzyl methacrylate/methacrylic acid (=70/30 [molar ratio]) copolymer (weight average molecular weight: 10,000) (solid content: 40%) | 400 parts |
| 1-Methoxy-2-propyl acetate | 1440 parts |

The prepared photocurable composition (color resist solution) was applied onto a glass substrate having a size of 100 mm×100 mm (1737, manufactured by Corning, Inc.), such that the y value, an index of the color density, became 0.090. The applied composition was dried in an oven at 90° C. for 60 seconds (prebaking). Subsequently, the whole of a surface of the coating film was exposed at a dose of 200 mJ/cm$^2$ (illuminance: 20 mW/cm$^2$), and the coating film after exposure was covered with a 1% aqueous solution of an alkali developer solution CDK-1 (manufactured by FUJIFILM Electronic Materials, Inc.), and was left to stand still for 60 seconds. After the standing, pure water was sprayed in shower form, to thus wash away the developer solution. Then, the coating film, which had been exposed and developed as described above, was subjected to a heat treatment in an oven at 220° C. for 1 hour (post-baking), to thereby form a colored resin film for a color filter on the glass substrate. Thus, a colored filter substrate (color filter) was produced.

Measurement of the Y value and contrast of the produced colored filter substrate was performed in the same manner as in Evaluation 2 of Example 198.

Examples 313 to 337

Photocurable compositions (color resist solutions) were prepared in the same manner as in Example 312, except that the pigment dispersion composition B1 of Example 312 was respectively replaced by the pigment dispersion compositions B2 to B26 obtained in Examples 173 to 197. Evaluation of the compositions was performed in the same manner as in Evaluation 2 of Example 198.

Comparative Examples 33 to 37

Photocurable compositions (color resist solutions) were prepared in the same manner as in Example 198, except that the pigment dispersion composition R1 of Example 198, which was obtained in Example 58, was respectively replaced by the pigment dispersion compositions R59 to R63 obtained

135 in Comparative Examples 2 to 6, and evaluation was performed in the same manner as in Example 198.

Comparative Examples 38 to 42

Photocurable compositions (color resist solutions) were prepared in the same manner as in Example 230, except that the pigment dispersion composition R33 of Example 230, which was obtained in Example 90, was respectively replaced by the pigment dispersion compositions R65 to R69 obtained in Comparative Examples 8 to 12, and evaluation was performed in the same manner as in Example 198.

Comparative Examples 43 to 47

Photocurable compositions (color resist solutions) were prepared in the same manner as in Example 255, except that the pigment dispersion composition G1 of Example 255, which was obtained in Example 115, was respectively replaced by the pigment dispersion compositions G59 to G63 obtained in Comparative Examples 14 to 18, and evaluation was performed in the same manner as in Example 198.

Comparative Examples 48 to 52

Photocurable compositions (color resist solutions) were prepared in the same manner as in Example 287, except that the pigment dispersion composition G33 of Example 287, which was obtained in Example 147, was respectively replaced by the pigment dispersion compositions G65 to G69 obtained in Comparative Examples 20 to 24, and evaluation was performed in the same manner as in Example 198.

Comparative Examples 53 to 55

Photocurable compositions (color resist solutions) were prepared in the same manner as in Example 312, except that the pigment dispersion composition B1 of Example 312, which was obtained in Example 172, was respectively replaced by the pigment dispersion compositions B28 to B30 obtained in Comparative Examples 26 to 28, and evaluation was performed in the same manner as in Example 198.

Comparative Examples 56 to 58

Photocurable compositions (color resist solutions) were prepared in the same manner as in Example 325, except that the pigment dispersion composition B14 of Example 325, which was obtained in Example 185, was respectively replaced by the pigment dispersion compositions B32 to B34 obtained in Comparative Examples 30 to 32, and evaluation was performed in the same manner as in Example 198.

The pigment dispersion compositions used in the Examples 198 to 337 and Comparative Examples 33 to 58, and the evaluation results are shown together in the following Tables 9 to 12.

136

TABLE 9

| Example | Composition | Y value | x value | y value | Contrast |
|---|---|---|---|---|---|
| 198 | R1 | 21.2 | 0.650 | 0.335 | 1200 |
| 199 | R2 | 21.1 | 0.650 | 0.335 | 1150 |
| 200 | R3 | 21.1 | 0.650 | 0.335 | 1200 |
| 201 | R4 | 21.1 | 0.650 | 0.335 | 1150 |
| 202 | R5 | 21.3 | 0.650 | 0.335 | 1200 |
| 203 | R6 | 21.3 | 0.650 | 0.335 | 1200 |

TABLE 9-continued

| Example | Composition | Y value | x value | y value | Contrast |
|---|---|---|---|---|---|
| 204 | R7 | 21.0 | 0.650 | 0.335 | 1150 |
| 205 | R8 | 20.8 | 0.650 | 0.335 | 1100 |
| 206 | R9 | 20.8 | 0.650 | 0.335 | 1100 |
| 207 | R10 | 21.0 | 0.650 | 0.335 | 1200 |
| 208 | R11 | 21.1 | 0.650 | 0.335 | 1200 |
| 209 | R12 | 20.9 | 0.650 | 0.335 | 1100 |
| 210 | R13 | 21.0 | 0.650 | 0.335 | 1100 |
| 211 | R14 | 21.0 | 0.650 | 0.335 | 1100 |
| 212 | R15 | 20.9 | 0.650 | 0.335 | 1100 |
| 213 | R16 | 21.0 | 0.650 | 0.335 | 1150 |
| 214 | R17 | 21.1 | 0.650 | 0.335 | 1150 |
| 215 | R18 | 21.0 | 0.650 | 0.335 | 1150 |
| 216 | R19 | 21.0 | 0.650 | 0.335 | 1100 |
| 217 | R20 | 21.0 | 0.650 | 0.335 | 1100 |
| 218 | R21 | 20.8 | 0.650 | 0.335 | 1100 |
| 219 | R22 | 20.8 | 0.650 | 0.335 | 1100 |
| 220 | R23 | 20.9 | 0.650 | 0.335 | 1150 |
| 221 | R24 | 21.0 | 0.650 | 0.335 | 1150 |
| 222 | R25 | 21.3 | 0.650 | 0.335 | 1200 |
| 223 | R26 | 21.2 | 0.650 | 0.335 | 1200 |
| 224 | R27 | 21.2 | 0.650 | 0.335 | 1150 |
| 225 | R28 | 21.1 | 0.650 | 0.335 | 1150 |
| 226 | R29 | 21.1 | 0.650 | 0.335 | 1150 |
| 227 | R30 | 21.1 | 0.650 | 0.335 | 1200 |
| 228 | R31 | 21.3 | 0.650 | 0.335 | 1200 |
| 229 | R32 | 21.1 | 0.650 | 0.335 | 1200 |
| 230 | R33 | 21.2 | 0.650 | 0.335 | 1200 |
| 231 | R34 | 21.1 | 0.650 | 0.335 | 1150 |
| 232 | R35 | 21.1 | 0.650 | 0.335 | 1200 |
| 233 | R36 | 21.1 | 0.650 | 0.335 | 1150 |
| 234 | R37 | 21.1 | 0.650 | 0.335 | 1150 |
| 235 | R38 | 21.1 | 0.650 | 0.335 | 1150 |
| 236 | R39 | 21.1 | 0.650 | 0.335 | 1150 |
| 237 | R40 | 21.3 | 0.650 | 0.335 | 1200 |
| 238 | R41 | 21.3 | 0.650 | 0.335 | 1150 |
| 239 | R42 | 21.0 | 0.650 | 0.335 | 1200 |
| 240 | R43 | 20.8 | 0.650 | 0.335 | 1100 |
| 241 | R44 | 21.0 | 0.650 | 0.335 | 1100 |
| 242 | R45 | 21.1 | 0.650 | 0.335 | 1100 |
| 243 | R46 | 20.9 | 0.650 | 0.335 | 1150 |
| 244 | R47 | 21.0 | 0.650 | 0.335 | 1150 |
| 245 | R48 | 21.0 | 0.650 | 0.335 | 1150 |
| 246 | R49 | 21.0 | 0.650 | 0.335 | 1150 |
| 247 | R50 | 20.9 | 0.650 | 0.335 | 1100 |
| 248 | R51 | 21.0 | 0.650 | 0.335 | 1100 |
| 249 | R52 | 21.1 | 0.650 | 0.335 | 1100 |
| 250 | R53 | 21.0 | 0.650 | 0.335 | 1100 |
| 251 | R54 | 21.0 | 0.650 | 0.335 | 1100 |
| 252 | R55 | 21.0 | 0.650 | 0.335 | 1100 |
| 253 | R56 | 21.0 | 0.650 | 0.335 | 1150 |
| 254 | R57 | 21.0 | 0.650 | 0.335 | 1150 |

TABLE 10

| Example | Composition | Y value | x value | y value | Contrast |
|---|---|---|---|---|---|
| 255 | G1 | 55.2 | 0.290 | 0.600 | 1400 |
| 256 | G2 | 55.2 | 0.290 | 0.600 | 1400 |
| 257 | G3 | 55.4 | 0.290 | 0.600 | 1400 |
| 258 | G4 | 55.2 | 0.290 | 0.600 | 1400 |
| 259 | G5 | 55.3 | 0.290 | 0.600 | 1400 |
| 260 | G6 | 55.2 | 0.290 | 0.600 | 1400 |
| 261 | G7 | 55.2 | 0.290 | 0.600 | 1400 |
| 262 | G8 | 55.1 | 0.290 | 0.600 | 1400 |
| 263 | G9 | 55.1 | 0.290 | 0.600 | 1400 |
| 264 | G10 | 55.3 | 0.290 | 0.600 | 1400 |
| 265 | G11 | 55.4 | 0.290 | 0.600 | 1400 |
| 266 | G12 | 55.1 | 0.290 | 0.600 | 1350 |
| 267 | G13 | 55.0 | 0.290 | 0.600 | 1300 |
| 268 | G14 | 55.1 | 0.290 | 0.600 | 1350 |
| 269 | G15 | 55.2 | 0.290 | 0.600 | 1350 |
| 270 | G16 | 55.3 | 0.290 | 0.600 | 1400 |
| 271 | G17 | 55.2 | 0.290 | 0.600 | 1350 |

TABLE 10-continued

| Example | Composition | Y value | x value | y value | Contrast |
|---|---|---|---|---|---|
| 272 | G18 | 55.2 | 0.290 | 0.600 | 1350 |
| 273 | G19 | 55.1 | 0.290 | 0.600 | 1350 |
| 274 | G20 | 55.4 | 0.290 | 0.600 | 1400 |
| 275 | G21 | 55.1 | 0.290 | 0.600 | 1300 |
| 276 | G22 | 55.3 | 0.290 | 0.600 | 1400 |
| 277 | G23 | 55.2 | 0.290 | 0.600 | 1400 |
| 278 | G24 | 55.3 | 0.290 | 0.600 | 1400 |
| 279 | G25 | 55.4 | 0.290 | 0.600 | 1400 |
| 280 | G26 | 55.4 | 0.290 | 0.600 | 1400 |
| 281 | G27 | 55.2 | 0.290 | 0.600 | 1350 |
| 282 | G28 | 55.2 | 0.290 | 0.600 | 1350 |
| 283 | G29 | 55.2 | 0.290 | 0.600 | 1350 |
| 284 | G30 | 55.4 | 0.290 | 0.600 | 1450 |
| 285 | G31 | 55.3 | 0.290 | 0.600 | 1450 |
| 286 | G32 | 55.4 | 0.290 | 0.600 | 1450 |
| 287 | G33 | 55.2 | 0.290 | 0.600 | 1400 |
| 288 | G34 | 55.2 | 0.290 | 0.600 | 1400 |
| 289 | G35 | 55.4 | 0.290 | 0.600 | 1400 |
| 290 | G36 | 55.2 | 0.290 | 0.600 | 1400 |
| 291 | G37 | 55.2 | 0.290 | 0.600 | 1400 |
| 292 | G38 | 55.2 | 0.290 | 0.600 | 1400 |
| 293 | G39 | 55.2 | 0.290 | 0.600 | 1400 |
| 294 | G40 | 55.3 | 0.290 | 0.600 | 1400 |
| 295 | G41 | 55.2 | 0.290 | 0.600 | 1400 |
| 296 | G42 | 55.2 | 0.290 | 0.600 | 1400 |
| 297 | G43 | 55.1 | 0.290 | 0.600 | 1400 |
| 298 | G44 | 55.3 | 0.290 | 0.600 | 1300 |
| 299 | G45 | 55.4 | 0.290 | 0.600 | 1300 |
| 300 | G46 | 55.1 | 0.290 | 0.600 | 1400 |
| 301 | G47 | 55 | 0.290 | 0.600 | 1350 |
| 302 | G48 | 55.1 | 0.290 | 0.600 | 1350 |
| 303 | G49 | 55.1 | 0.290 | 0.600 | 1350 |
| 304 | G50 | 55.2 | 0.290 | 0.600 | 1300 |
| 305 | G51 | 55.3 | 0.290 | 0.600 | 1300 |
| 306 | G52 | 55.2 | 0.290 | 0.600 | 1300 |
| 307 | G53 | 55.1 | 0.290 | 0.600 | 1300 |
| 308 | G54 | 55.1 | 0.290 | 0.600 | 1300 |
| 309 | G55 | 55.4 | 0.290 | 0.600 | 1300 |
| 310 | G56 | 55.2 | 0.290 | 0.600 | 1350 |
| 311 | G57 | 55.2 | 0.290 | 0.600 | 1350 |

TABLE 11

| Example | Composition | Y value | x value | y value | Contrast |
|---|---|---|---|---|---|
| 312 | B1 | 10.1 | 0.140 | 0.090 | 1000 |
| 313 | B2 | 10.0 | 0.140 | 0.090 | 1000 |
| 314 | B3 | 9.9 | 0.140 | 0.090 | 1000 |
| 315 | B4 | 10.0 | 0.140 | 0.090 | 1000 |
| 316 | B5 | 10.1 | 0.140 | 0.090 | 1000 |
| 317 | B6 | 10.0 | 0.140 | 0.090 | 1000 |
| 318 | B7 | 9.8 | 0.140 | 0.090 | 950 |
| 319 | B8 | 9.8 | 0.140 | 0.090 | 950 |
| 320 | B9 | 9.8 | 0.140 | 0.090 | 950 |
| 321 | B10 | 10.0 | 0.140 | 0.090 | 1000 |
| 322 | B11 | 9.9 | 0.140 | 0.090 | 950 |
| 323 | B12 | 9.9 | 0.140 | 0.090 | 950 |
| 324 | B13 | 9.7 | 0.140 | 0.090 | 900 |
| 325 | B14 | 10.1 | 0.140 | 0.090 | 1050 |
| 326 | B15 | 10.0 | 0.140 | 0.090 | 1000 |
| 327 | B16 | 9.9 | 0.140 | 0.090 | 1050 |
| 328 | B17 | 10.0 | 0.140 | 0.090 | 1050 |
| 329 | B18 | 10.0 | 0.140 | 0.090 | 1050 |
| 330 | B19 | 10.0 | 0.140 | 0.090 | 1050 |
| 331 | B20 | 10.0 | 0.140 | 0.090 | 1050 |
| 332 | B21 | 10.1 | 0.140 | 0.090 | 1000 |
| 333 | B22 | 10.0 | 0.140 | 0.090 | 1050 |
| 334 | B23 | 9.8 | 0.140 | 0.090 | 1000 |
| 335 | B24 | 9.8 | 0.140 | 0.090 | 1000 |
| 336 | B25 | 10.0 | 0.140 | 0.090 | 1050 |
| 337 | B26 | 10.0 | 0.140 | 0.090 | 1050 |

TABLE 12

| Comp. example | Composition | Y value | x value | y value | Contrast |
|---|---|---|---|---|---|
| 33 | R59 | 20.3 | 0.650 | 0.335 | 800 |
| 34 | R60 | 20.4 | 0.650 | 0.335 | 800 |
| 35 | R61 | 20.4 | 0.650 | 0.335 | 850 |
| 36 | R62 | 20.4 | 0.650 | 0.335 | 800 |
| 37 | R63 | 20.3 | 0.650 | 0.335 | 800 |
| 38 | R65 | 20.3 | 0.650 | 0.335 | 800 |
| 39 | R66 | 20.4 | 0.650 | 0.335 | 800 |
| 40 | R67 | 20.4 | 0.650 | 0.335 | 850 |
| 41 | R68 | 20.4 | 0.650 | 0.335 | 800 |
| 42 | R69 | 20.3 | 0.650 | 0.335 | 800 |
| 43 | G59 | 54.5 | 0.290 | 0.600 | 900 |
| 44 | G60 | 54.5 | 0.290 | 0.600 | 900 |
| 45 | G61 | 54.6 | 0.290 | 0.600 | 900 |
| 46 | G62 | 54.5 | 0.290 | 0.600 | 900 |
| 47 | G63 | 54.4 | 0.290 | 0.600 | 900 |
| 48 | G65 | 54.5 | 0.290 | 0.600 | 900 |
| 49 | G66 | 54.5 | 0.290 | 0.600 | 900 |
| 50 | G67 | 54.6 | 0.290 | 0.600 | 900 |
| 51 | G68 | 54.5 | 0.290 | 0.600 | 900 |
| 52 | G69 | 54.4 | 0.290 | 0.600 | 900 |
| 53 | B28 | 9.0 | 0.140 | 0.090 | 600 |
| 54 | B29 | 9.1 | 0.140 | 0.090 | 600 |
| 55 | B30 | 9.1 | 0.140 | 0.090 | 600 |
| 56 | B32 | 9.0 | 0.140 | 0.090 | 600 |
| 57 | B33 | 9.1 | 0.140 | 0.090 | 600 |
| 58 | B34 | 9.1 | 0.140 | 0.090 | 600 |

As shown in the tables above, low viscosity and high contrast were obtained in the Examples, and the polymer compounds of the invention exhibited excellent dispersibility and dispersion stability as pigment dispersants. It is supposed that the high contrast is obtained because the pigment particles are dispersed in the form of fine particles. In contrast, in the Comparative Examples, the viscosity could not be controlled low, the transmittance was low, and the compositions were inferior also in terms of contrast.

As shown in the Tables 9 to 12 above, the pigment dispersion compositions containing the polymer compounds of the invention (pigment dispersants), and the colored filter substrates (color filters) produced using the photocurable compositions including the pigment dispersion compositions, all had high transmittance and good color characteristics, and high contrast was obtained. In contrast, the Comparative Examples were clearly inferior in terms of contrast.

The disclosures of Japanese Patent Application Nos. 2006-075434, 2006-075558 and 2006-269707 are incorporated herein by reference in their entirety.

All publications, patent applications, and technical standards mentioned in this specification are herein incorporated by reference to the same extent as if each individual publication, patent application, or technical standard was specifically and individually indicated to be incorporated by reference.

What is claimed is:

1. A pigment dispersant composition, comprising:
a pigment and a polymer compound represented by the following Formula (2):

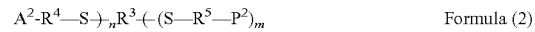

Formula (2)

wherein, in Formula (2), $R^3$ represents an organic linking group having a valency of (m+n); $R^4$ and $R^5$ each independently represents a single bond or a divalent organic linking group; $A^2$ represents a monovalent organic group comprising at least moiety that has an ability to be adsorbed to pigments and that is selected from the group consisting of an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^2$s, n in number, are independent from each other, and may be the same or different from each other; $R^4$s, n in number, are independent from each other, and may be the same or different from each other; m is from 1 to 8; n is from 2 to 9; m+n is from 3 to 10; $P^2$ represents a polymer skeleton; and $P^2$s, m in number, are independent from each other, and may be the same or different from each other; and $R^5$s, m in number, are independent from each other, and may be the same or different from each other.

2. The pigment dispersion composition according to claim 1, further comprising an organic solvent.

3. The pigment dispersion composition according to claim 1, wherein n in Formula (2) is from 3 to 6.

4. The pigment dispersion composition according to claim 1, wherein $A^2$ in Formula (2) represents a monovalent organic group comprising at least one moiety that has an ability to be adsorbed to pigments and that is selected from the group consisting of an organic dye structure, a heterocyclic structure, an acidic group, a group having a basic nitrogen atom, a urea group, a urethane group, a hydrocarbon group having 4 or more carbon atoms, an alkoxysilyl group, an epoxy group, an isocyanate group, and a hydroxyl group.

5. The pigment dispersion composition according to claim 1, wherein $A^2$ in Formula (2) represents a monovalent organic group comprising at least one moiety that has an ability to be adsorbed to pigments and that is selected from the group consisting of an organic dye structure, a heterocyclic structure, an acidic group, a group having a basic nitrogen atom, and a urea group.

6. The pigment dispersion composition according to claim 1, wherein the polymer skeleton represented by $P^2$ in Formula (2) is derived from at least one selected from the group consisting of: a polymer or copolymer of a vinyl monomer, an ester polymer, an ether polymer, a urethane polymer, an amide polymer, an epoxy polymer, a silicone polymer, and a modified product or copolymer thereof.

7. The pigment dispersion composition according to claim 1, wherein the polymer skeleton represented by $P^2$ in Formula (2) is derived from a polymer or copolymer of a vinyl monomer.

8. The pigment dispersion composition according to claim 1, wherein the weight average molecular weight of the polymer compound is from 3,000 to 100,000.

9. The pigment dispersion composition according to claim 1, wherein the acid value of the polymer compound is 200 mg KOH/g or lower.

10. The pigment dispersion composition according to claim 1, wherein the polymer compound is obtained by a radical polymerization reaction in the presence of a compound represented by the following Formula (3):

Formula (3)

wherein, in Formula (3), $R^6$ represents an organic linking group having a valency of (m+n); $R^7$ represents a single bond or a divalent organic linking group; $A^3$ represents a monovalent organic group comprising at least one moiety that has an ability to be adsorbed to pigments and that is selected from the group consisting of an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; $A^3$s, n in number, are independent from each other, and may be the same or different from each other; $R^7$s, n in number, are independent from each other, and may be the same or different from each other; m is from 1 to 8; n is from 2 to 9; and m+n is from 3 to 10.

11. A photocurable composition comprising the pigment dispersion composition according to claim 1, an alkali-soluble resin, a photopolymerizable compound, and a photopolymerization initiator.

12. A color filter that is produced by using the photocurable composition according to claim 11.

13. A method for producing a color filter, the method comprising providing the photocurable composition according to claim 11 directly on a substrate or with another layer interposed therebetween so as to form a photosensitive film, and patternwise exposing and developing the formed photosensitive film so as to form a colored pattern.

* * * * *